US012765174B2

(12) United States Patent
Choi et al.

(10) Patent No.: US 12,765,174 B2
(45) Date of Patent: Oct. 13, 2026

(54) DISPLAY DEVICE

(71) Applicant: Samsung Display Co., LTD., Yongin-si (KR)

(72) Inventors: Chaun Gi Choi, Yongin-si (KR); Dong Uk Kim, Yongin-si (KR); Hyun Ho Kim, Yongin-si (KR); Hyoeng Ki Kim, Yongin-si (KR); Hyeon Bum Lee, Yongin-si (KR); Hoon Gi Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 365 days.

(21) Appl. No.: 18/543,306

(22) Filed: Dec. 18, 2023

(65) Prior Publication Data

US 2024/0357862 A1 Oct. 24, 2024

(30) Foreign Application Priority Data

Apr. 24, 2023 (KR) ........................ 10-2023-0053438

(51) Int. Cl.
*H10K 59/121* (2023.01)
*H10K 59/126* (2023.01)

(52) U.S. Cl.
CPC ....... *H10K 59/1213* (2023.02); *H10K 59/126* (2023.02)

(58) Field of Classification Search
CPC ............. H10K 59/1213; H10K 59/126; H10K 59/1201; H10K 59/123; H10K 59/131; H10K 77/111; H10K 59/12; H10K 59/1216; H10K 77/10; H10D 86/431; H10D 86/441
See application file for complete search history.

(56) References Cited

U.S. PATENT DOCUMENTS

2004/0206960 A1* 10/2004 Nishikawa ........... H10K 50/865 257/72
2011/0069047 A1* 3/2011 Koyama ............... G02F 1/1345 345/204
2021/0367081 A1* 11/2021 Yan .................... H10D 30/6757

FOREIGN PATENT DOCUMENTS

| | | |
|---|---|---|
| CN | 114122147 | 3/2022 |
| KR | 10-2019-0020224 | 2/2019 |
| KR | 10-2022-0019880 | 2/2022 |
| KR | 10-2024-0033744 | 3/2024 |

* cited by examiner

*Primary Examiner* — Tucker J Wright
(74) *Attorney, Agent, or Firm* — Sughrue Mion, PLLC

(57) ABSTRACT

A display device includes a substrate; a first active layer disposed on the substrate; and a first gate electrode overlapping a part of the first active layer, the first gate electrode having a hole, and the hole of the first gate electrode does not overlap the first active layer.

21 Claims, 39 Drawing Sheets

DISPLAY DEVICE

CROSS-REFERENCE TO RELATED APPLICATION(S)

This application claims priority to and benefits of Korean Patent Application No. 10-2023-0053438 under 35 U.S.C. § 119 filed on Apr. 24, 2023 in the Korean Intellectual Property Office, the entire contents of which are incorporated herein by reference.

BACKGROUND

1. Technical Field

The disclosure relates to a display device, and, to a display device capable of readily discharging hydrogen from an active layer.

2. Description of the Related Art

A thin film transistor (TFT) has been used in various fields. It has been used as a switching and driving element in flat display devices such as liquid crystal displays (LCD), organic light emitting diode (OLED) displays, and electrophoretic displays.

The active layer (for example, a semiconductor) of the thin film transistor may be made of amorphous silicon, polycrystalline silicon, or the like. Amorphous silicon may be deposited at a low temperature to form a thin film, so it is used in display devices that use glass having a low melting point as a substrate. Polycrystalline silicon has the electrical characteristics of high field effect mobility, high frequency operation, and low leakage current.

A dehydrogenation process may be performed after the crystallization process of a polycrystalline silicon film including polycrystalline silicon. For example, since the interior of the polycrystalline silicon film after crystallization has a great influence on the properties of an LTPS device, the dehydrogenation process is required to reduce the amount of hydrogen in the polycrystalline silicon film below a certain level.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Aspects of the disclosure provide a display device capable of readily discharging hydrogen from an active layer.

The objects of the disclosure are not limited to those mentioned above and additional objects of the disclosure, which are not mentioned herein, will be clearly understood by those skilled in the art from the following description of the disclosure.

However, aspects of the disclosure are not restricted to the ones set forth herein. The above and other aspects of the disclosure will become more apparent to one of ordinary skill in the art to which the disclosure pertains by referencing the detailed description of the disclosure given below.

According to an embodiment, a display device may include a substrate; a first active layer disposed on the substrate; and a first gate electrode overlapping a part of the first active layer, the first gate electrode having a hole, wherein the hole of the first gate electrode does not overlap the first active layer.

In an embodiment, an entirety of the hole of the first gate electrode may not overlap the first active layer.

In an embodiment, an insulating layer may be disposed in the hole of the first gate electrode.

In an embodiment, the display device may further include a light blocking layer disposed between the substrate and the first active layer.

In an embodiment, the hole of the first gate electrode may overlap the light blocking layer.

In an embodiment, the display device may further include a capacitor electrode having a hole overlapping the first gate electrode.

In an embodiment, the hole of the first gate electrode may overlap the capacitor electrode.

In an embodiment, the hole of the first gate electrode may overlap the hole of the capacitor electrode.

In an embodiment, the display device may further include a second active layer adjacent to the first active layer.

In an embodiment, the display device may further include a gate connection electrode electrically connecting the first gate electrode to the second active layer through contact holes of an insulating layer.

In an embodiment, the hole of the first gate electrode may overlap the gate connection electrode.

In an embodiment, the first active layer may contain polycrystalline silicon, and the second active layer may contain an oxide.

In an embodiment, the second active layer may contain indium-gallium-zinc oxide (IGZO) or indium-gallium-zinc-tin oxide (IGZTO).

In an embodiment, the display device may further include a second gate electrode overlapping the second active layer.

In an embodiment, the second gate electrode may include a hole.

In an embodiment, the hole of the second gate electrode may overlap the second active layer.

In an embodiment, an insulating layer may be disposed in the hole of the second gate electrode.

In an embodiment, the display device may further include a gate line electrically connected to the second gate electrode.

In an embodiment, the display device may further include an insulating layer having a hole overlapping the gate line.

In an embodiment, a part of the gate line may be disposed in the hole of the insulating layer.

In an embodiment, the hole of the insulating layer may be adjacent to the second active layer.

In an embodiment, the first gate electrode may contain titanium and aluminum.

According to the display device of the disclosure, hydrogen may be readily discharged to the outside during a hydrogen discharge process. Accordingly, the quality of a transistor may be improved.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
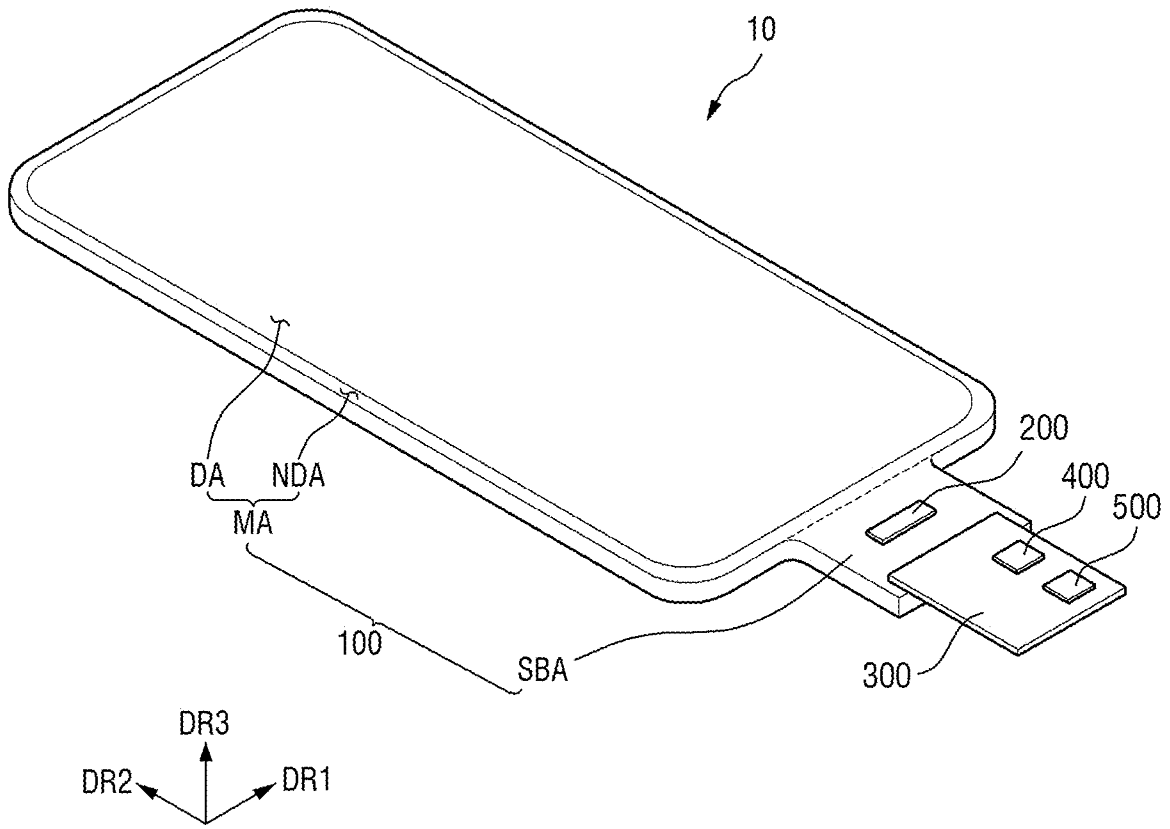
FIG. 1 is a schematic perspective view showing a display device according to one embodiment.

Advantages and features of the disclosure and methods of achieving the same will become apparent with reference to the embodiments described below in detail in conjunction with the accompanying drawings. However, the disclosure is not limited to embodiments to be described below, but may be implemented in various different forms, the embodiments will be provided in order to make the disclosure complete and allow one of ordinary skill in the art to which the disclosure pertains to completely recognize the scope of the disclosure, and the disclosure will also be defined by the scope of the claims.

When an element or layer is referred to as being “on” another element or layer, it includes both a case in which the element or layer is directly on another element or layer and a case in which the element or layer is on another element or layer with the other element or layer interposed therebetween.

The terms “overlap” or “overlapped” mean that a first object may be above or below or to a side of a second object, and vice versa. Additionally, the term “overlap” may include layer, stack, face or facing, extending over, covering, or partly covering or any other suitable term as would be appreciated and understood by those of ordinary skill in the art.

When an element is described as ‘not overlapping’ or ‘to not overlap’ another element, this may include that the elements are spaced apart from each other, offset from each other, or set aside from each other or any other suitable term as would be appreciated and understood by those of ordinary skill in the art.

The terms “face” and “facing” mean that a first element may directly or indirectly oppose a second element. In a case in which a third element intervenes between the first and second element, the first and second element may be understood as being indirectly opposed to one another, although still facing each other.

The terms “comprises,” “comprising,” “includes,” and/or “including,”, “has,” “have,” and/or “having,” and variations thereof when used in this specification, specify the presence of stated features, integers, steps, operations, elements, components, and/or groups thereof, but do not preclude the presence or addition of one or more other features, integers, steps, operations, elements, components, and/or groups thereof.

The same reference numbers indicate the same components throughout the specification. Shapes, sizes, proportions, angles, numbers, and the like, disclosed in the drawings for describing embodiments are examples, and thus, the disclosure is not limited to those illustrated in the drawings.

As used herein, the singular forms, "a," "an," and "the" are intended to include the plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

It will be understood that, although the terms "first", "second", and the like may be used to describe various components, these components should not be limited by these terms. These terms are only used to distinguish one component from another component. Accordingly, a first component discussed below could be termed a second component without departing from the teachings of the disclosure.

Each feature of the various embodiments may be partially or entirely coupled or combined with each other, and each embodiment may be implemented independently of each other or may be implemented together.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined or implied herein, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will be understood that when an element (or a region, a layer, a portion, or the like) is referred to as "being on", "connected to" or "coupled to" another element in the specification, it can be directly disposed on, connected or coupled to another element mentioned above, or intervening elements may be disposed therebetween.

It will be understood that the terms "connected to" or "coupled to" may include a physical or electrical connection or coupling.

Hereinafter, embodiments will be described in detail with reference to the accompanying drawings.

FIG. 1 is a schematic perspective view showing a display device according to one embodiment.

Referring to FIG. 1, a display device 10 may be applied to portable electronic devices such as a mobile phone, a smartphone, a tablet personal computer, a mobile communication terminal, an electronic organizer, an electronic book, a portable multimedia player (PMP), a navigation system, an ultra mobile PC (UMPC) or the like within the spirit and the scope of the disclosure. For example, the display device 10 may be applied as a display unit of a television, a laptop, a monitor, a billboard, or an Internet-of-Things (IoT) device. For another example, the display device 10 may be applied to wearable devices such as a smart watch, a watch phone, a glasses type display, or a head mounted display (HMD).

The display device 10 may have a planar shape similar to a quadrilateral shape. For example, the display device 10 may have a planar shape similar to a quadrilateral shape having a short side in the first direction DR1 and a long side in the second direction DR2. A corner where the short side in the first direction DR1 and the long side in the second direction DR2 meet may be right-angled or rounded with a selectable curvature. The planar shape of the display device 10 is not limited to a quadrilateral shape, and may be formed in a shape similar to another polygonal shape, a circular shape, or elliptical shape.

The display device 10 may include a display panel 100, a display driver 200, a circuit board 300, a touch driver 400, and a power supply unit (or part) 500.

The display panel 100 may include a main region MA and a sub-region SBA.

The main region MA may include the display area DA including pixels displaying an image and the non-display area NDA disposed around the display area DA. The display area DA may emit light from emission areas or opening areas. For example, the display panel 100 may include a pixel circuit including switching elements, a pixel defining layer defining an emission area or an opening area, and a self-light emitting element.

For example, the self-light emitting element may include at least one of an organic light emitting diode (LED) including an organic light emitting layer, a quantum dot LED including a quantum dot light emitting layer, an inorganic LED including an inorganic semiconductor, or a micro LED, but is not limited thereto.

The non-display area NDA may be an area outside the display area DA. The non-display area NDA may be defined as an edge area of the main region MA of the display panel 100. The non-display area NDA may include a gate driver (not illustrated) that supplies gate signals to the gate lines, and fan-out lines (not illustrated) that connect the display driver 200 to the display area DA.

The sub-region SBA may extend from one side (or a side) of the main region MA. The sub-region SBA may include a flexible material which can be bent, folded or rolled. For example, in case that the sub-region SBA is bent, the sub-region SBA may overlap the main region MA in a thickness direction (for example, a third direction DR3). The sub-region SBA may include the display driver 200 and a pad portion connected to the circuit board 300. Optionally, the sub-region SBA may be omitted, and the display driver 200 and the pad portion may be arranged (or disposed) in the non-display area NDA.

The display driver 200 may output signals and voltages for driving the display panel 100. The display driver 200 may supply data voltages to data lines. The display driver 200 may supply a power voltage to the power line and may supply a gate control signal to the gate driver. The display driver 200 may be formed as an integrated circuit (IC) and mounted on the display panel 100 by a chip on glass (COG) method, a chip on plastic (COP) method, or an ultrasonic bonding method. For example, the display driver 200 may be disposed in the sub-region SBA, and may overlap the main region MA in the thickness direction (third direction DR3) by bending of the sub-region SBA. For another example, the display driver 200 may be mounted on the circuit board 300.

The circuit board 300 may be attached to the pad portion of the display panel 100 by using an anisotropic conductive film (ACF). Lead lines of the circuit board 300 may be electrically connected to a pad portion of the display panel 100. The circuit board 300 may be a flexible printed circuit board, a printed circuit board, or a flexible film such as a chip on film.

A touch driver 400 may be mounted on the circuit board 300. The touch driver 400 may be electrically connected to a touch sensing unit of the display panel 100. The touch driver 400 may supply a touch driving signal to touch electrodes of the touch sensing unit and may sense an amount of change in capacitance between the touch electrodes. For example, the touch driving signal may be a pulse signal having a selectable frequency. The touch driver 400 may calculate whether an input is made and input coordinates based on an amount of change in capacitance between the touch electrodes. The touch driver 400 may be formed of an integrated circuit (IC).

The power supply unit (or part) 500 may be disposed on the circuit board 300 to supply a power voltage to the display driver 200 and the display panel 100. The power supply unit (or part) 500 may generate a driving voltage to supply it to a driving voltage line VDL, generate an initialization voltage (for example, a first initialization voltage and a second initialization voltage) to supply it to an initialization voltage line (for example, a first initialization voltage line VIL1 and a second initialization voltage line VIL2), and generate a common voltage to supply it to a common electrode which is common to light emitting elements of the pixels. For example, the driving voltage may be a high potential voltage for driving the light emitting element, and the common voltage may be a low potential voltage for driving the light emitting element.

Figure 2:
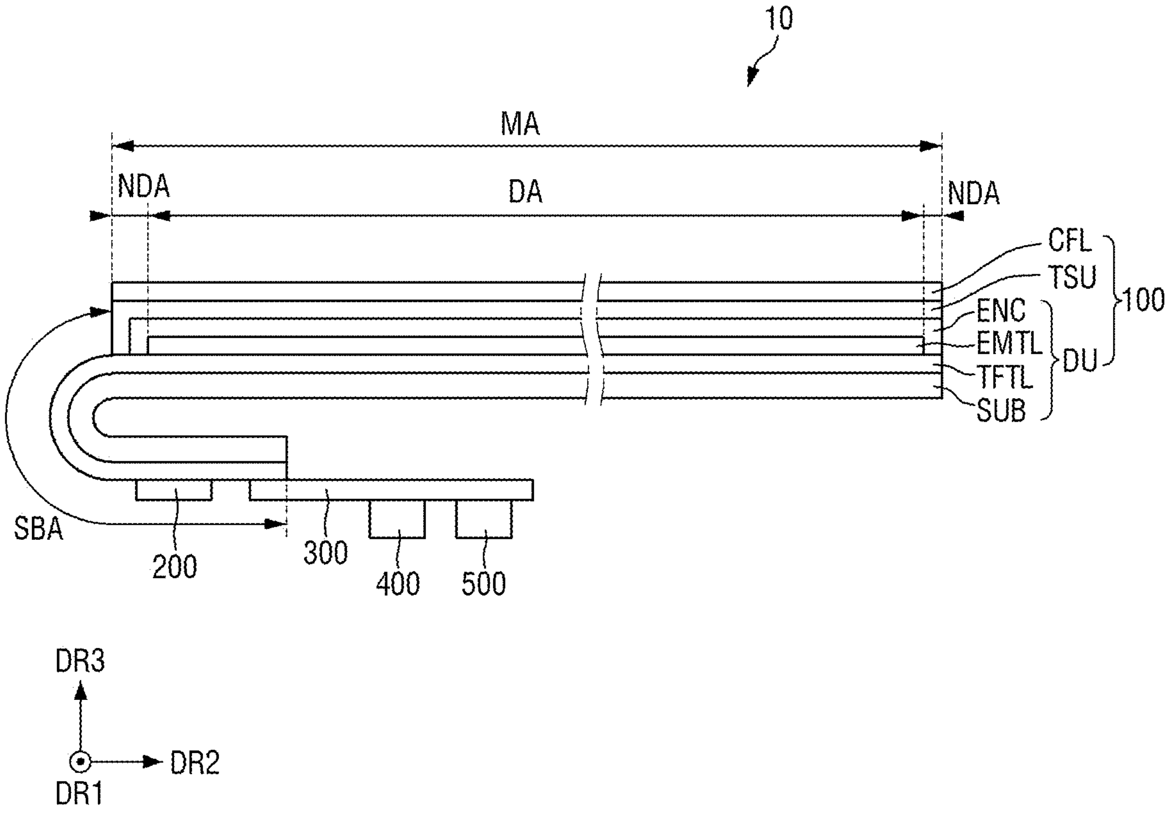
FIG. 2 is a schematic cross-sectional view illustrating a display device according to one embodiment.

FIG. 2 is a schematic cross-sectional view illustrating a display device according to one embodiment.

Referring to FIG. 2, the display panel 100 may include a display unit (or part) DU, a touch sensing unit (or part) TSU, and a color filter layer CFL. The display unit DU may include a substrate SUB, a thin film transistor layer TFTL, a light emitting element layer EMTL, and an encapsulation layer ENC.

The substrate SUB may be a base substrate or a base member. The substrate SUB may be a flexible substrate which can be bent, folded or rolled. For example, the substrate SUB may include a polymer resin such as polyimide (PI), but is not limited thereto. For another example, the substrate SUB may include a glass material or a metal material.

The thin film transistor layer TFTL may be disposed on the substrate SUB. The thin film transistor layer TFTL may include thin film transistors constituting a pixel circuit of pixels. The thin film transistor layer TFTL may further include gate lines, data lines, power lines, gate control lines, fan-out lines that connect the display driver 200 to the data lines, and lead lines that connect the display driver 200 to the pad portion. Each of the thin film transistors may include a semiconductor region, a source electrode, a drain electrode, and a gate electrode. For example, in case that the gate driver is formed on one side of the non-display area NDA of the display panel 100, the gate driver may include thin film transistors.

The thin film transistor layer TFTL may be disposed in the display area DA, the non-display area NDA, and the sub-region SBA. Thin film transistors, gate lines, data lines, and power lines of each of the pixels of the thin film transistor layer TFTL may be disposed in the display area DA. Gate control lines and fan-out lines of the thin film transistor layer TFTL may be disposed in the non-display area NDA. The lead lines of the thin film transistor layer TFTL may be disposed in the sub-region SBA.

The light emitting element layer EMTL may be disposed on the thin film transistor layer TFTL. The light emitting element layer EMTL may include light emitting elements in which a pixel electrode, a light emitting layer, and a common electrode may be sequentially stacked to emit light, and a pixel defining layer defining pixels. The light emitting elements of the light emitting element layer EMTL may be disposed in the display area DA.

For example, the light emitting layer may be an organic light emitting layer including an organic material. The light emitting layer may include a hole transporting layer, an organic light emitting layer, and an electron transporting layer. In case that the pixel electrode receives a selectable voltage through the thin film transistor of the thin film transistor layer TFTL and the common electrode receives the cathode voltage, holes and electrons may be transferred to the organic light emitting layer through the hole transporting layer and the electron transporting layer, respectively and may be combined with each other to emit light in the organic light emitting layer. For example, the pixel electrode may be an anode electrode, and the common electrode may be a cathode electrode, but the disclosure is not limited thereto.

For another example, the light emitting elements may include a quantum dot light emitting diode including a quantum dot light emitting layer, an inorganic light emitting diode including an inorganic semiconductor, or a micro light emitting diode.

The encapsulation layer ENC may cover the top surface and the side surface of the light emitting element layer EMTL, and may protect the light emitting element layer EMTL. The encapsulation layer ENC may include at least one inorganic layer and at least one organic layer for encapsulating the light emitting element layer EMTL.

The touch sensing unit TSU may be disposed on the encapsulation layer ENC. The touch sensing unit TSU may include touch electrodes for sensing a user's touch in a capacitive manner, and touch lines connecting the touch electrodes to the touch driver 400. For example, the touch sensing unit TSU may sense the user's touch by using a mutual capacitance method or a self-capacitance method.

For another example, the touch sensing unit TSU may be disposed on a separate substrate disposed on the display unit DU. The substrate supporting the touch sensing unit TSU may be a base member that encapsulates the display unit DU.

The touch electrodes of the touch sensing unit TSU may be disposed in a touch sensor area overlapping the display area DA. The touch lines of the touch sensing unit TSU may be disposed in a touch peripheral area that overlaps the non-display area NDA.

The color filter layer CFL may be disposed on the touch sensing unit TSU. The color filter layer CFL may include color filters respectively corresponding to the emission areas. Each of the color filters may selectively transmit light of a specific or given wavelength and may block or absorb light of a different wavelength. The color filter layer CFL may absorb a part of light coming from the outside of the display device 10 to reduce reflected light due to external light. Accordingly, the color filter layer CFL may prevent color distortion caused by reflection of the external light.

Since the color filter layer CFL may be directly disposed on the touch sensing unit TSU, the display device 10 may not require a separate substrate for the color filter layer CFL. Therefore, the thickness of the display device 10 may be relatively reduced.

The sub-region SBA of the display panel 100 may extend from one side of the main region MA. The sub-region SBA may include a flexible material which can be bent, folded or rolled. For example, in case that the sub-region SBA is bent, the sub-region SBA may overlap the main region MA in a thickness direction (third direction DR3). The sub-region SBA may include the display driver 200 and the pad portion electrically connected to the circuit board 300.

Figure 3:
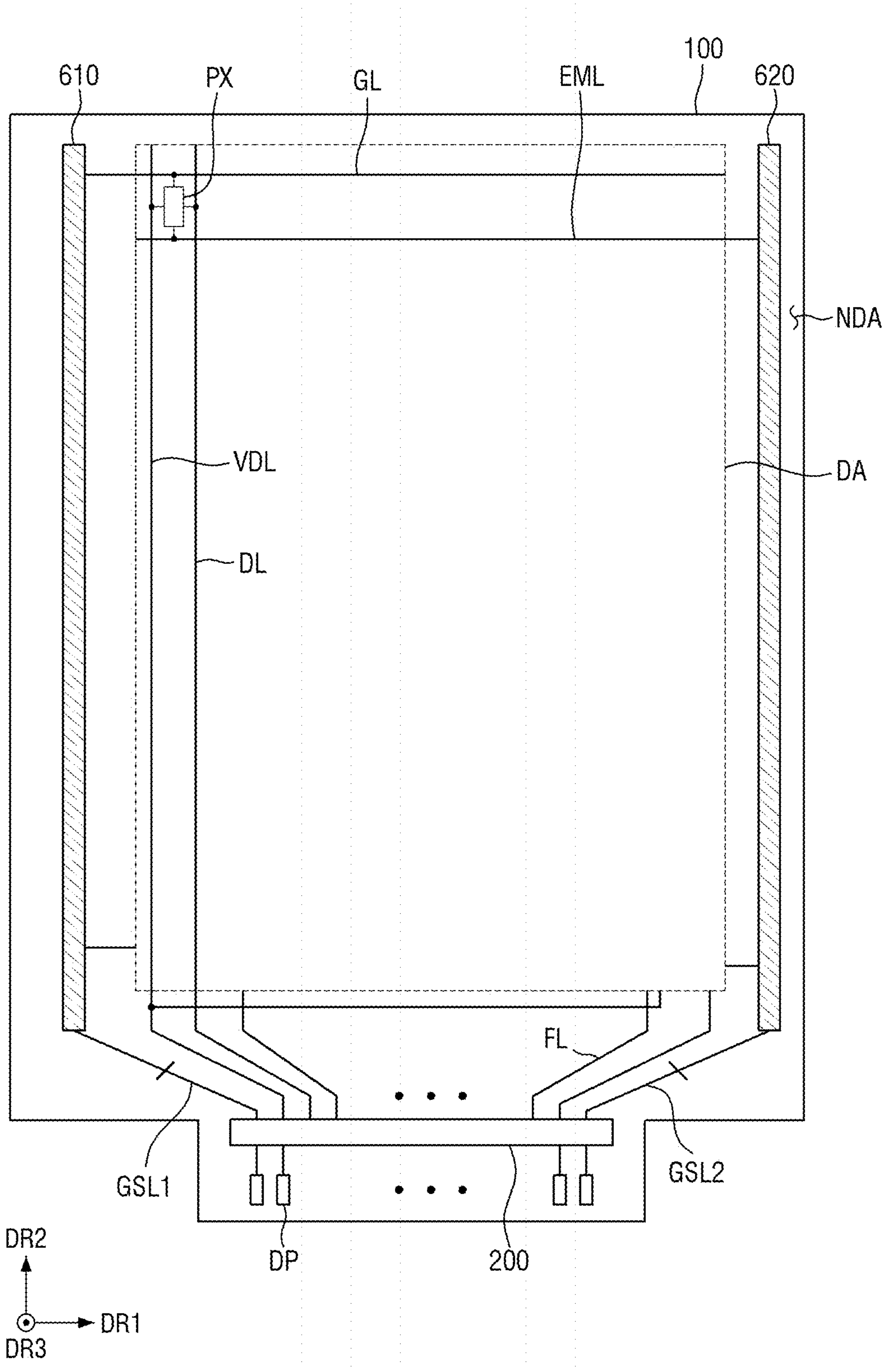
FIG. 3 is a schematic plan view illustrating a display unit of a display device according to one embodiment.
Figure 4:
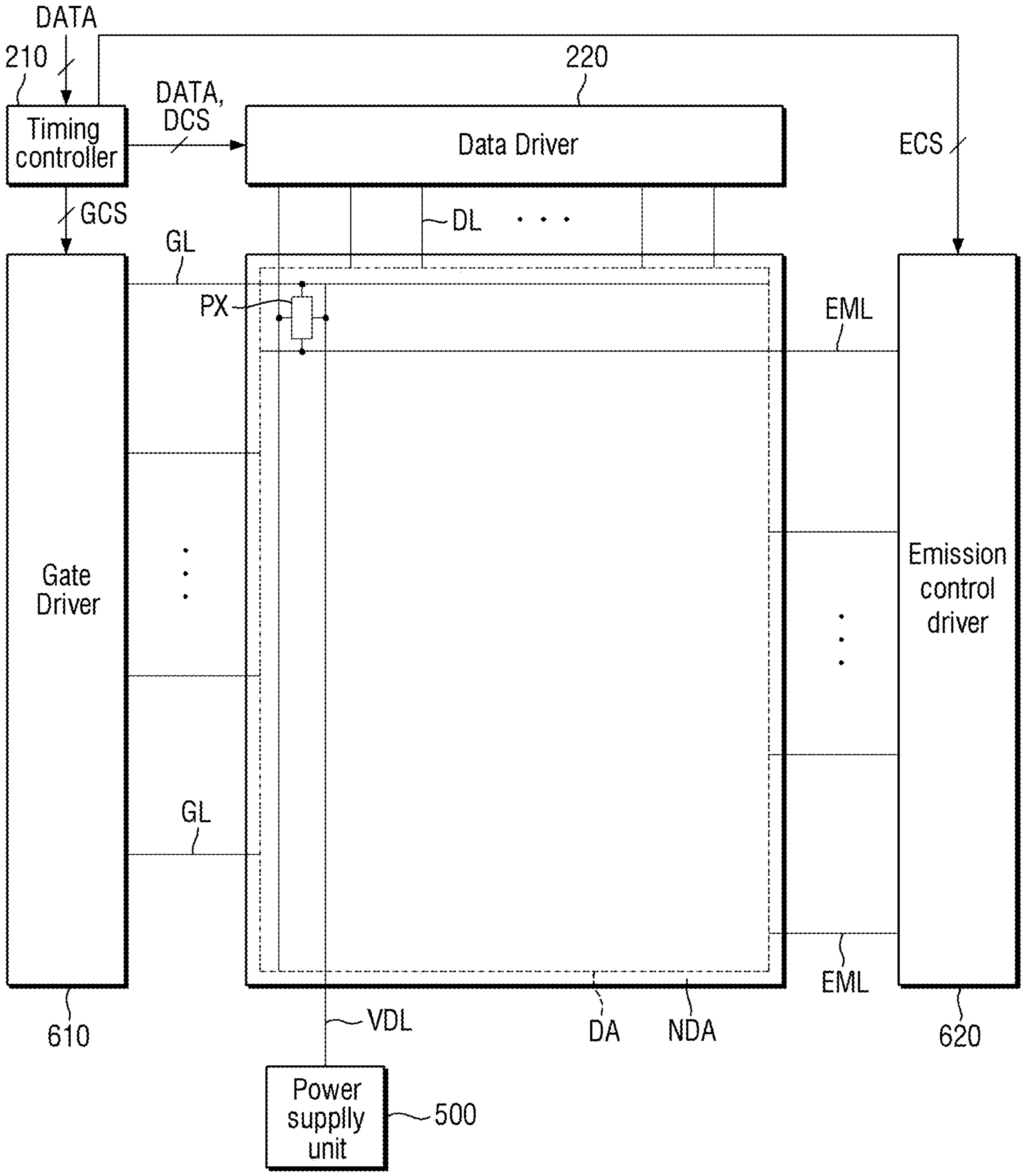
FIG. 4 is a block diagram illustrating a display panel and a display driver according to one embodiment.

FIG. 3 is a schematic plan view illustrating a display unit of a display device according to one embodiment. FIG. 4 is a block diagram illustrating a display panel and a display driver according to one embodiment.

Referring to FIGS. 3 and 4, the display panel 100 may include the display area DA and the non-display area NDA.

The display area DA may include pixels PX, and driving voltage lines VDL, common voltage lines VSL (see FIG. 5), gate lines GL, emission control lines EML, and data lines DL connected to the pixels PX.

Each of the pixels PX may be connected to the gate line GL, the data line DL, the emission control line EML, the driving voltage line VDL, and the common voltage line VSL. Each of the pixels PX may include at least one transistor, a light emitting element and a capacitor.

Each of the gate lines GL may extend in the first direction DR1 and may be spaced apart from each other in the second direction DR2 intersecting the first direction DR1. The gate lines GL may be arranged along the second direction DR2. The gate lines GL may sequentially supply gate signals to the pixels PX.

The emission control lines EML may extend in the first direction DR1 and may be spaced apart from each other in the second direction DR2. The emission control line EML may be arranged along the second direction DR2. The emission control lines EML may sequentially supply an emission control signal to the pixels PX.

The data lines DL may extend in the second direction DR2 and may be spaced apart from each other in the first direction DR1. The data lines DL may be arranged along the first direction DR1. The data lines DL may supply data voltages to the pixels PX. The data voltage may determine the luminance of each of the pixels PX.

The driving voltage lines VDL may extend in the second direction DR2 and may be spaced apart from each other in the first direction DR1. The driving voltage lines VDL may be arranged along the first direction DR1. The driving voltage lines VDL may supply a first driving voltage VD (see FIG. 5) to the pixels PX. The first driving voltage VD may be a high potential voltage for driving the light emitting elements of the pixels PX.

The non-display area NDA may surround the display area DA. The non-display area NDA may include a gate driver 610, an emission control driver 620, fan-out lines FL, a first gate control line GSL1, and a second gate control line GSL2.

The fan-out lines FL may extend from the display driver 200 to the display area DA. The fan-out lines FL may supply the data voltage received from the display driver 200 to the data lines DL.

The first gate control line GSL1 may extend from the display driver 200 to the gate driver 610. The first gate control line GSL1 may supply a gate control signal GCS received from the display driver 200 to the gate driver 610.

The second gate control line GSL2 may extend from the display driver 200 to the emission control driver 620. The second gate control line GSL2 may supply an emission control signal ECS received from the display driver 200 to the emission control driver 620.

The sub-region SBA may extend from one side of the non-display area NDA. The sub-region SBA may include the display driver 200 and the pad portion DP. The pad portion DP may be disposed closer to one edge of the sub-region SBA than the display driver 200. The pad portion DP may be electrically connected to the circuit board 300 through an anisotropic conductive film ACF.

The display driver 200 may include a timing controller 210 and a data driver 220.

The timing controller 210 may receive digital video data DATA and timing signals from the circuit board 300. The timing controller 210 may generate, based on the timing signals, a data control signal DCS to control the operation timing of the data driver 220, the gate control signal GCS to control the operation timing of the gate driver 610, and the emission control signal ECS to control the operation timing of the emission control driver 620. The timing controller 210 may supply the gate control signal GCS to the gate driver 610 through the first gate control line GSL1. The timing controller 210 may supply the emission control signal ECS to the emission control driver 620 through the second gate control line GSL2. The timing controller 210 may supply the digital video data DATA and the data control signal DCS to the data driver 220.

The data driver 220 may convert the digital video data DATA into analog data voltages and supply them to the data lines DL through the fan-out lines FL. The gate signals of the gate driver 610 may select the pixels PX to which the data voltage is supplied, and the selected pixels PX may receive the data voltage through the data lines DL.

The power supply unit 500 may be disposed on the circuit board 300 to supply a power voltage to the display driver 200 and the display panel 100. The power supply unit 500 may generate and supply a driving voltage to the driving voltage line VDL, generate and supply an initialization voltage to the initialization voltage line, and generate and supply a common voltage to the common electrode common to the light emitting elements of the pixels.

The gate driver 610 may be disposed at one external side of the display area DA or at one side of the non-display area NDA. The emission control driver 620 may be disposed at the other external side of the display area DA or at the other side of the non-display area NDA. However, the disclosure is not limited thereto. As another example, the gate driver 610 and the emission control driver 620 may be disposed at any one of one side and the other side of the non-display area NDA.

The gate driver 610 may include transistors for generating gate signals based on the gate control signal GCS. The emission control driver 620 may include transistors for generating emission control signals based on the emission control signal ECS. For example, the transistors of the gate driver 610 and the transistors of the emission control driver 620 may be formed on the same layer as the transistors of each of the pixels PX. The gate driver 610 may supply the gate signals to the gate lines GL, and the emission control driver 620 may supply the emission control signals to the emission control lines EML.

Figure 5:
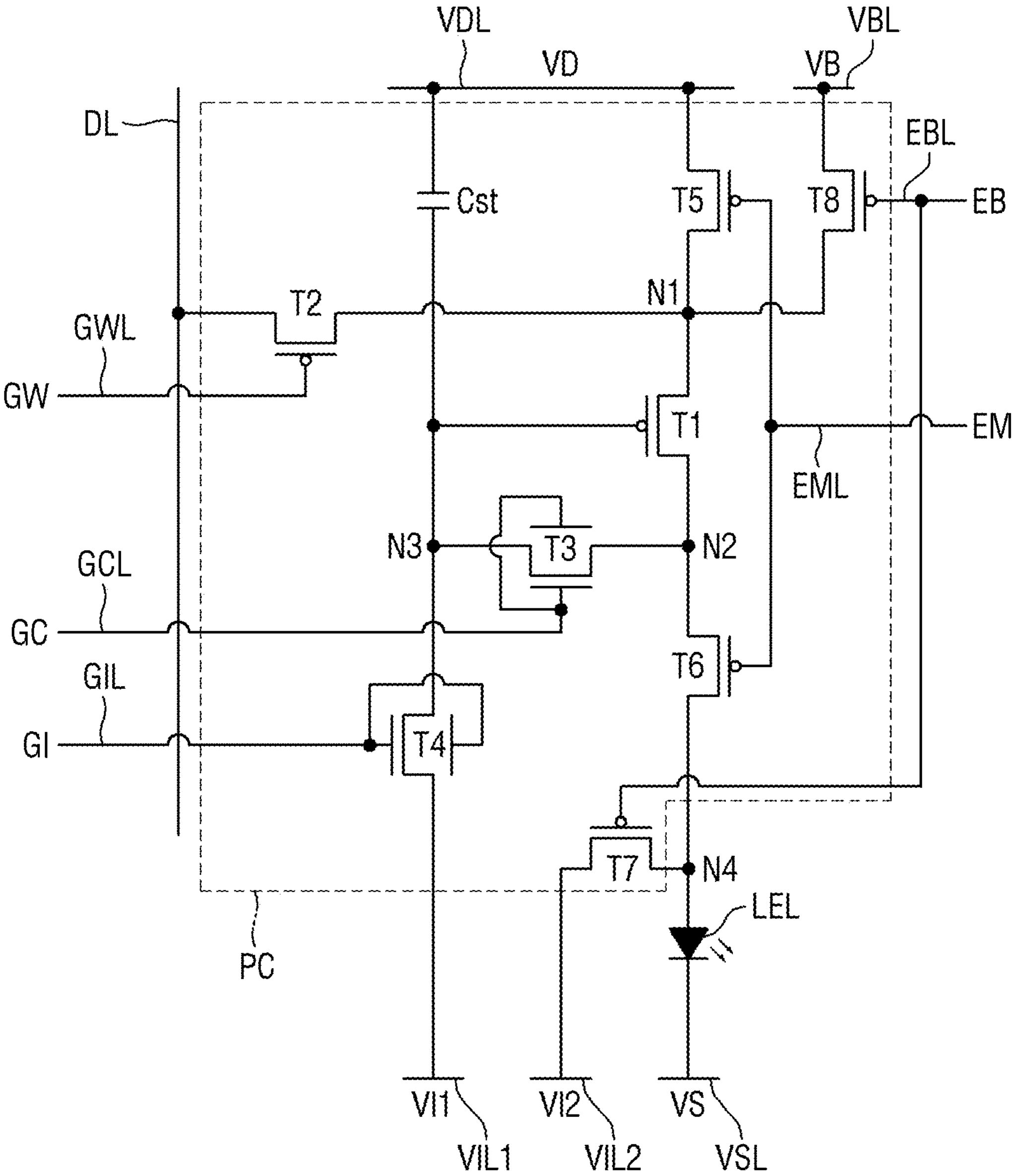
FIG. 5 is a schematic diagram of an equivalent circuit of a pixel of a display device according to one embodiment.

FIG. 5 is a schematic diagram of an equivalent circuit of a pixel of a display device according to one embodiment.

The pixel SP may be connected to a first gate line GWL, a second gate line GCL, a third gate line GIL, a fourth gate line EBL, the emission control line EML, the data line DL, the driving voltage line VDL, a common voltage line VSL, a first initialization voltage line VIL1, a second initialization voltage line VIL2, and a bias voltage line VBL.

The pixel (for example, PX1) may include a pixel circuit PC and a light emitting element LEL. The pixel circuit PC may include a first transistor T1, a second transistor T2, a third transistor T3, a fourth transistor T4, a fifth transistor T5, a sixth transistor T6, a seventh transistor T7, an eighth transistor T8, and a capacitor Cst.

The first transistor T1 may include a gate electrode, a source electrode, and a drain electrode. The first transistor T1 may control a source-drain current (hereinafter, a driving current) according to the data voltage applied to the gate electrode. The driving current (for example, Isd) flowing through a channel region of the first transistor T1 may be proportional to the square of a difference between the threshold voltage Vth and the voltage Vsg between the source electrode and the gate electrode of the first transistor T1 ($Isd=k\times(Vsg-Vth)^2$). Here, k is a proportional coefficient determined by the structure and physical characteristics of the first transistor T1, Vsg is a source-gate voltage of the first transistor T1, and Vth is a threshold voltage of the first transistor T1.

The light emitting element LEL may emit light by receiving the driving current Isd. The emission amount or the luminance of the light emitting element LEL may be proportional to the magnitude of the driving current Isd.

The light emitting element LEL may be an organic light emitting diode including a first electrode, a second electrode, and an organic light emitting layer disposed between the first electrode and the second electrode. For another example, the light emitting element LEL may be an inorganic light emitting element including a first electrode, a second electrode, and an inorganic semiconductor disposed between the first electrode and the second electrode. For another example, the light emitting element LEL may be a quantum dot light emitting element including a first electrode, a second electrode, and a quantum dot light emitting layer disposed between the first electrode and the second electrode. For another example, the light emitting element LEL may be a micro light emitting diode.

The first electrode of the light emitting element LEL may be electrically connected to a fourth node N4. The first electrode of the light emitting element LEL may be connected to the drain electrode of the sixth transistor T6 and the source electrode of the seventh transistor T7 through the fourth node N4. The second electrode of the light emitting element LEL may be connected a second driving voltage line VSL. The second electrode of the light emitting element LEL may receive a second driving voltage VS (for example, a low potential voltage) from the common voltage line VSL.

The second transistor T2 may be turned on by a first gate signal GW of the first gate line GWL to electrically connect the data line DL with a first node N1 that is the source electrode of the first transistor T1. The second transistor T2 may be turned on according to the first gate signal to supply the data voltage to the first node N1. The gate electrode of the second transistor T2 may be electrically connected to the first gate line GWL, the source electrode thereof may be electrically connected to the data line DL, and the drain electrode thereof may be electrically connected to the first node N1.

The third transistor T3 may be turned on by a second gate signal GC of the second gate line GCL to electrically connect the second node N2, which is the drain electrode of the first transistor T1, to the third node N3, which is the gate electrode of the first transistor T1. The third transistor T3 may be connected between the third node N3 and the second node N2. For example, the gate electrode of the third transistor T3 may be electrically connected to the second gate line GCL, the source electrode thereof may be electrically connected to the third node N3, and the drain electrode thereof may be electrically connected to the second node. The third transistor T3 may be turned on by a second gate signal of the second gate line GCL to electrically connect the second node N2, which is the drain electrode of the first transistor T1, to the third node N3, which is the gate electrode of the first transistor T1. The third transistor T3 may be a double gate transistor having two gate electrodes (for example, a gate electrode and a counter gate electrode). The gate electrode and the counter gate electrode may be disposed to face each other on different layers.

The fourth transistor T4 may be turned on by a third gate signal GI of the third gate line GIL to electrically connect the third node N3, which is the gate electrode of the first transistor T1, to the first initialization voltage line VIL1. The fourth transistor T4 may be connected in series between the third node N3 and the first initialization voltage line VIL1. For example, the gate electrode of the fourth transistor T4 may be electrically connected to the third gate line GIL, the source electrode thereof may be electrically connected to the third node N3, and the drain electrode thereof may be electrically connected to the first initialization voltage line VIL1. The fourth transistor T4 may be a double gate transistor. The first initialization voltage line VIL1 may transmit a first initialization voltage VI1.

The fifth transistor T5 may be turned on by an emission control signal EM of the emission control line EML to electrically connect the driving voltage line VDL with the first node N1 that is the source electrode of the first transistor T1. The gate electrode of the fifth transistor T5 may be electrically connected to the emission control line EML, the source electrode thereof may be electrically connected to the driving voltage line VDL, and the drain electrode thereof may be electrically connected to the first node N1.

The sixth transistor T6 may be turned on by the emission control signal EM of the emission control line EML to electrically connect the second node N2 that is the drain electrode of the first transistor T1 with the fourth node N4 that is the first electrode of the light emitting element LEL. The gate electrode of the sixth transistor T6 may be electrically connected to the emission control line EML, the source electrode thereof may be electrically connected to the second node N2, and the drain electrode thereof may be electrically connected to the fourth node N4.

In case that all of the fifth transistor T5, the first transistor T1, and the sixth transistor T6 are turned on, the driving current may be supplied to the light emitting element LEL.

The seventh transistor T7 may be turned on by a fourth gate signal EB of the fourth gate line EBL to electrically connect the fourth node N4 that is the first electrode of the light emitting element LEL with the second initialization voltage line VIL2. By turning on the seventh transistor T7 based on the fourth gate signal, the first electrode of the light emitting element LEL may be discharged to a second initialization voltage V12. The gate electrode of the seventh transistor T7 may be electrically connected to the fourth gate line EBL, the source electrode thereof may be electrically connected to the fourth node N4, and the drain electrode thereof may be electrically connected to the second initialization voltage line VIL2. The second initialization voltage line VIL2 may transmit a second initialization voltage VI2.

The eighth transistor T8 may be turned on by the fourth gate signal EB of the fourth gate line EBL to electrically connect the bias voltage line VBL with the first node N1 that is the source electrode of the first transistor T1. The eighth transistor T8 may be turned on according to the fourth gate signal to supply a bias voltage VB to the first node N1. The eighth transistor T8 may improve hysteresis of the first transistor T1 by supplying the bias voltage VB to the source electrode of the first transistor T1. The gate electrode of the eighth transistor T8 may be electrically connected to the fourth gate line EBL, the source electrode thereof may be electrically connected to the bias voltage line VBL, and the drain electrode thereof may be electrically connected to the first node N1.

Each of the first transistor T1, the second transistor T2, the fifth transistor T5, the sixth transistor T6, the seventh transistor T7, and the eighth transistor T8 may include a silicon-based active layer. For example, each of the first transistor T1, the second transistor T2, the fifth transistor T5, the sixth transistor T6, the seventh transistor T7, and the eighth transistor T8 may be a p-type transistor including an active layer made of low temperature polycrystalline silicon (LTPS). The active layer made of low temperature polycrystalline silicon may have high electron mobility and excellent turn-on characteristics. Accordingly, in the display device 10, since the transistors having excellent turn-on characteristics are included, it is possible to stably and efficiently drive the pixels PX. Each of the first transistor T1, the second transistor T2, the fifth transistor T5, the sixth transistor T6, the seventh transistor T7, and the eighth transistor T8 may output a current flowing into the source electrode to the drain electrode based on a gate low voltage applied to the gate electrode.

The third transistor T3 and the fourth transistor T4 may be n-type transistors including an oxide-based active layer. The transistor including the oxide-based active layer may have a coplanar structure in which a gate electrode is disposed thereon. The transistor including the oxide-based active layer may output a current flowing into the drain electrode to the source electrode based on a gate high voltage applied to the gate electrode.

The capacitor Cst may be electrically connected between the third node N3 that is the gate electrode of the first transistor T1 and the driving voltage line VDL. For example, the first electrode of the capacitor Cst may be electrically connected to the third node N3, and the second electrode of the capacitor Cst may be electrically connected to the driving voltage line VDL, so that a potential difference between the driving voltage line VDL and the gate electrode of the first transistor T1 may be maintained.

Figure 6:
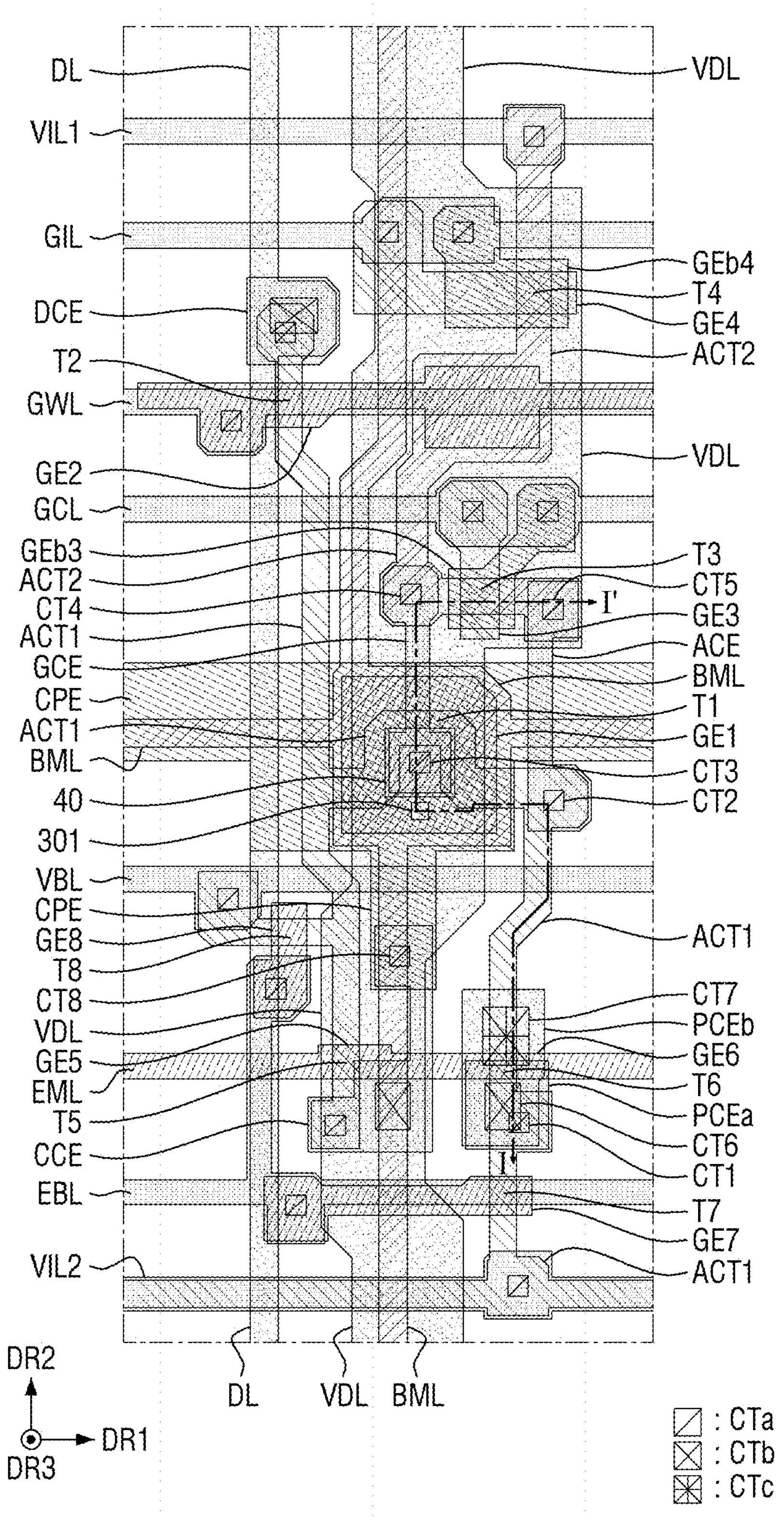
FIG. 6 is a schematic plan view of a unit pixel array according to one embodiment.
Figure 7:
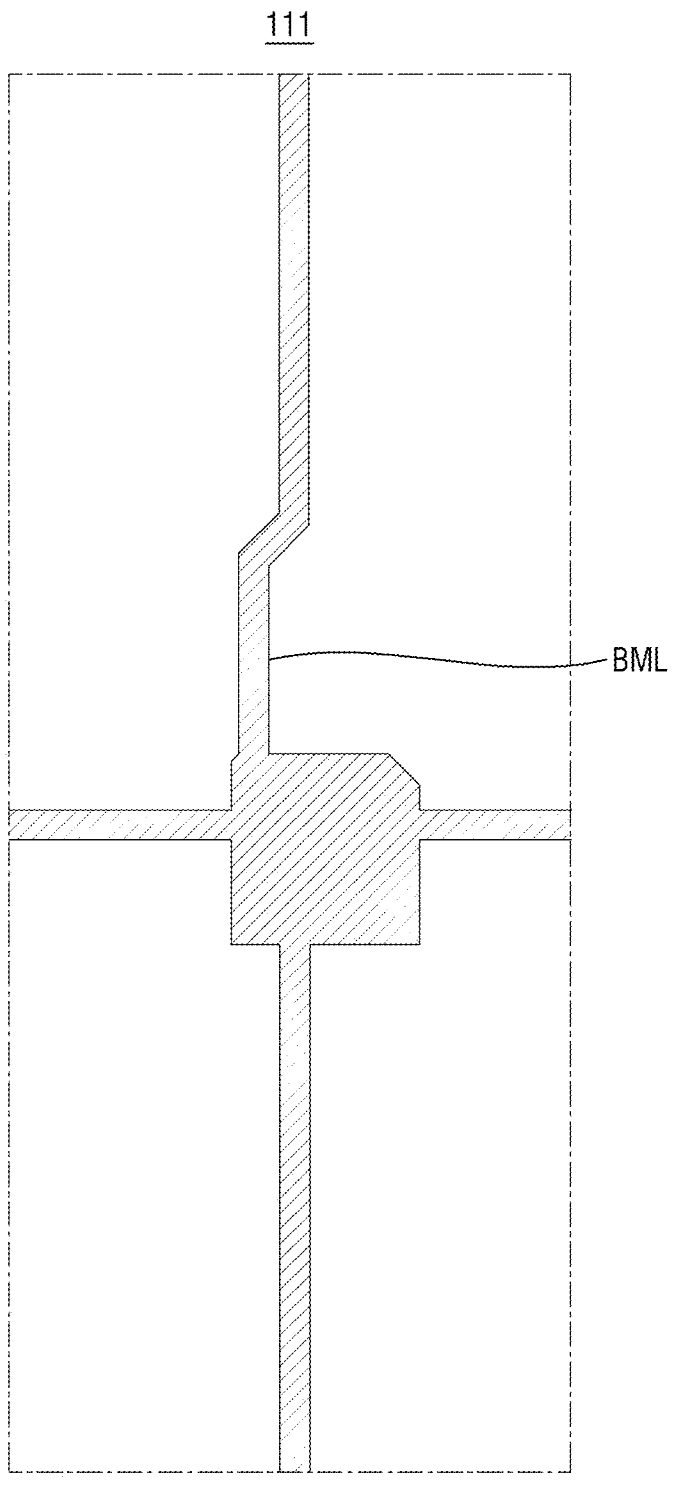
FIG. 7 is a schematic plan view selectively showing only a first pattern layer of the components of FIG. 6.
Figure 8:
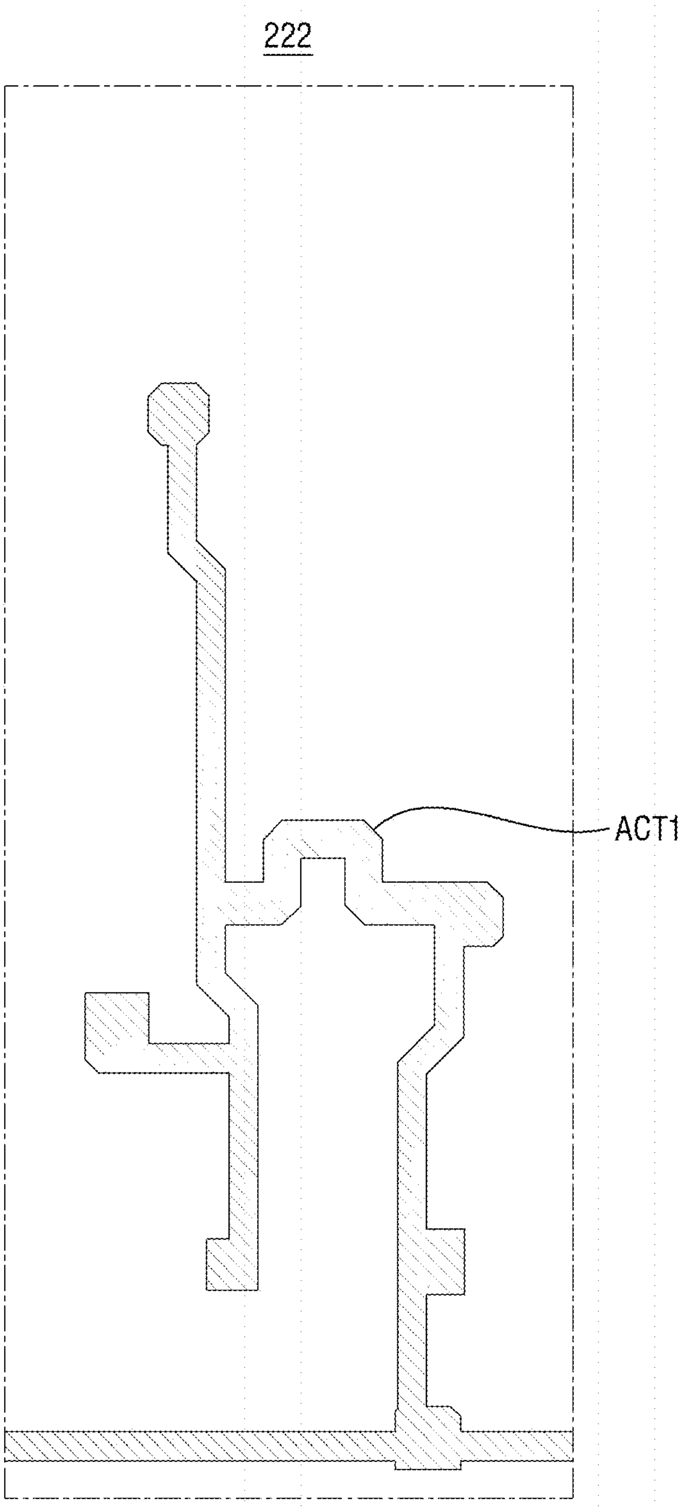
FIG. 8 is a schematic plan view selectively showing only a second pattern layer of the components of FIG. 6.
Figure 9:
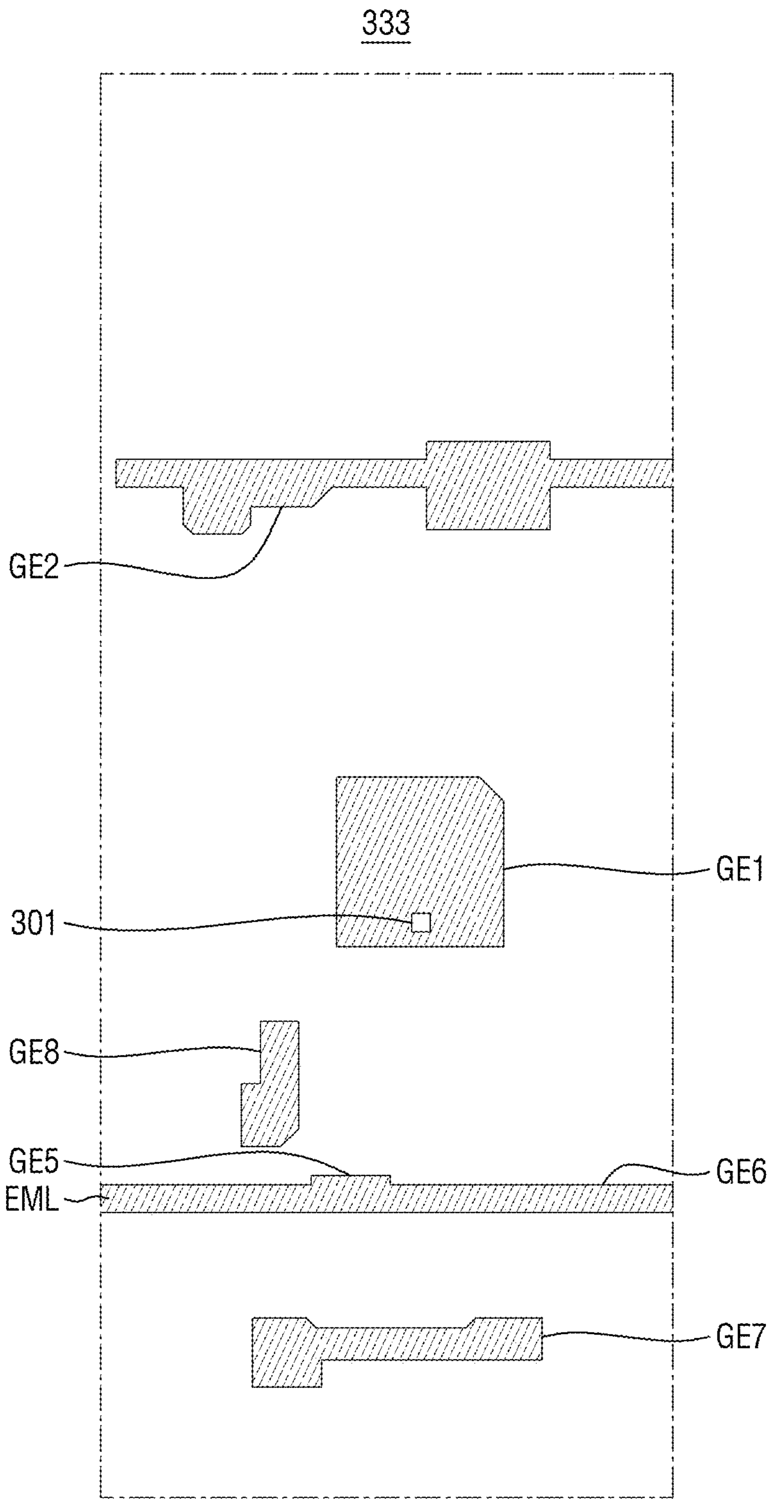
FIG. 9 is a schematic plan view selectively showing only a third pattern layer of the components of FIG. 6.
Figure 10:
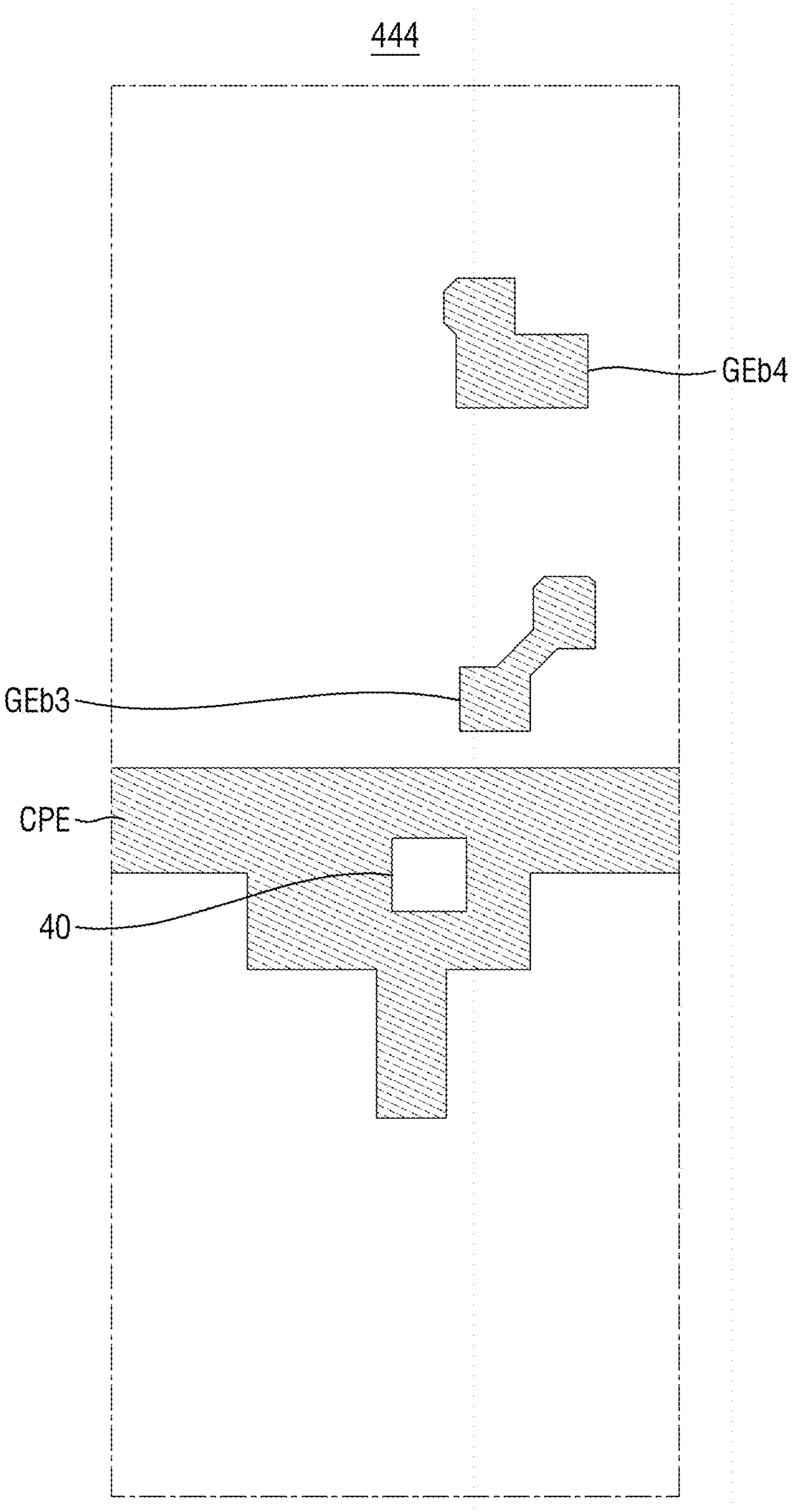
FIG. 10 is a schematic plan view selectively showing only a fourth pattern layer of the components of FIG. 6.
Figure 11:
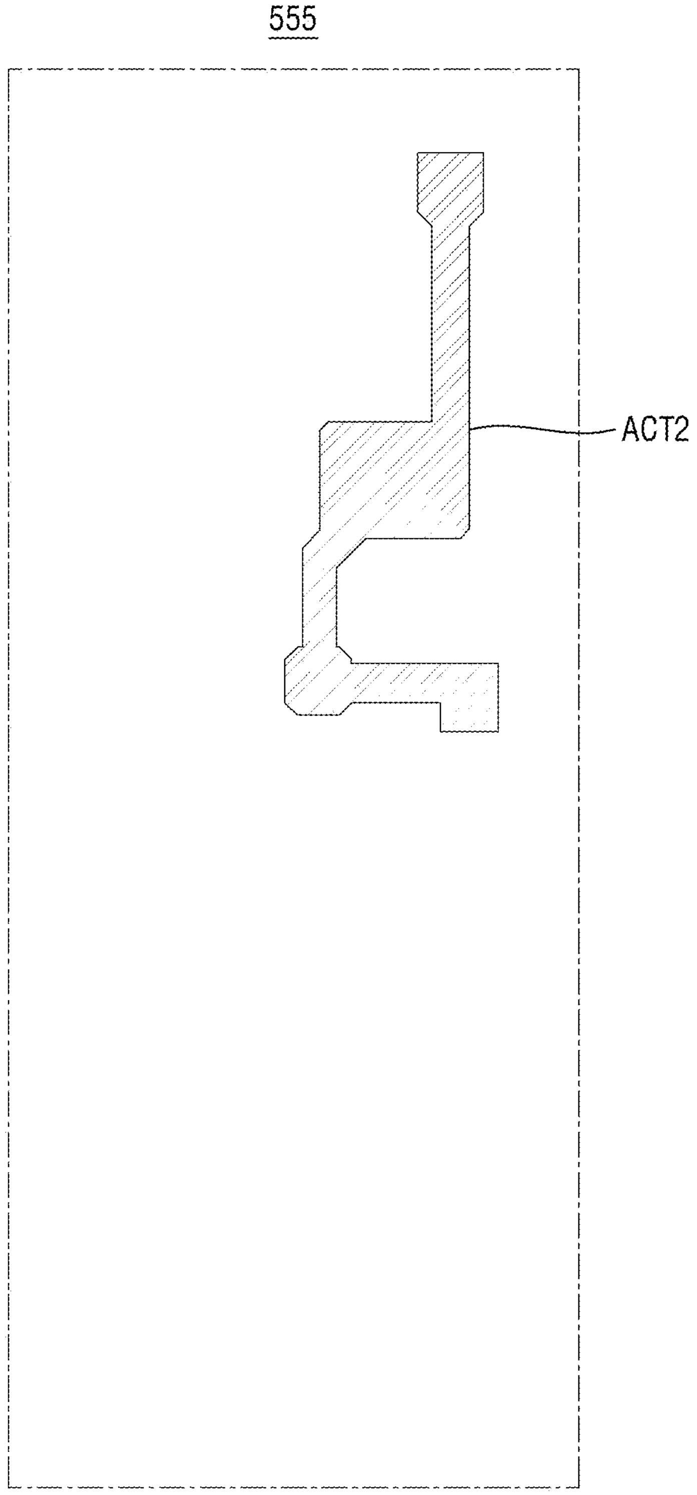
FIG. 11 is a schematic plan view selectively showing only a fifth pattern layer of the components of FIG. 6.
Figure 12:
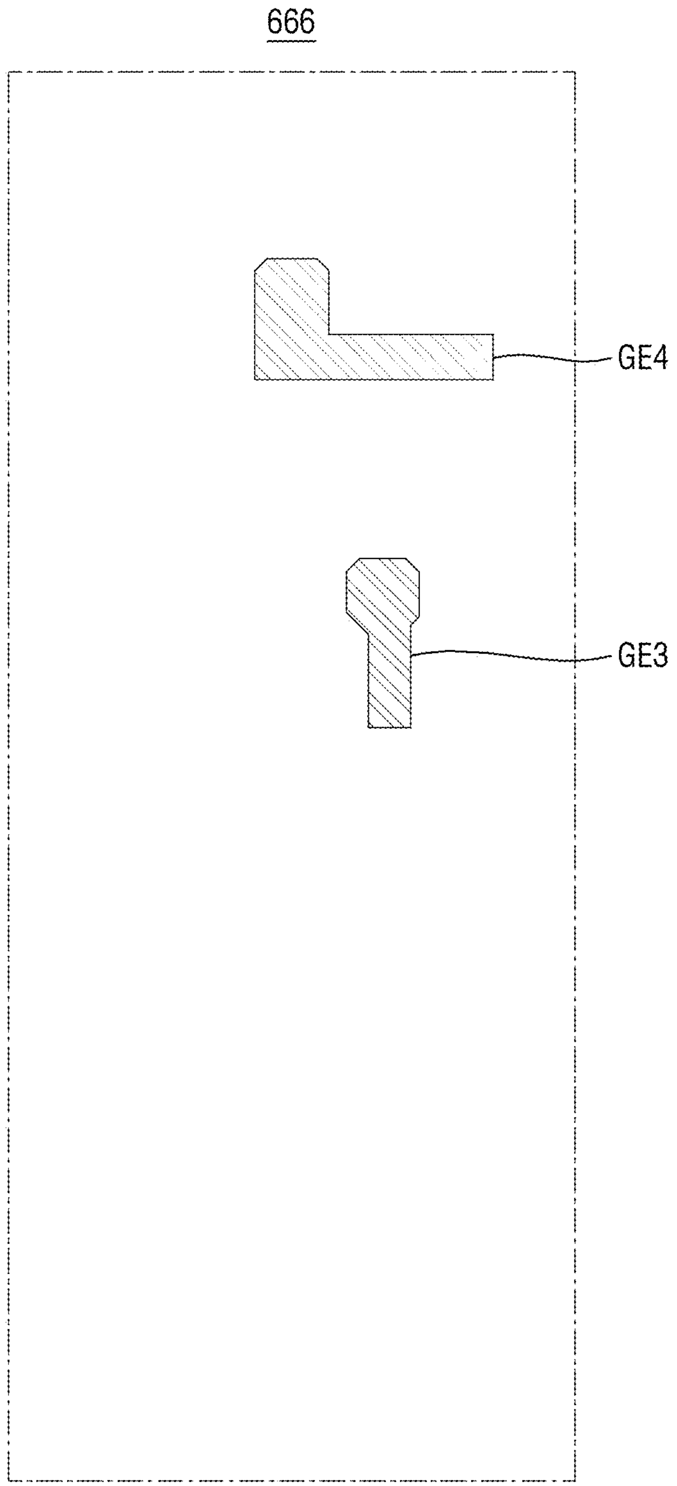
FIG. 12 is a schematic plan view selectively showing only a sixth pattern layer of the components of FIG. 6.
Figure 13:
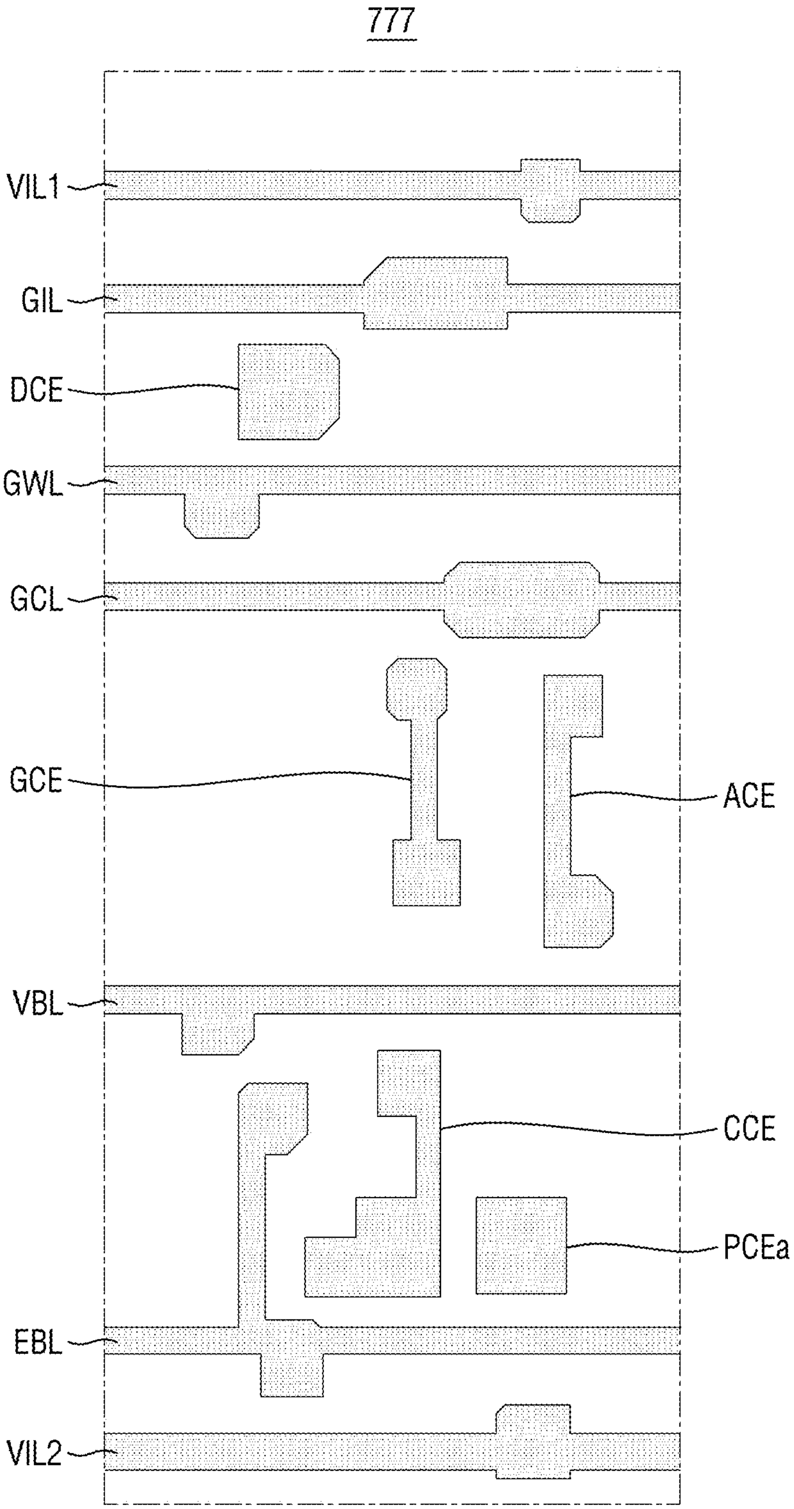
FIG. 13 is a schematic plan view selectively showing only a seventh pattern layer of the components of FIG. 6.
Figure 14:
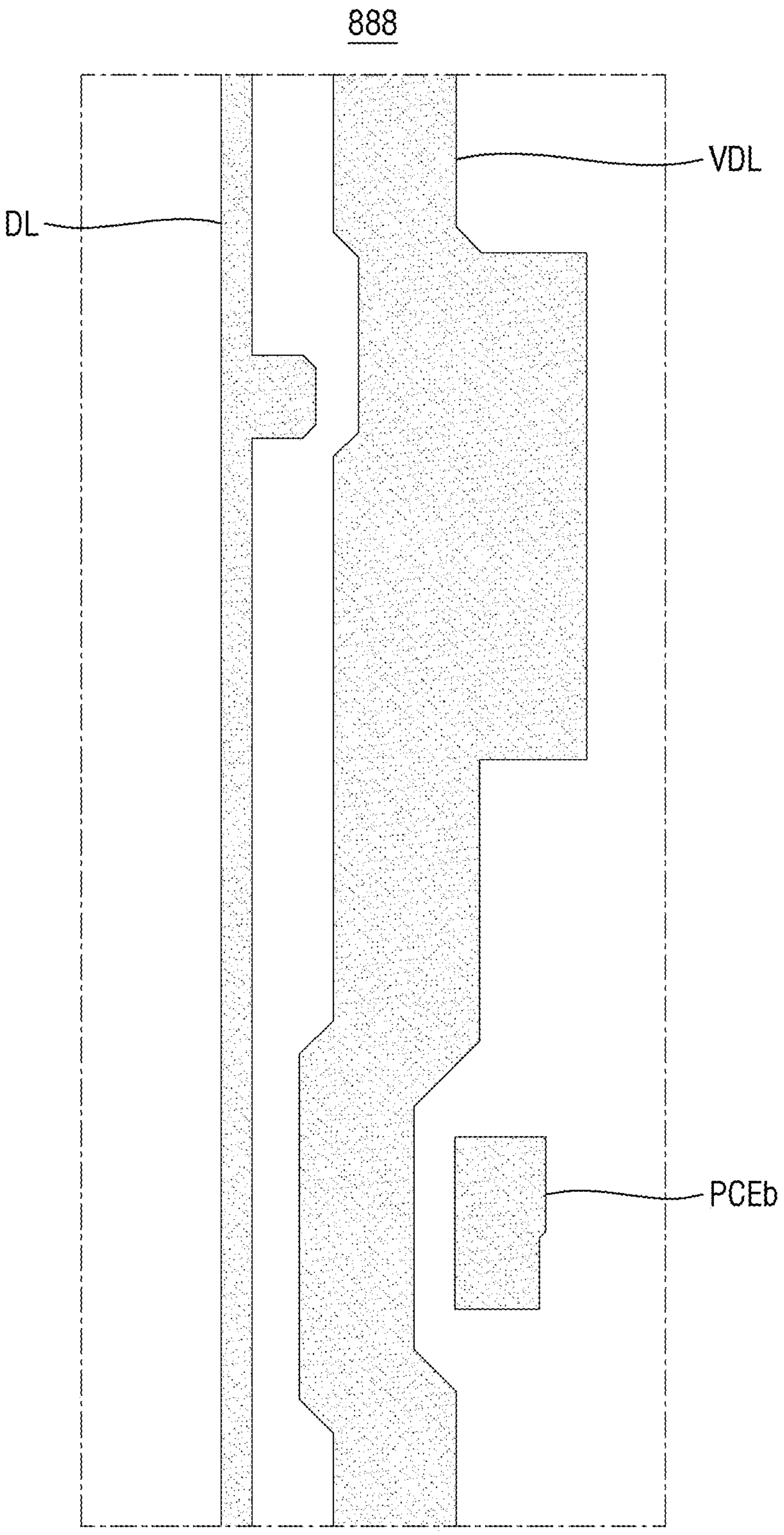
FIG. 14 is a schematic plan view selectively showing only an eighth pattern layer of the components of FIG. 6.
Figure 15:
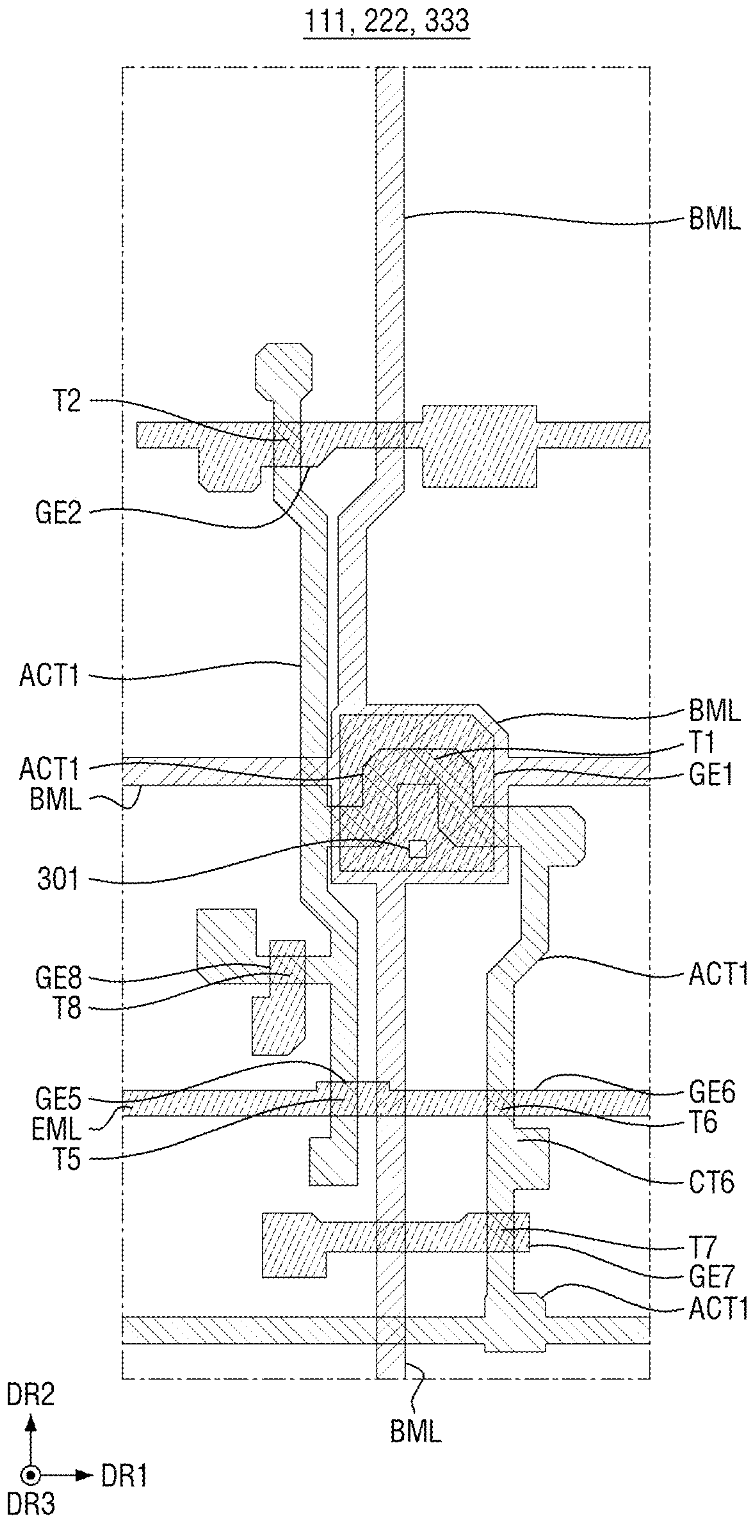
FIG. 15 is a schematic plan view selectively showing only first to third pattern layers of the components of FIG. 6.
Figure 16:
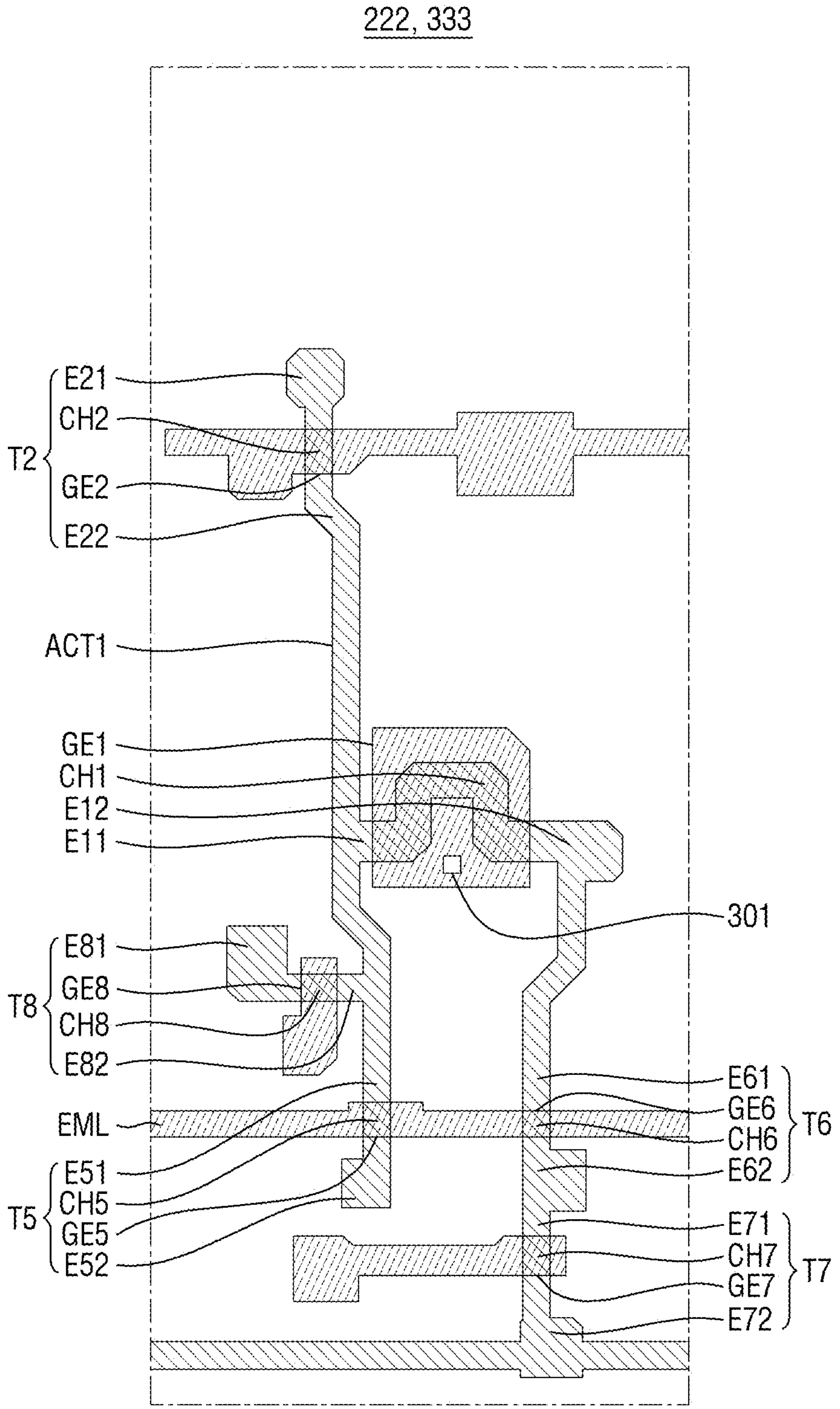
FIG. 16 is a schematic plan view selectively showing only second and third pattern layers of the components of FIG. 6.
Figure 17:
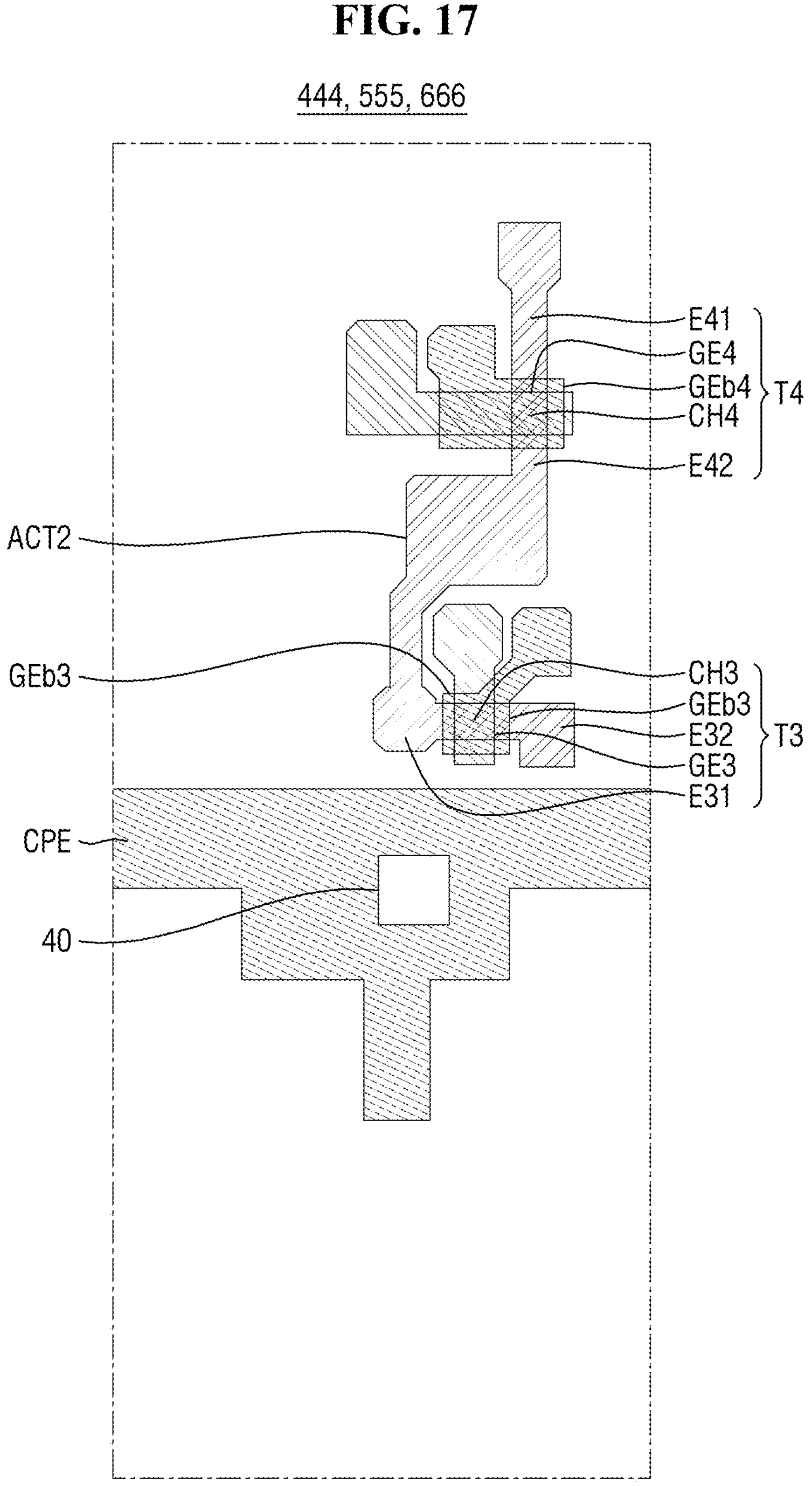
FIG. 17 is a schematic plan view selectively showing only fourth to sixth pattern layers of the components of FIG. 6.
Figure 18:
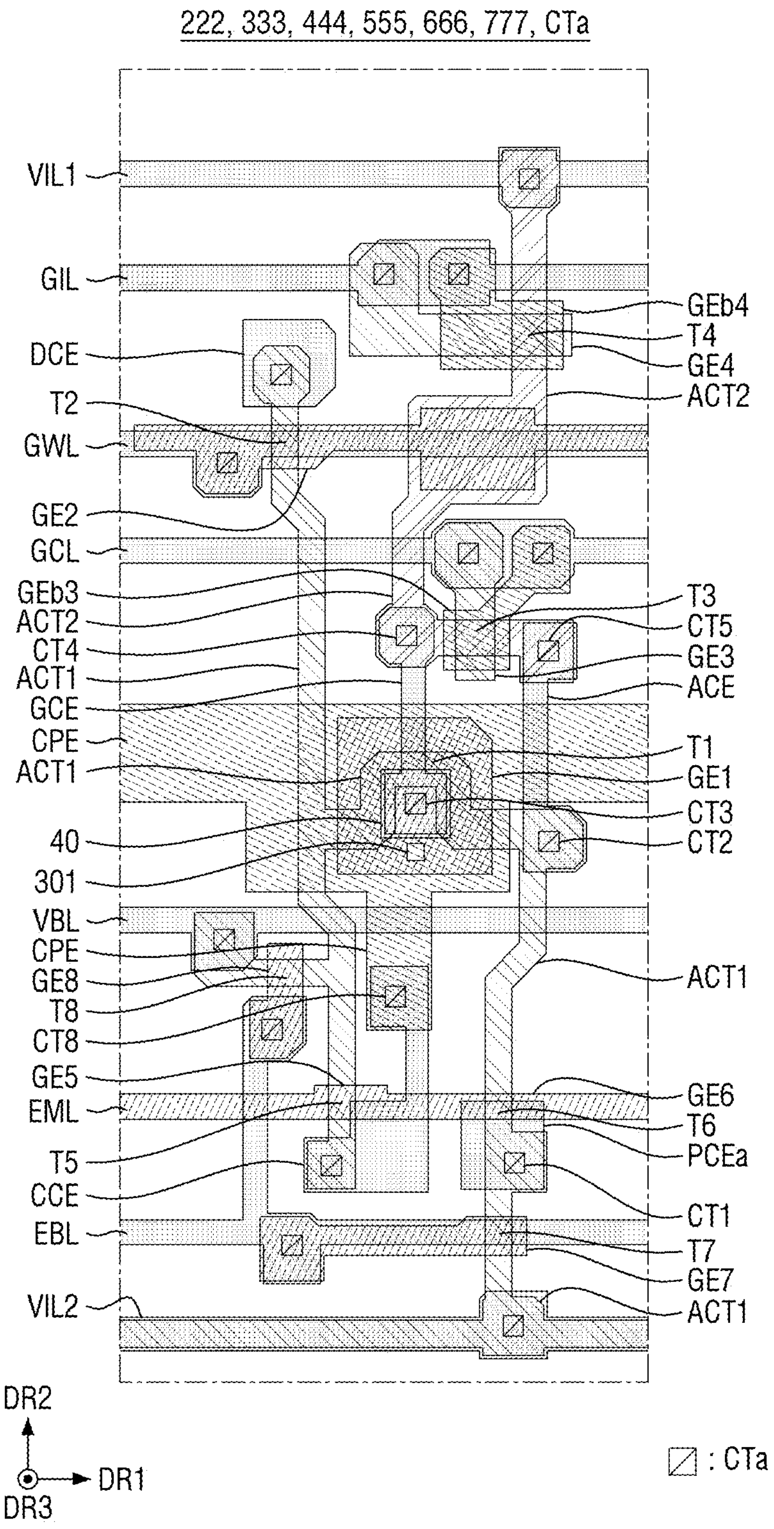
FIG. 18 is a schematic plan view illustrating connection relationships between second to seventh pattern layers of FIG. 6.
Figure 19:
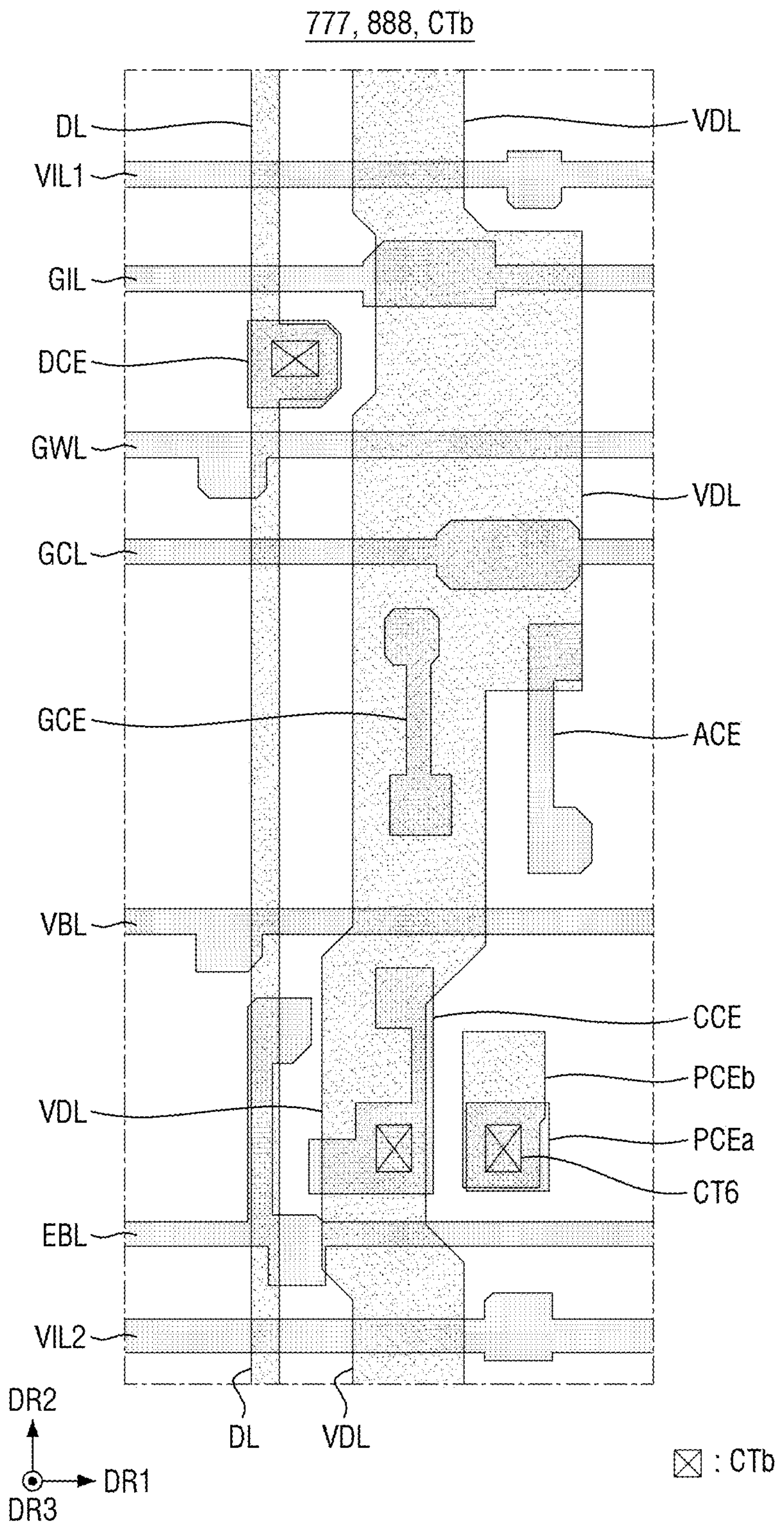
FIG. 19 is a schematic plan view illustrating a connection relationship between seventh and eighth pattern layers of FIG. 6.
Figure 20:
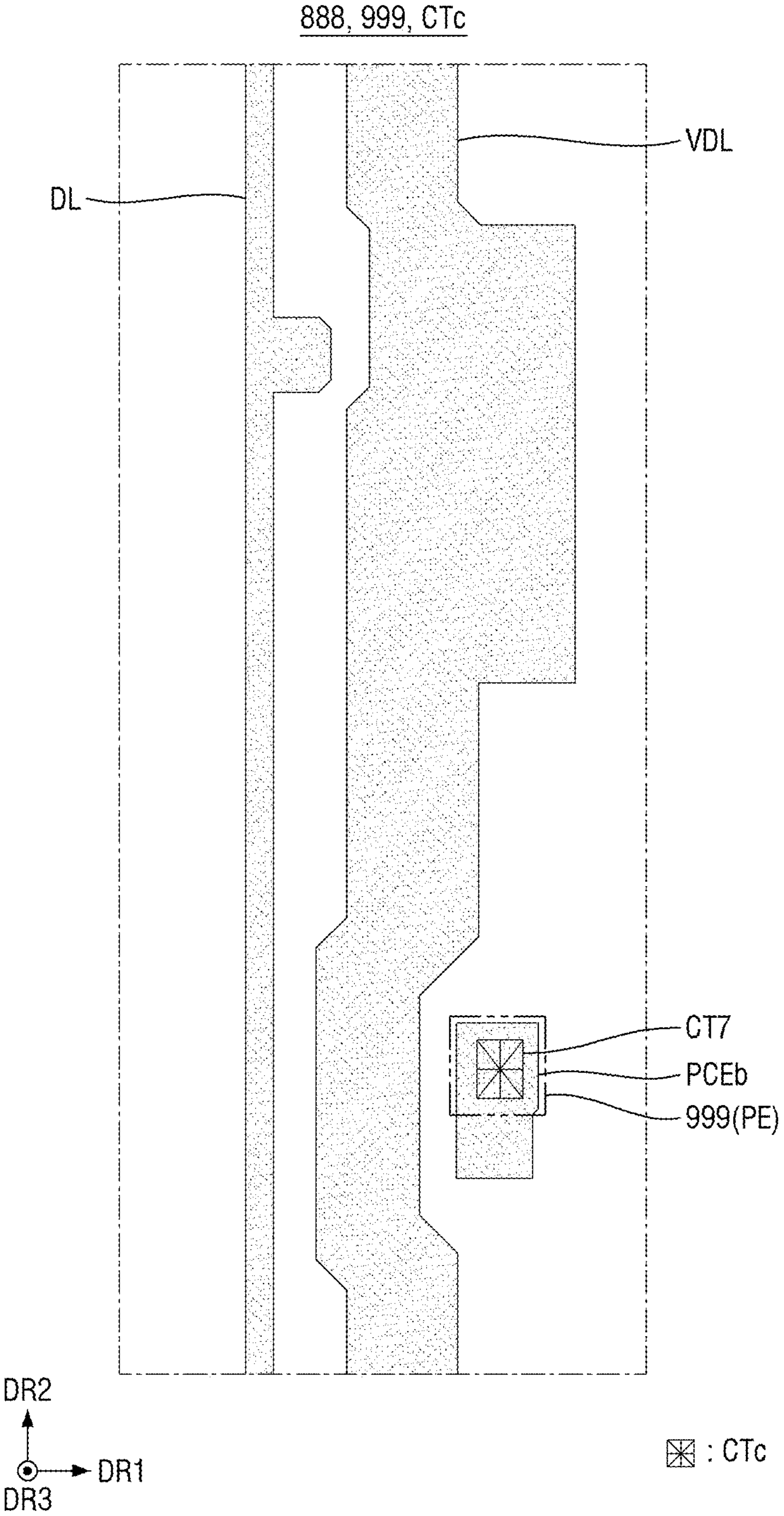
FIG. 20 is a schematic plan view illustrating a connection relationship between eighth and ninth pattern layers of FIG. 6.

FIG. 6 is a schematic plan view of a unit pixel array according to one embodiment. FIG. 7 is a schematic plan view selectively showing only a first pattern layer 111 of the components of FIG. 6. FIG. 8 is a schematic plan view selectively showing only a second pattern layer 222 of the components of FIG. 6. FIG. 9 is a schematic plan view selectively showing only a third pattern layer 333 of the components of FIG. 6. FIG. 10 is a schematic plan view selectively showing only a fourth pattern layer 444 of the components of FIG. 6. FIG. 11 is a schematic plan view selectively showing only a fifth pattern layer 555 of the components of FIG. 6. FIG. 12 is a schematic plan view selectively showing only a sixth pattern layer 666 of the components of FIG. 6. FIG. 13 is a schematic plan view selectively showing only a seventh pattern layer 777 of the components of FIG. 6. FIG. 14 is a schematic plan view selectively showing only an eighth pattern layer 888 of the components of FIG. 6. FIG. 15 is a schematic plan view selectively showing only first to third pattern layers 111, 222, and 333 of the components of FIG. 6. FIG. 16 is a schematic plan view selectively showing only second and third pattern layers 222 and 333 of the components of FIG. 6. FIG. 17 is a schematic plan view selectively showing only fourth to sixth pattern layers 444, 555, and 666 of the components of FIG. 6. FIG. 18 is a schematic plan view illustrating connection relationships between second to seventh pattern layers 222 to 777 of FIG. 6. FIG. 19 is a schematic plan view illustrating a connection relationship between seventh and eighth pattern layers 777 and 888 of FIG. 6. FIG. 20 is a schematic plan view illustrating a connection relationship between eighth and ninth pattern layers 888 and 999 of FIG. 6.

As shown in FIG. 6, contact holes may be classified into a first type contact hole CTa, a second type contact hole CTb, and a third type contact hole CTc. The first type contact hole CTa may be a contact hole for connecting the seventh pattern layer 777 to the pattern layers (for example, second to sixth pattern layers 222 to 666) therebelow. The second type contact hole CTb may be a contact hole for connecting the eighth pattern layer 888 to the pattern layers (for example, at least one of the seventh pattern layers 777) therebelow. The third type contact hole CTc may be a contact hole for connecting the ninth pattern layer 999 to the pattern layer (for example, the eighth pattern layer 888) therebelow.

The first pattern layer 111 may be disposed on the substrate SUB along the third direction DR3. The first pattern layer 111 may include a light blocking layer BML, as in the example shown in FIGS. 6, 7, and 15.

As shown in FIG. 15, the light blocking layer BML may be disposed on the substrate SUB to cover an overlapping region (for example, a first channel region CH1) between a first gate electrode GE1 and a first active layer ACT1. In other words, the light blocking layer BML may be disposed on the substrate SUB to overlap the channel region CH1 of the first transistor T1, which is a driving transistor.

The second pattern layer 222 may be disposed on the first pattern layer 111 along the third direction DR3. The second pattern layer 222 may include the first active layer ACT1, as in the example shown in FIGS. 6, 8, and 16.

The first active layer ACT1 may provide channel regions CH1, CH2, CH5, CH6, CH7, and CH8, first electrodes E11, E21, E51, E61, E71, and E81, and second electrodes E12, E22, E52, E62, E72, and E82 of the first transistor T1, the second transistor T2, the fifth transistor T5, the sixth transistor T6, the seventh transistor T7, and the eighth transistor T8.

The first active layer ACT1 may be a semiconductor layer made of low temperature polycrystalline silicon (LTPS).

The third pattern layer 333 may be disposed on the second pattern layer 222 along the third direction DR3. An insulating layer may be disposed between the second pattern layer 222 and the third pattern layer 333. As in the example shown in FIGS. 6, 9, and 16, the third pattern layer 333 may include a second gate electrode GE2, the first gate electrode GE1, an eighth gate electrode GE8, the emission control line EML, a fifth gate electrode GE5, a sixth gate electrode GE6, and a seventh gate electrode GE7.

The emission control line EML may include the fifth gate electrode GE5 and the sixth gate electrode GE6. For example, a part of the emission control line EML may correspond to the fifth gate electrode GE5, and another part of the emission control line EML may correspond to the sixth gate electrode GE6. The emission control line EML, the fifth gate electrode GE5, and the sixth gate electrode GE6 may be integral.

The first, second, fifth, sixth, seventh, and eighth gate electrodes GE1, GE2, GE5, GE6, GE7, and GE8 may overlap the first active layer ACT1.

The channel regions CH1, CH2, CH5, CH6, CH7, and CH8 of the first, second, fifth, sixth, seventh, and eighth transistors T1, T2, T5, T6, T7, and T8 may be formed in overlapping regions between the first active layer ACT1 and the first, second, fifth, sixth, seventh, and eighth gate electrodes GE1, GE2, GE5, GE6, GE7, and GE8.

The first transistor T1 may include the first gate electrode GE1, the first electrode E11, the second electrode E12, and the first channel region CH1.

The second transistor T2 may include the second gate electrode GE2, the first electrode E21, the second electrode E22, and a second channel region CH2.

The fifth transistor T5 may include the fifth gate electrode GE5, the first electrode E51, the second electrode E52, and a fifth channel region CH5.

The sixth transistor T6 may include the sixth gate electrode GE6, the first electrode E61, the second electrode E62, and a sixth channel region CH6.

The seventh transistor T7 may include the seventh gate electrode GE7, the first electrode E71, the second electrode E72, and a seventh channel region CH7.

The eighth transistor T8 may include the eighth gate electrode GE8, the first electrode E81, the second electrode E82, and an eighth channel region CH8.

The first gate electrode GE1 may have a hole 301 (hereinafter, first exhaust hole 301) penetrating therethrough. In other words, the first gate electrode GE1 may define the first exhaust hole 301. The first exhaust hole 301 of the first gate electrode GE1 may provide a pathway through which hydrogen (H) from the aforementioned first active layer ACT1 and the vicinity of the first active layer ACT1 can be discharged to the outside. The first exhaust hole 301 may have a size of, for example, about 1.8 μm in plan view. The first exhaust hole 301 will be described later in more detail with reference to FIGS. 21 and 22.

The fourth pattern layer 444 may be disposed on the third pattern layer 333 along the third direction DR3. An insulating layer may be disposed between the third pattern layer 333 and the fourth pattern layer 444. As in the example shown in FIGS. 6, 10, 17, and 18, the fourth pattern layer 444 may include a fourth counter gate electrode GEb4, a third counter gate electrode GEb3, and a capacitor electrode CPE.

As in the example shown in FIG. 17, the third counter gate electrode GEb3 may overlap a second active layer ACT2 and a third gate electrode GE3. For example, the third counter gate electrode GEb3 may be disposed to face the third gate electrode GE3 with the second active layer ACT2 interposed therebetween.

As in the example shown in FIG. 17, the fourth counter gate electrode GEb4 may overlap the second active layer ACT2 and a fourth gate electrode GE4. For example, the fourth counter gate electrode GEb4 may be disposed to face the fourth gate electrode GE4 with the second active layer ACT2 interposed therebetween.

As shown in FIG. 18, the capacitor electrode CPE may be disposed to overlap the first gate electrode GE1. The capacitor Cst may be formed in a region where the capacitor electrode CPE and the first gate electrode GE1 overlap. For example, the capacitor electrode CPE and the first gate electrode GE1 may correspond to the first electrode and the second electrode of the capacitor Cst, respectively. The capacitor electrode CPE may have a hole 40 penetrating therethrough in the third direction. The first gate electrode GE1 may be connected to a first electrode E31 of the third transistor T3 through the hole 40 of the capacitor Cst and a gate connection electrode GCE. The capacitor electrode CPE may be connected to the driving voltage line VDL through a capacitor connection electrode CCE, which will be described later.

The fifth pattern layer 555 may be disposed on the fourth pattern layer 444 along the third direction DR3. An insulating layer may be disposed between the fourth pattern layer 444 and the fifth pattern layer 555. The fifth pattern layer 555 may include the second active layer ACT2 as in the example shown in FIGS. 6, 11, 17 and 18. The second active layer ACT2 may provide channel regions CH3 and CH4, first electrodes E31 and E41, and second electrodes E32 and E42 of the third and fourth transistors T3 and T4.

The second active layer ACT2 may be, for example, an oxide-based semiconductor.

The sixth pattern layer 666 may be disposed on the fifth pattern layer 555 along the third direction DR3. An insulating layer may be disposed between the fifth pattern layer 555 and the sixth pattern layer 666. The sixth pattern layer 666 may include the fourth gate electrode GE4 and the third gate electrode GE3 as in the example shown in FIGS. 6, 12, 17 and 18.

As shown in FIG. 17, the third gate electrode GE3 and the fourth gate electrode GE4 may overlap the second active layer ACT2.

The channel regions CH3 and CH4 of the third and fourth transistors T3 and T4 may be formed in overlapping regions between the second active layer ACT2 and the third and fourth gate electrodes GE3 and GE4.

The third transistor T3 may include the third gate electrode GE3, the first electrode E31, the second electrode E32, and a third channel region CH3.

The fourth transistor T4 may include the fourth gate electrode GE4, the first electrode E41, the second electrode E42, and a fourth channel region CH4.

The seventh pattern layer 777 may be disposed on the sixth pattern layer 666 along the third direction DR3. An insulating layer may be disposed between the sixth pattern layer 666 and the seventh pattern layer 777. As in the example shown in FIGS. 6, 13, 18, and 19, the seventh pattern layer 777 may include the first initialization voltage line VIL1, the third gate line GIL, a data connection electrode DCE, the first gate line GWL, the second gate line GCL, the gate connection electrode GCE, an active connection electrode ACE, the bias voltage line VBL, the capacitor connection electrode CCE, a lower pixel connection electrode PCEa, the fourth gate line EBL, and the second initialization voltage line VIL2.

As shown in FIG. 18, the first initialization voltage line VIL1 may be connected to the first electrode E41 (for example, the first electrode E41 of the fourth transistor T4) of the second active layer ACT2 through the first type contact hole CTa of the insulating layer.

As shown in FIG. 18, the second initialization voltage line VIL2 may be connected to the second electrode E72 (for example, the second electrode E72 of the seventh transistor T7) of the first active layer ACT1 through the first type contact hole CTa of the insulating layer.

As shown in FIG. 18, the first gate line GWL may be connected to the second gate electrode GE2 through the first type contact hole CTa of the insulating layer.

As shown in FIG. 18, the second gate line GCL may be connected to the third gate electrode GE3 through the first type contact hole CTa of the insulating layer. The second gate line GCL may be connected to the third counter gate electrode GEb3 through the first type contact hole CTa of the insulating layer.

As shown in FIG. 18, the third gate line GIL may be connected to the fourth gate electrode GE4 through the first type contact hole CTa of the insulating layer. The third gate line GIL may be connected to the fourth counter gate electrode GEb4 through the first type contact hole CTa of the insulating layer.

As shown in FIG. 18, the fourth gate line EBL may be connected to the seventh gate electrode GE7 through the first type contact hole CTa of the insulating layer. The fourth gate line EBL may be connected to the eighth gate electrode GE8 through the first type contact hole CTa of the insulating layer.

As shown in FIG. 18, the gate connection electrode GCE may be connected to the first gate electrode GE1 through the first type contact hole CTa of the insulating layer and the hole 40 of the capacitor electrode CPE. Further, the gate connection electrode GCE may be connected to the first electrode E31 (for example, the first electrode E31 of the third transistor T3) of the second active layer ACT2 and the second electrode E42 (for example, the second electrode E42 of the fourth transistor T4) of the second active layer ACT2 through the first type contact hole CTa (for example, CT4) of the insulating layer.

As shown in FIG. 18, the data connection electrode DCE may be connected to the first electrode E21 (for example, the first electrode E21 of the second transistor T2) of the first active layer ACT1 through the first type contact hole CTa of the insulating layer.

As shown in FIG. 18, the active connection electrode ACE may be connected to the first electrode E11 (for example, the first electrode E11 of the first transistor T1) of the first active layer ACT1 through the first type contact hole CTa (for example, CT2) of the insulating layer. Further, the active connection electrode ACE may be connected to the second electrode E32 (for example, the second electrode E32 of the third transistor T3) of the second active layer ACT2 through the first type contact hole CTa (for example, CT5) of the insulating layer.

As shown in FIG. 18, the lower pixel connection electrode PCEa may be connected to the second electrode E62 (for example, the second electrode E62 of the sixth transistor T6) of the first active layer ACT through the first type contact hole CTa (for example, CT1) of the insulating layer.

As shown in FIG. 18, the capacitor connection electrode CCE may be connected to the first electrode E51 (for example, the first electrode E51 of the fifth transistor T5) of the first active layer ACT1 through the first type contact hole CTa of the insulating layer. Further, the capacitor connection electrode CCE may be connected to the capacitor electrode CPE through the first type contact hole CTa (for example, CT8) of the insulating layer.

The bias voltage line VBL may transmit the bias voltage VB. As shown in FIG. 18, the bias voltage line VBL may be connected to the first electrode E81 (for example, the first electrode E81 of the eighth transistor T8) of the first active layer ACT1 through the first type contact hole CTa of the insulating layer.

The eighth pattern layer 888 may be disposed on the seventh pattern layer 777 along the third direction DR3. An insulating layer may be disposed between the seventh pattern layer 777 and the eighth pattern layer 888. As in the example shown in FIGS. 6, 14, 19, and 20, the eighth pattern layer 888 may include a first data line DLI, the driving voltage line VDL, and an upper pixel connection electrode PCEb.

As shown in FIG. 19, the first data line DLI may be connected to the data connection electrode DCE through the second type contact hole CTb of the insulating layer.

As shown in FIG. 19, the driving voltage line VDL may be connected to the capacitor connection electrode CCE through the second type contact hole CTb of the insulating layer.

As shown in FIG. 19, the upper pixel connection electrode PCEb may be connected to the lower pixel connection electrode PCEa through the second type contact hole CTb (for example, CT6) of the insulating layer.

The ninth pattern layer 999 may be disposed on the eighth pattern layer 888 along the third direction DR3. An insulating layer may be disposed between the eighth pattern layer 888 and the ninth pattern layer 999. As in the example shown in FIG. 20, the ninth pattern layer 999 may include a pixel electrode PE. Note that the pixel electrode of FIG. 19 is only shown in part, not in its entirety.

A part of the pixel electrode PE may be exposed by a bank to be described later. For example, the bank may have an opening (hereinafter, an emission area) that exposes a part of the pixel electrode PE. A light emitting layer may be disposed on the pixel electrode PE corresponding to the emission area.

The pixel electrode PE may be connected to the upper pixel connection electrode PCEb through the third type contact hole CTc (for example, CT7) of the insulating layer.

Figure 21:
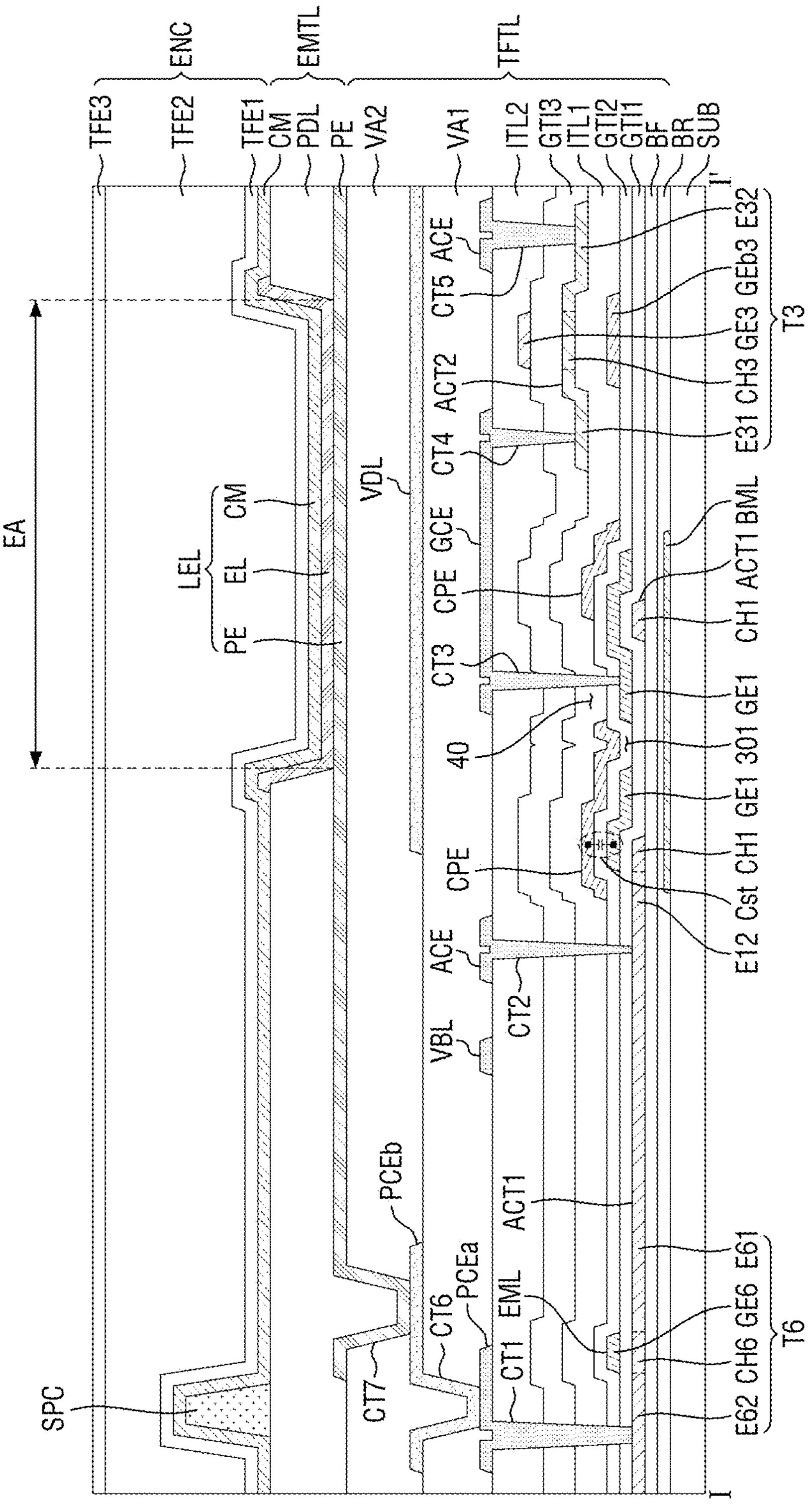
FIG. 21 is a schematic cross-sectional view taken along line I-I' of FIG. 6.

FIG. 21 is a schematic cross-sectional view taken along line I-I' of FIG. 6.

As illustrated in FIG. 21, the display device 10 may include the substrate SUB, a barrier layer BR, the thin film transistor layer TFTL, a light emitting element layer EMTL, and the encapsulation layer ENC. The barrier layer BR, the thin film transistor layer TFTL, the light emitting element layer EMTL, and the encapsulation layer ENC may be sequentially disposed on the substrate SUB along the third direction DR3.

The substrate SUB may be a rigid substrate or a flexible substrate which can be bent, folded or rolled. The substrate SUB may be formed of an insulating material such as glass, quartz, or a polymer resin. Examples of a polymer material may include polyethersulphone (PES), polyacrylate (PA), polyarylate (PAR), polyetherimide (PEI), polyethylene naphthalate (PEN), polyethylene terephthalate (PET), polyphenylene sulfide (PPS), polyallylate, polyimide (PI), polycarbonate (PC), cellulose triacetate (TAC), cellulose acetate propionate (CAP), or a combination thereof. By way of example, the substrate SUB may include a metal material.

As shown in FIG. 21, the barrier layer BF may be disposed on the substrate SUB. The barrier layer BR may be disposed on the entire surface of the substrate SUB. The barrier layer BR may be a layer for protecting the transistors T1 to T8 of the thin film transistor layer TFTL and a light emitting layer EL of the light emitting element layer EMTL from moisture permeating through the substrate SUB which is susceptible to moisture permeation.

The barrier layer BR may be formed as inorganic layers that may be alternately stacked each other. For example, the barrier layer BR may be formed of multiple layers in which one or more inorganic layers of a silicon nitride layer, a silicon oxynitride layer, a silicon oxide layer, a titanium oxide layer and an aluminum oxide layer may be alternately stacked each other.

As shown in FIG. 21, the first pattern layer 111 may be disposed on the barrier layer BR. For example, the light blocking layer BML may be disposed on the barrier layer BR. The light blocking layer BML may be disposed on the barrier layer BR to cover an overlapping region (for example, the first channel region CH1) between the first gate electrode GE1 and the first active layer ACT1. In other words, the light blocking layer BML may be disposed on the barrier layer BR to overlap the channel region CH1 of the first transistor T1 which is the driving transistor.

The light blocking layer BML may be made of, for example, a metallic material such as chromium (Cr) or molybdenum (Mo), black ink, black dye, or the like within the spirit and the scope of the disclosure. In case that the light blocking layer BML is made of a metallic material, the light blocking layer BML may be supplied with a constant power source. In this way, the light blocking layer BML is not electrically floating, and the transistor (for example, the first transistor T1) on the light blocking layer BML may have its electrical characteristics stabilized.

As shown in FIG. 21, a buffer layer BF may be disposed on the light blocking layer BML. The buffer layer BF may be disposed on the entire surface of the substrate SUB including the barrier layer BR. The buffer layer BF may be a layer for protecting the transistors T1 to T8 of the thin film transistor layer TFTL and a light emitting layer EL of the light emitting element layer EMTL from moisture permeating through the substrate SUB which is susceptible to moisture permeation.

The buffer layer BF may be formed of inorganic layers that may be alternately stacked each other. For example, the buffer layer BF may be formed of multiple layers in which one or more inorganic layers of a silicon nitride layer, a silicon oxynitride layer, a silicon oxide layer, a titanium oxide layer and an aluminum oxide layer may be alternately stacked each other.

The second pattern layer 222 may be disposed on the buffer layer BF. For example, the first active layer ACT1 may be disposed on the barrier layer BR. As shown in FIG. 21, the first active layer ACT1 may include the first channel region CH1 of the first transistor T1, the second electrode E12 of the first transistor T1, the first channel region CH1 of the first transistor T1, the first electrode E61 of the sixth transistor T6, the second electrode E62 of the sixth transistor T6, and the sixth channel region CH6 of the sixth transistor T6.

The first active layer ACT1 may be an active layer made of low temperature polycrystalline silicon (LTPS).

A first gate insulating layer GTI1 may be disposed on the first pattern layer 111. For example, as shown in FIG. 21, the first gate insulating layer GTI1 may be disposed on the first active layer ACT1. The first gate insulating layer GTI1 may be disposed on the entire surface of the substrate SUB including the first active layer ACT1.

The first gate insulating layer GTI1 may include at least one of tetraethylorthosilicate (TEOS), silicon nitride ($SiN_x$), or silicon oxide ($SiO_2$). For example, the first gate insulating layer GTI1 may have a double layer structure in which a silicon nitride layer having a thickness of 40 nm and a tetraethylorthosilicate layer having a thickness of about 80 nm may be sequentially stacked each other.

The third pattern layer 333 may be disposed on the first gate insulating layer GTI1. For example, the second gate electrode GE2, the first gate electrode GE1, the eighth gate electrode GE8, the emission control line EML, the fifth gate electrode GE5, and the sixth gate electrode GE6 may be disposed on the first gate insulating layer GTI1.

FIG. 21 illustrates an example in which the first gate electrode GE1, the sixth gate electrode GE6, and the emission control line EML are disposed on the first gate insulating layer GTI1. The first gate electrode GE1 may be disposed on the first gate insulating layer GTI1 to overlap the first channel region CH1 of the first active layer ACT1. The sixth gate electrode GE6 of the emission control line EML may be disposed on the first gate insulating layer GTI1 to overlap the sixth channel region CH6 of the first active layer ACT1.

As shown in FIG. 21, the first gate electrode GE1 may have the first exhaust hole 301 penetrating the first gate electrode GE1 in the third direction DR3. The first exhaust hole 301 may overlap the light blocking layer BML and the capacitor electrode CPE. The first exhaust hole 301 may not overlap the first active layer ACT1. An insulating layer may be disposed in the first exhaust hole 301. For example, a second gate insulating layer GTI2 may be filled in the first exhaust hole 301.

The third pattern layer 333 may include at least one of molybdenum (Mo), copper (Cu), aluminum, or titanium (Ti) and may be formed of a single layer or multiple layers. For example, the first gate electrode GE1 may be formed of a triple layer including a titanium layer, an aluminum layer, and a titanium layer sequentially disposed on the first gate insulating layer GTI1 along the third direction DR3.

The second gate insulating layer GTI2 may be disposed on the third pattern layer 333. For example, as shown in FIG. 21, the second gate insulating layer GTI2 may be disposed on the first gate electrode GE1, the sixth gate electrode GE6, and the emission control line EML. The second gate insulating layer GTI2 may be disposed on the entire surface of the substrate SUB including the first gate electrode GE1, the sixth gate electrode GE6, and the emission control line EML.

The second gate insulating layer GTI2 may include the same material and structure as the first gate insulating layer GTI1 described above.

The fourth pattern layer 444 may be disposed on the second gate insulating layer GTI2. For example, the fourth counter gate electrode GEb4, the third counter gate electrode GEb3, and the capacitor electrode CPE may be disposed on the second gate insulating layer GTI2. FIG. 21 illustrates an example in which the capacitor electrode CPE and the third counter gate electrode GEb3 are disposed on the second gate insulating layer GTI2. The capacitor electrode CPE may be disposed on the second gate insulating layer GTI2 to overlap the first gate electrode GE1. The capacitor Cst may be formed between the capacitor electrode CPE and the first gate electrode GE1.

The fourth pattern layer 333 may have the same material or structure as the third pattern layer 333 described above.

A first interlayer insulating layer ITL1 may be disposed on the fourth pattern layer 444. For example, as shown in FIG. 21, the first interlayer insulating layer ITL1 may be disposed on the capacitor electrode CPE and the third counter gate electrode GEb3. The first interlayer insulating layer ITL1 may be disposed on the entire surface of the substrate SUB including the capacitor electrode CPE and the third counter gate electrode GEb3.

The first interlayer insulating layer ITL1 may include an inorganic layer, for example, a silicon nitride layer, a silicon oxynitride layer, a silicon oxide layer, a titanium oxide layer, or an aluminum oxide layer. The first interlayer insulating layer ITL1 may include inorganic layers.

The fifth pattern layer 555 may be disposed on the first interlayer insulating layer ITL1. For example, the second active layer ACT2 may be disposed on the first interlayer insulating layer ITL1. As shown in FIG. 21, the second active layer ACT2 may be disposed on the first interlayer insulating layer ITL1 to overlap the third counter gate electrode GEb3. The second active layer ACT2 may include the first electrode E31 of the third transistor T3, the second electrode E32 of the third transistor T3, and the third channel region CH3 of the third transistor T3. The third channel region CH3 of the second active layer ACT2 may overlap the third counter gate electrode GEb3.

The second active layer ACT2 may be an oxide-based active layer. For example, the second active layer ACT2 may be an oxide semiconductor containing indium-gallium-zinc oxide (IGZO) or indium-gallium-zinc-tin oxide (IGZTO).

A third gate insulating layer GTI3 may be disposed on the fifth pattern layer 555. For example, as shown in FIG. 21, a third gate insulating layer GTI3 may be disposed on the second active layer ACT2. The third gate insulating layer GTI3 may be disposed on the entire surface of the substrate SUB including the second active layer ACT2.

The third gate insulating layer GTI3 may have the same material and structure as the first gate insulating layer GTI1 described above.

A sixth pattern layer 666 may be disposed on the third gate insulating layer GTI3. For example, the fourth gate electrode GE4 and the third gate electrode GE3 may be disposed on the third gate insulating layer GTI3.

FIG. 21 illustrates an example in which the third gate electrode GE3 is disposed on the third gate insulating layer GTI3. The third gate electrode GE3 may be disposed to overlap the third channel region CH3 of the second active layer ACT2.

The sixth pattern layer 666 may have the same material or structure as the third pattern layer 333 described above.

A second interlayer insulating layer ITL2 may be disposed on the sixth pattern layer 666. For example, as shown in FIG. 21, the second interlayer insulating layer ITL2 may be disposed on the third gate electrode GE3. The second interlayer insulating layer ITL2 may be disposed on the entire surface of the substrate SUB including the third gate electrode GE3.

The second interlayer insulating layer ITL2 may have the same material and structure as the first interlayer insulating layer ITL1 described above.

The seventh pattern layer 777 may be disposed on the second interlayer insulating layer ITL2. For example, the first initialization voltage line VIL1, the third gate line GIL, the data connection electrode DCE, the first gate line GWL, the second gate line GCL, the gate connection electrode GCE, the active connection electrode ACE, the bias voltage line VBL, the capacitor connection electrode CCE, the lower pixel connection electrode PCEa, the fourth gate line EBL, and the second initialization voltage line VIL2 may be disposed on the second interlayer insulating layer ITL2.

FIG. 21 illustrates an example in which the gate connection electrode GCE, the active connection electrode ACE, the bias voltage line VBL, and the lower pixel connection electrode PCEa are disposed on the second interlayer insulating layer ITL2. The lower pixel connection electrode PCEa may be connected to the second electrode E62 of the sixth transistor T6 through a first contact hole CT1 penetrating the second interlayer insulating layer ITL2, the third gate insulating layer GTI3, the first interlayer insulating layer ITL1, the second gate insulating layer GTI2, and the first gate insulating layer GTI1. The active connection electrode ACE may be connected to the second electrode E12 of the first transistor T1 and the first electrode E61 of the sixth transistor T6 through a second contact hole CT2 penetrating the second interlayer insulating layer ITL2, the third gate insulating layer GTI3, the first interlayer insulating layer ITL1, the second gate insulating layer GTI2, and the first gate insulating layer GTI1. Further, the active connection electrode ACE may be connected to the second electrode E32 of the third transistor T3 through a fifth contact hole CT5 penetrating the second interlayer insulating layer ITL2 and the third gate insulating layer GTI3. The gate connection electrode GCE may be connected to the first gate electrode GE1 through a third contact hole CT3 penetrating the second interlayer insulating layer ITL2, the third gate insulating layer GTI3, the first interlayer insulating layer ITL1, the hole 40 of the capacitor electrode CPE, and the second gate insulating layer GTI2. Further, the gate connection electrode GCE may be connected to the first electrode E31 of the third transistor T3 through a fourth contact hole CT4 penetrating the second interlayer insulating layer ITL2 and the third gate insulating layer GTI3. The first contact hole CT1, the second contact hole CT2, the third contact hole CT3, the fourth contact hole CT4, and the fifth contact hole CT5 described above may belong to the first type contact hole CTa.

The seventh pattern layer 777 may have the same material or structure as the third pattern layer 333 described above.

A first planarization layer VA1 may be disposed on the seventh pattern layer 777. For example, the first planarization layer VA1 may be disposed on the gate connection electrode GCE, the active connection electrode ACE, the bias voltage line VBL, and the lower pixel connection electrode PCEa. The first planarization layer VA1 may be disposed on the entire surface of the substrate SUB including the gate connection electrode GCE, the active connection electrode ACE, the bias voltage line VBL, and the lower pixel connection electrode PCEa.

The first planarization layer VA1 may include an organic layer such as acryl resin, epoxy resin, phenolic resin, polyamide resin, polyimide resin and the like within the spirit and the scope of the disclosure.

The eighth pattern layer 888 may be disposed on the first planarization layer VA1. For example, the first data line DLI, the driving voltage line VDL, and the upper pixel connection electrode PCEb may be disposed on the first planarization layer VA1. FIG. 21 illustrates an example in which the driving voltage line VDL and the upper pixel connection electrode PCEb are disposed on the first planarization layer VA1.

The upper pixel connection electrode PCEb may be connected to the lower pixel connection electrode PCEa through a sixth contact hole CT6 penetrating the first planarization layer VA1. The aforementioned sixth contact hole CT6 may belong to the second type contact hole CTb.

The eighth pattern layer 888 may have the same material or structure as the third pattern layer 333 described above.

A second planarization layer VA2 may be disposed on the eighth pattern layer 888. For example, the second planarization layer VA2 may be disposed on the driving voltage line VDL and the upper pixel connection electrode PCEb. The second planarization layer VA2 may be disposed on the entire surface of the substrate SUB including the driving voltage line VDL and the upper pixel connection electrode PCEb.

The second planarization layer VA2 may have the same material and structure as the first planarization layer VA1 described above.

The ninth pattern layer 999 may be disposed on the second planarization layer VA2. For example, as shown in FIG. 21, the light emitting element layer EMTL including the ninth pattern layer 999 may be disposed on the second planarization layer VA2. For example, as shown in FIG. 21, the pixel electrode PE may be disposed on the second planarization layer VA2, as the ninth pattern layer 999. The pixel electrode PE may be connected to the upper pixel connection electrode PCEb through a seventh contact hole CT7 penetrating the second planarization layer VA2. The aforementioned seventh contact hole CT7 may belong to the third type contact hole CTc.

The light emitting element layer EMTL described above may further include a light emitting element LEL and a bank PDL (or pixel defining layer) in addition to the aforementioned ninth pattern layer 999.

The light emitting element LEL may include the pixel electrode PE, the light emitting layer EL, and a common electrode CM. The emission area EA, in which the pixel electrode PE, the light emitting layer EL, and the common electrode CM may be sequentially stacked each other, indicates an area in which holes from the pixel electrode PE and electrons from the common electrode CM are combined with each other in the light emitting layer to emit light. The pixel electrode PE may be the anode electrode of the light emitting element LEL, and the common electrode CM may be the cathode electrode of the light emitting element LEL.

In a top emission structure that emits light toward the common electrode CM with respect to the light emitting layer EL, the pixel electrode PE may be formed of a single layer of molybdenum (Mo), titanium (Ti), copper (Cu), or aluminum (Al), or may be formed to have a stacked structure (Ti/Al/Ti) of aluminum and titanium, a stacked structure (ITO/Al/ITO) of aluminum and ITO, an APC alloy, or a stacked structure (ITO/APC/ITO) of APC alloy and ITO to increase the reflectivity. The APC alloy is an alloy of silver (Ag), palladium (Pd) and copper (Cu).

The bank PDL (or pixel defining layer) may serve to define the emission areas EA of pixels. To this end, the bank PDL may be disposed to expose a part of the pixel electrode PE on the second planarization layer VA2. The bank PDL may cover the edge of the pixel electrode PE. The bank PDL may be disposed in the seventh contact hole CT7 penetrating the second planarization layer VA2. Accordingly, the seventh contact hole CT7 penetrating the second planarization layer VA2 may be filled with the bank PDL. The bank PDL may be formed of an organic layer such as acryl resin, epoxy resin, phenolic resin, polyamide resin, polyimide resin and the like within the spirit and the scope of the disclosure.

As shown in FIG. 21, a spacer SPC may be disposed on the bank PDL. The spacer SPC may serve to support a mask during a process of manufacturing the light emitting layer EL. The spacer SPC may be formed of an organic layer such as acryl resin, epoxy resin, phenolic resin, polyamide resin, polyimide resin and the like within the spirit and the scope of the disclosure.

The light emitting layer EL may be formed on the pixel electrode PE. The light emitting layer EL may include an organic material to emit light in a selectable color. For example, the light emitting layer EL may include a hole transporting layer, an organic material layer, and an electron transporting layer. The organic material layer may include a host and a dopant. The organic material layer may include a material that emits selectable light, and may be formed using a phosphorescent material or a fluorescent material.

The aforementioned light emitting element LEL may be provided for each pixel. For example, a first pixel may include a first light emitting element, a second pixel may include a second light emitting element, and a third pixel may include a third light emitting element. The first light emitting element, the second light emitting element, and the third light emitting element may provide light of different colors. For example, the first light emitting element may emit light of a first color, the second light emitting element may emit light of a second color, and the third light emitting element may emit light of a third color.

For example, the organic material layer of the first light emitting layer of the first emission area emitting the light of the first color may be a phosphorescent material including a host material including carbazole biphenyl (CBP) or mCP (1,3-bis(carbazol-9-yl), and a dopant including at least one selected from the group consisting of PIQIr(acac)(bis(1-phenylisoquinoline)acetylacetonate iridium), PQIr(acac)(bis (1-phenylquinoline)acetylacetonate iridium), PQIr(tris(1-phenylquinoline)iridium)) and PtOEP(octaethylporphyrin platinum). By way of example, the organic material layer of the first light emitting layer of the first emission area may be a fluorescent material including PBD:Eu(DBM)3(Phen) or Perylene, but the disclosure is not limited thereto.

The organic material layer of the second light emitting layer of the second emission area emitting the light of the second color may be a phosphorescent material including a host material including CBP or mCP, and a dopant material including Ir(ppy)3(fac tris(2-phenylpyridinc)iridium. By way of example, the organic material layer of the second light emitting layer of the second emission area emitting the light of the second color may be a fluorescent material including tris(8-hydroxyquinolino)aluminum (Alq3), but the disclosure is not limited thereto.

The organic material layer of the light emitting layer of the third emission area emitting the light of the third color may be a phosphorescent material including a host material including CBP or mCP, and a dopant material including (4,6-F2ppy)2Irpic or L2BD111, but the disclosure is not limited thereto.

The common electrode CM may be disposed on the first, second, and third light emitting layers (for example, EL). The common electrode CM may be disposed to cover the first, second, and third light emitting layers. The common electrode CM may be a common layer commonly disposed in the first to third light emitting layers. A capping layer may be formed on the common electrode CM.

In the top emission structure, the common electrode CM may be formed of a transparent conductive material (TCO) such as ITO or IZO capable of transmitting light or a semi-transmissive conductive material such as magnesium (Mg), silver (Ag), or an alloy of magnesium (Mg) and silver (Ag). In case that the common electrode CM is formed of a semi-transmissive conductive material, the light emission efficiency can be increased due to a micro-cavity effect.

The encapsulation layer ENC may be formed on the light emitting element layer EMTL. The encapsulation layer ENC may include at least one inorganic layer TFEL and TFE3 to prevent oxygen or moisture from permeating into the light emitting element layer EMTL. The encapsulation layer ENC may include at least one organic layer to protect the light emitting element layer EMTL from foreign substances such as dust. For example, the encapsulation layer ENC may include a first inorganic encapsulation layer TFE1, an organic encapsulation layer TFE2, and a second inorganic encapsulation layer TFE3.

The first inorganic encapsulation layer TFE1 may be disposed on the common electrode CM, the organic encapsulation layer TFE2 may be disposed on the first inorganic encapsulation layer TFE1, and the second inorganic encapsulation layer TFE3 may be disposed on the organic encapsulation layer TFE2. The first inorganic encapsulation layer TFE1 and the second inorganic encapsulation layer TFE3 may be formed of a multilayer in which one or more inorganic layers of a silicon nitride layer, a silicon oxynitride layer, a silicon oxide layer, a titanium oxide layer and an aluminum oxide layer may be alternately stacked each other. The encapsulation organic layer TFE2 may be an organic layer such as acryl resin, epoxy resin, phenolic resin, polyamide resin, polyimide resin or the like within the spirit and the scope of the disclosure.

Figure 22:
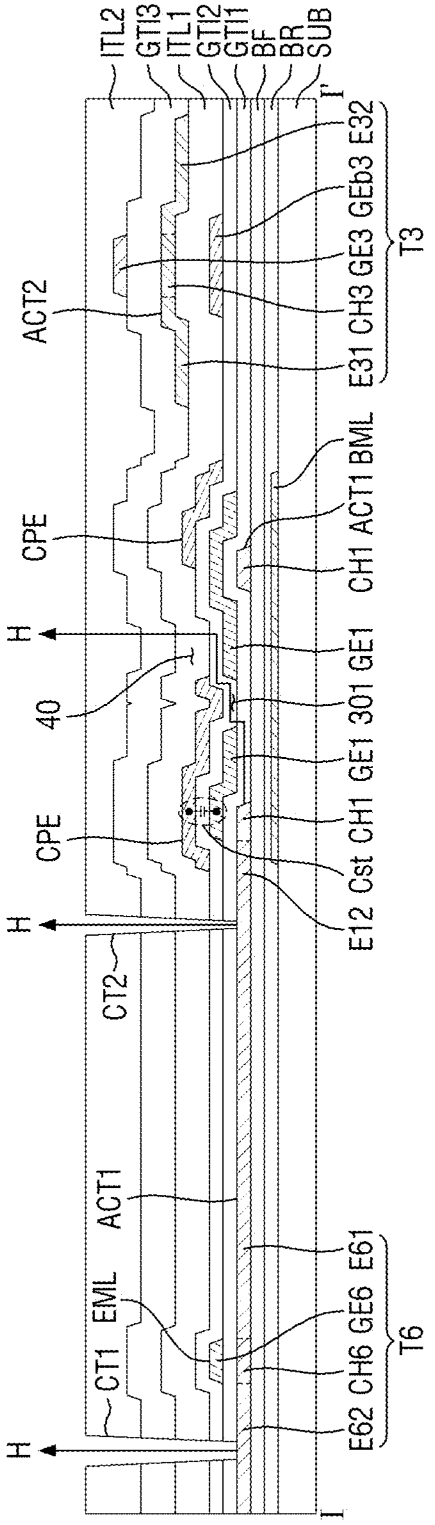
FIG. 22 is a diagram illustrating that hydrogen is discharged through an exhaust hole in a display device according to one embodiment.

FIG. 22 is a diagram illustrating that hydrogen is discharged through an exhaust hole in a display device according to one embodiment.

First, in case that the gate electrode (for example, the first gate electrode GE1) of the transistor may include an aluminum layer for low resistance, a process of forming the first contact hole CT1 and the second contact hole CT2 for exposing the first active layer ACT1 and a process of forming the third contact hole CT3 for exposing the first gate electrode GE1 may not be performed simultaneously. For example, in case that the first gate electrode GE1 may include an aluminum layer, the process of forming the first contact hole CT1 and the second contact hole CT2 is performed first, and the process of forming the third contact hole CT3 is performed. This is because the first active layer ACT1 (for example, the first active layer ACT1 of polycrystalline silicon) is exposed after the process of forming the first contact hole CT1 and the second contact hole CT2, and a process of removing an oxide layer (for example, a natural oxide layer) of the exposed first active layer ACT1 is performed. For example, this is because an etching solution (for example, hydrofluoric acid) used to remove the oxide layer of the first active layer ACT1 may damage the aluminum layer of the first gate electrode GE1. In other words, if the first contact hole CT1 and the second contact hole CT2, and the third contact hole CT3 are formed at the same time, the first gate electrode GE1 exposed by the third contact hole CT3 may be damaged by the etching solution during the oxide layer removal process described above. Therefore, in case that the gate electrode may include a low-resistance layer (for example, an aluminum layer), as shown in FIG. 22, the first contact hole CT1 and the second contact hole CT2 are formed first, and at this time, the third contact hole CT, the fourth contact hole CT4, the fifth contact hole CT5, and the like are not formed. As a result, the number of the contact holes decreases, which may make it difficult for hydrogen to be discharged from the first active layer ACT1 and the vicinity of the first active layer ACT1. On the other hand, the gate electrode described above may be made of an aluminum layer and a titanium layer, and since the titanium layer does not allow hydrogen to pass therethrough, if a titanium layer is disposed on the first active layer ACT1, hydrogen may not be readily discharged, resulting in deterioration of the element characteristics.

However, since the display device of the disclosure may include the first exhaust hole 301 in the first gate electrode GE1, hydrogen in the first active layer ACT1 may be readily discharged to the outside despite the insufficient number of the contact holes. In other words, the display device of the disclosure may have an advantage of being able to readily discharge hydrogen even while using a low-resistance layer (for example, a low-resistance layer using an aluminum layer) and a titanium layer. Such a hydrogen discharge process (for example, a dehydrogenation process) is a process necessary to stabilize the characteristics of the transistor, and this dehydrogenation process is described in detail as follows.

For example, as shown in FIG. 22, after the first contact hole CT1 and the second contact hole CT2 are formed, a heat treatment (for example, annealing) process may be performed on the substrate including the first contact hole CT1 and the second contact hole CT2. The annealing process may be performed at a temperature of, for example, about 375° C., for about 15 minutes. The first contact hole CT1 and the second contact hole CT2 may be expanded by the annealing process. Hydrogen (H) in the first active layer ACT1 and the vicinity of the first active layer ACT1 may be discharged to the outside through the first contact hole CT1 and the second contact hole CT2 by the annealing process. Hydrogen (H) in the first active layer ACT1 and the vicinity of the first active layer ACT1 may also be discharged to the outside through the first exhaust hole 301.

Thus, according to the display device of the disclosure, hydrogen may be readily discharged to the outside during the hydrogen discharge process. Accordingly, the quality of the transistor may be improved. For example, the dispersion of the threshold voltage of the first transistor T1, which is the driving transistor, may be minimized, and the driving range of the first transistor T1 may be improved.

Since the first exhaust hole 301 is disposed in a pattern layer, for example, the first gate electrode GE1, disposed directly above the first active layer ACT1, hydrogen in the first active layer ACT1 may be more readily discharged to the outside.

Further, since the first gate electrode GE1 in which the first exhaust hole 301 is formed is used as a capacitor electrode, the first gate electrode GE1 may have a fairly large area, and thus the first exhaust hole 301 may be readily formed in the first gate electrode GE1 without increasing the area of the first gate electrode GE1.

Furthermore, since the first exhaust hole 301 is formed with a minimal change in the layout, there is sufficient space for placing elements, enabling the realization of a high-resolution display device.

On the other hand, a process of forming the fourth contact hole CT4 and the fifth contact hole CT4 for exposing the second active layer ACT2, which is an oxide semiconductor, is performed, for example, after the process of forming the third contact hole CT3. This is because the second active layer ACT2 may be damaged during the process of forming the third contact hole CT3. Therefore, in case that the gate electrode may include an aluminum layer, the first and second contact holes CT1 and CT2 may be formed first, followed by the third contact hole CT3, and the fourth and fifth contact holes CT4 and CT5.

Figure 23:
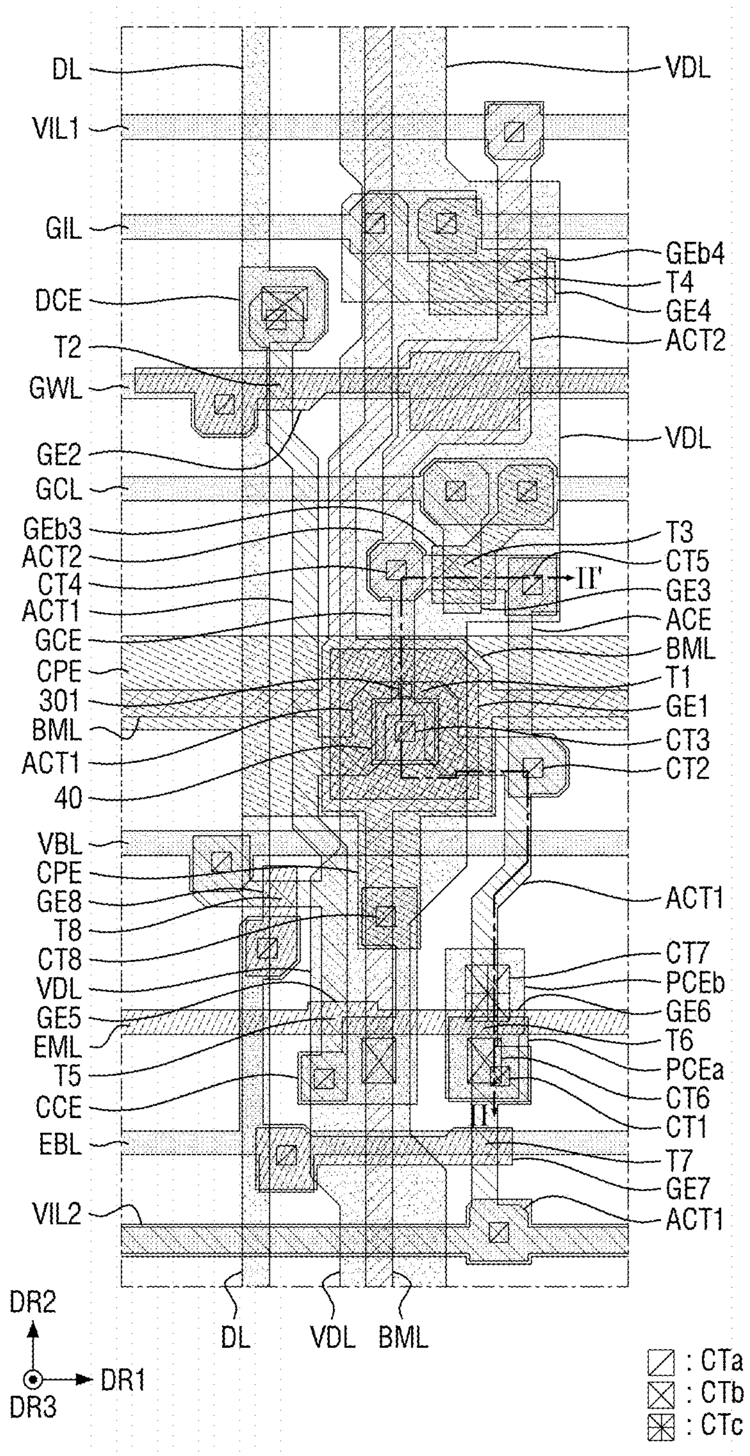
FIG. 23 is a schematic plan view of a unit pixel array according to one embodiment.
Figure 24:
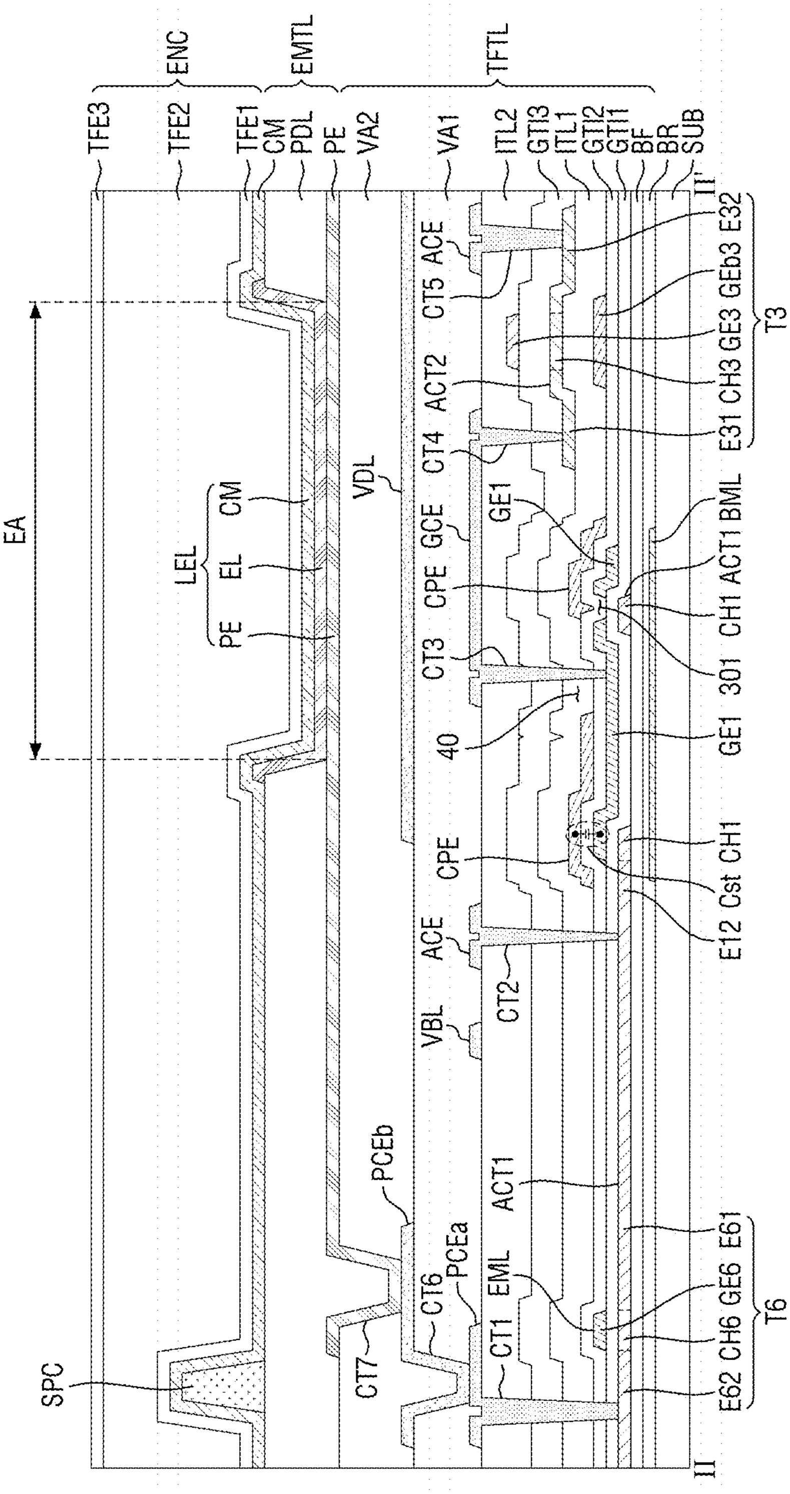
FIG. 24 is a schematic cross-sectional view taken along line II-II' of FIG. 23.

FIG. 23 is a schematic plan view of a unit pixel array according to one embodiment. FIG. 24 is a schematic cross-sectional view taken along line II-II' of FIG. 23.

The display device according to the embodiment of FIG. 24 differs from that of the aforementioned embodiment in that the first exhaust hole 301 is disposed to overlap the first active layer ACT1, and thus the description will focus on this difference.

As shown in FIGS. 23 and 24, the first exhaust hole 301 of the first gate electrode GE1 may overlap the first active layer ACT1. For example, in the schematic cross-sectional view shown in FIG. 24, the first exhaust hole 301 may be disposed between the first active layer ACT1 and the capacitor electrode CPE. By way of example, as shown in FIG. 24, the first exhaust hole 301 may be disposed between the first channel region CH1 of the first active layer ACT1 and the capacitor electrode CPE. Additionally, the first exhaust hole 301 may overlap the gate connection electrode GCE.

Figure 25:
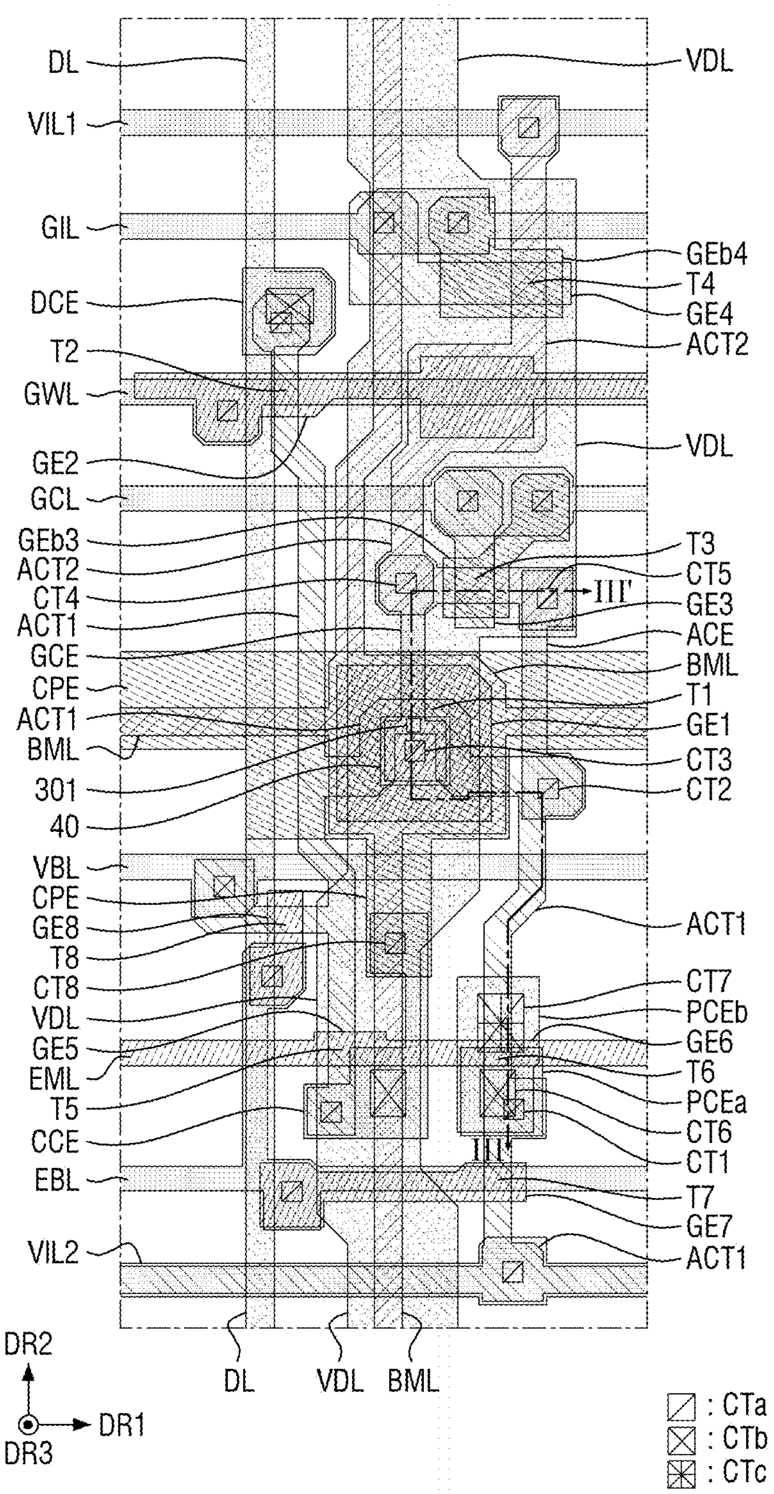
FIG. 25 is a schematic plan view of a unit pixel array according to one embodiment.
Figure 26:
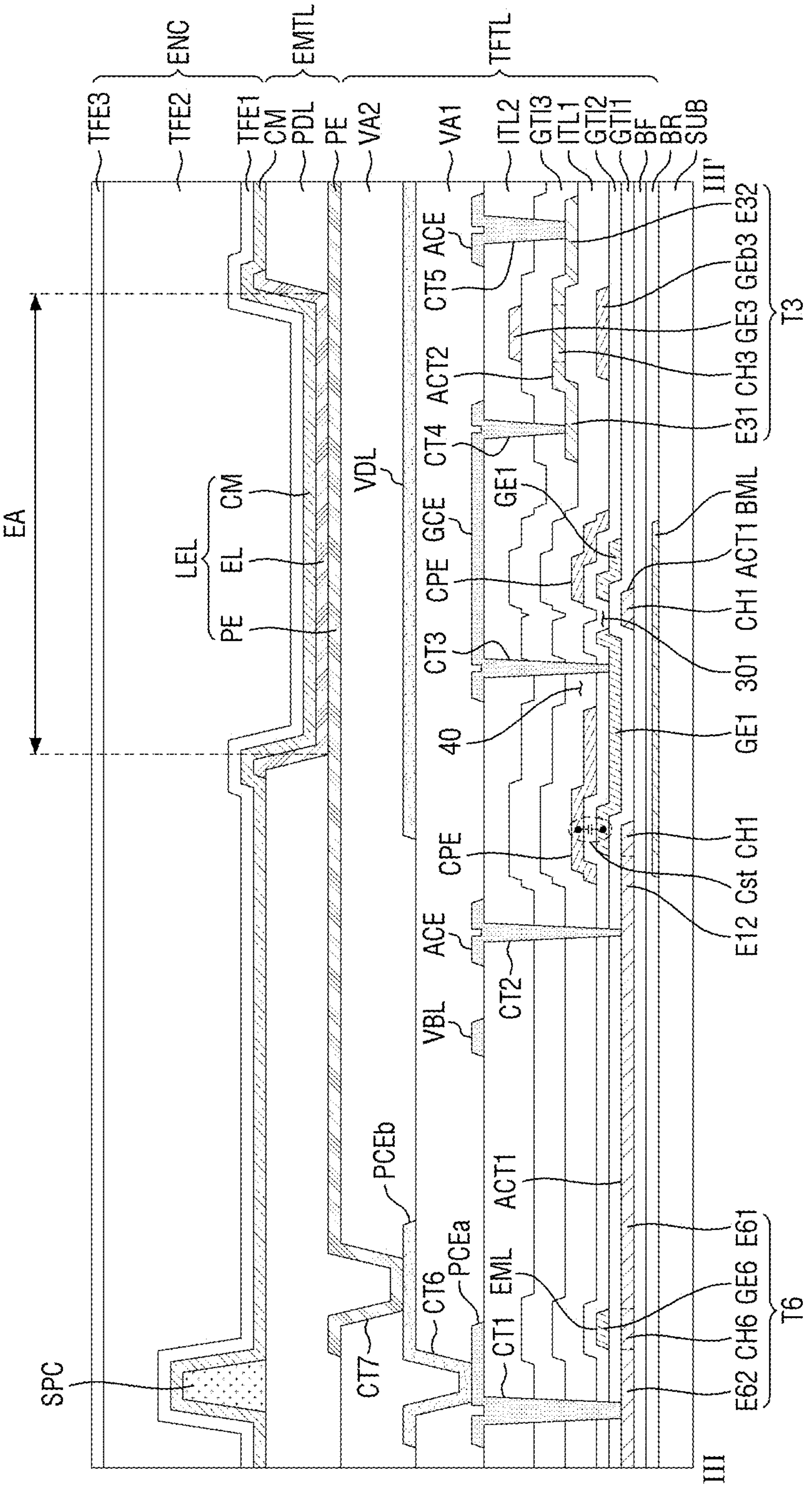
FIG. 26 is a schematic cross-sectional view taken along line III-III' of FIG. 25.

FIG. 25 is a schematic plan view of a unit pixel array according to one embodiment. FIG. 26 is a schematic cross-sectional view taken along line III-III' of FIG. 25.

The display device according to the embodiment of FIG. 25 differs from that of the above-described embodiment in that the first exhaust hole 301 is disposed to overlap the first active layer ACT1 and the hole 40 of the capacitor electrode CPE, and thus the description will focus on this difference.

As shown in FIGS. 25 and 26, the first exhaust hole 301 of the first gate electrode GE1 may overlap the first active layer ACT1 and the hole 40 of the capacitor electrode CPE. For example, in the schematic cross-sectional view shown in FIG. 24, the exhaust hole 301 may be disposed between the first active layer ACT1 and the hole 40 of the capacitor electrode CPE. By way of example, as shown in FIG. 26, the first exhaust hole 301 may be disposed between the first channel region CH1 of the first active layer ACT1 and the hole 40 of the capacitor electrode CPE.

Figure 27:
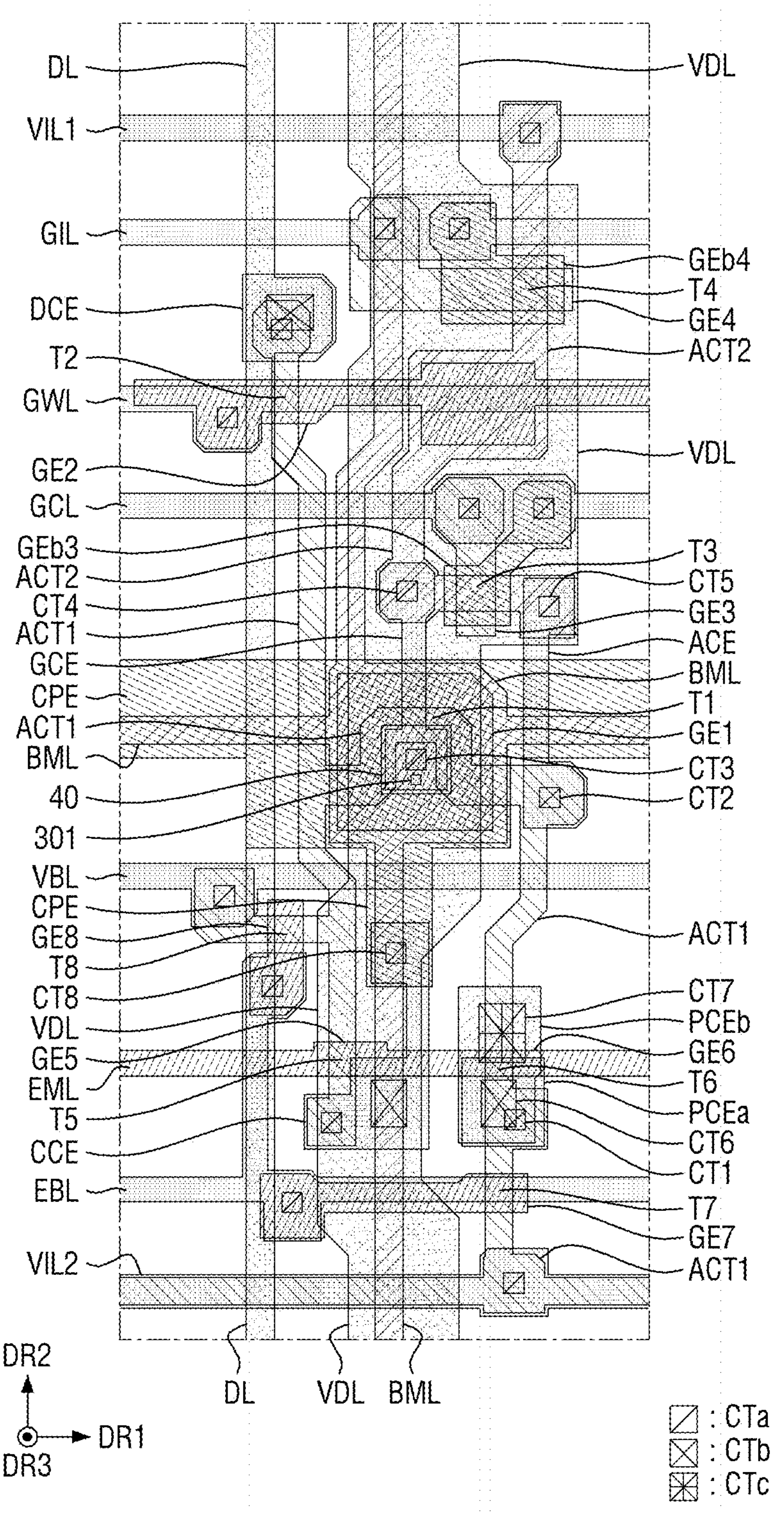
FIG. 27 is a schematic plan view of a unit pixel array according to one embodiment.

FIG. 27 is a schematic plan view of a unit pixel array according to one embodiment.

The display device according to the embodiment of FIG. 27 differs from that of the above-described embodiment in that the first exhaust hole 301 is disposed to overlap the hole 40 of the capacitor electrode without overlapping the first active layer ACT1, and thus the description will focus on this difference.

As shown in FIG. 27, the first exhaust hole 301 of the first gate electrode GE1 may overlap the hole 40 of the capacitor electrode CPE, but may not overlap the first active layer ACT1.

Figure 28:
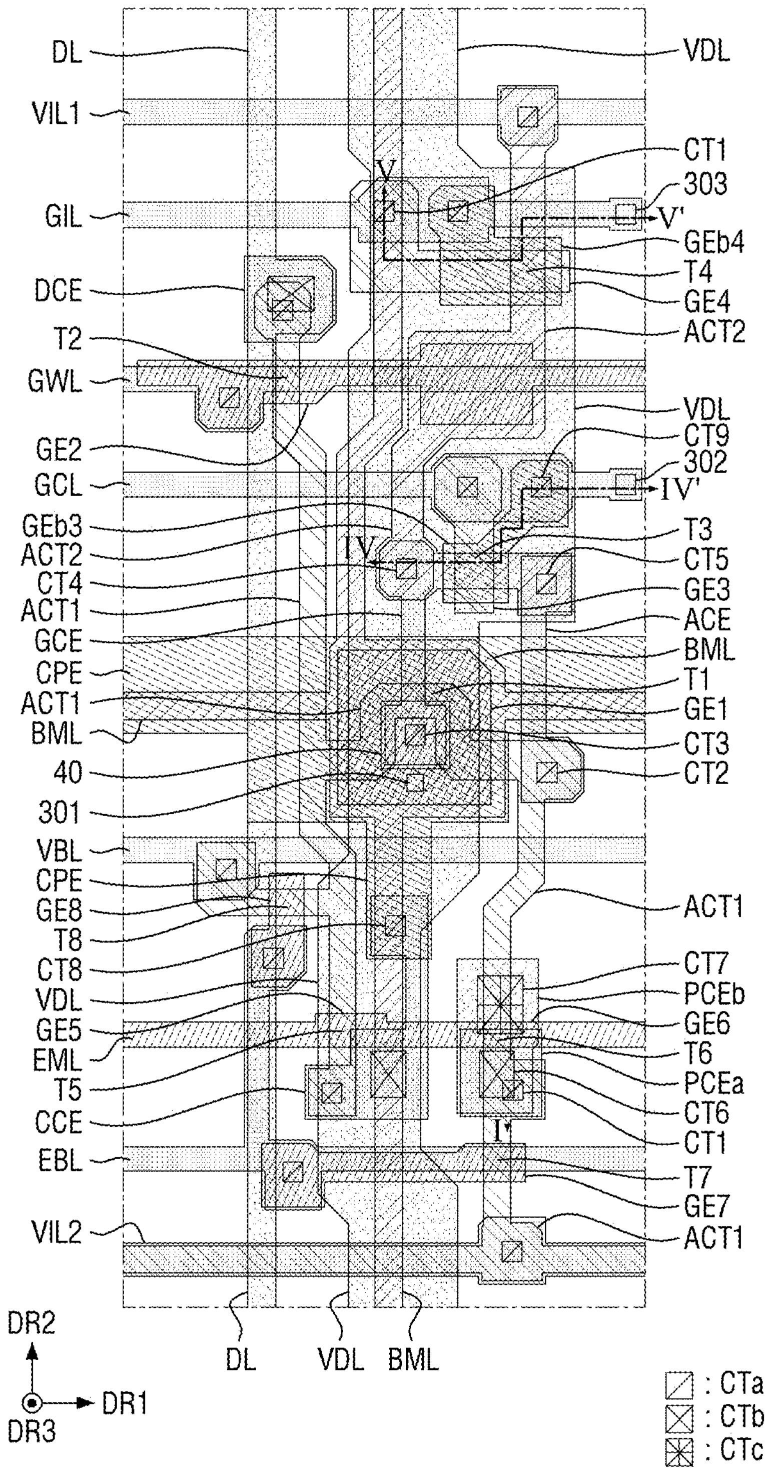
FIG. 28 is a schematic plan view of a unit pixel array according to one embodiment.
Figure 29:
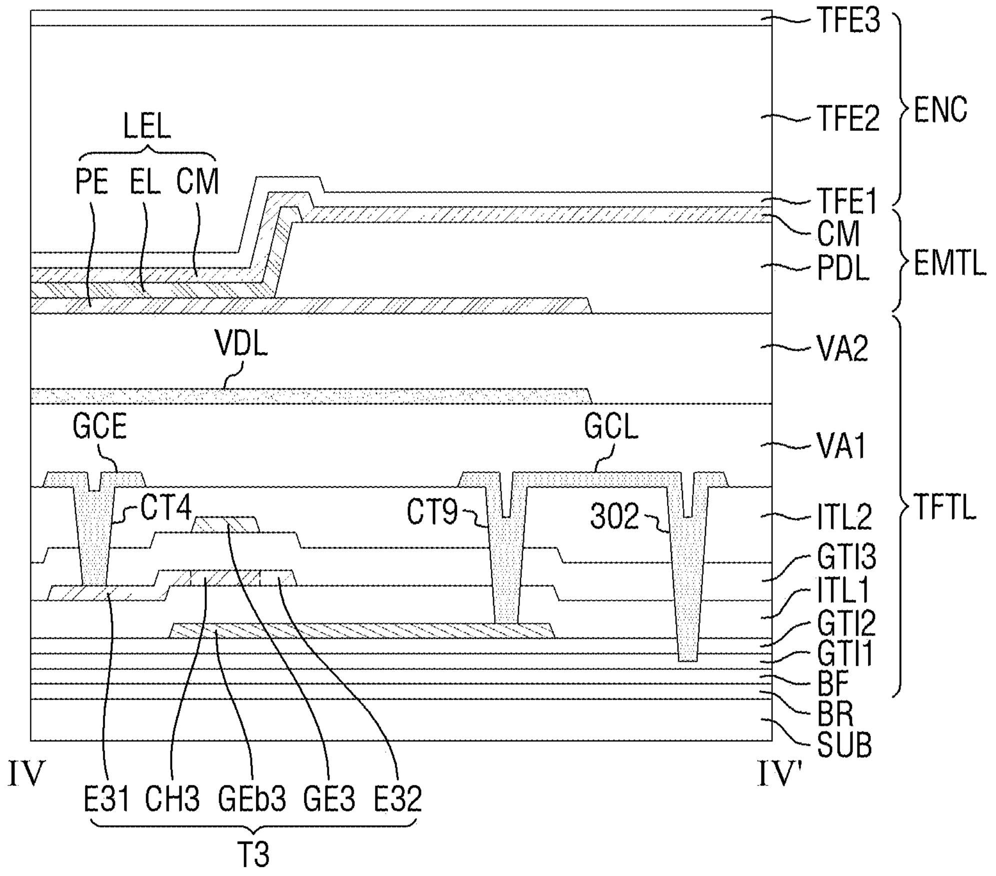
FIG. 29 is a schematic cross-sectional view taken along line IV-IV' of FIG. 28.
Figure 30:
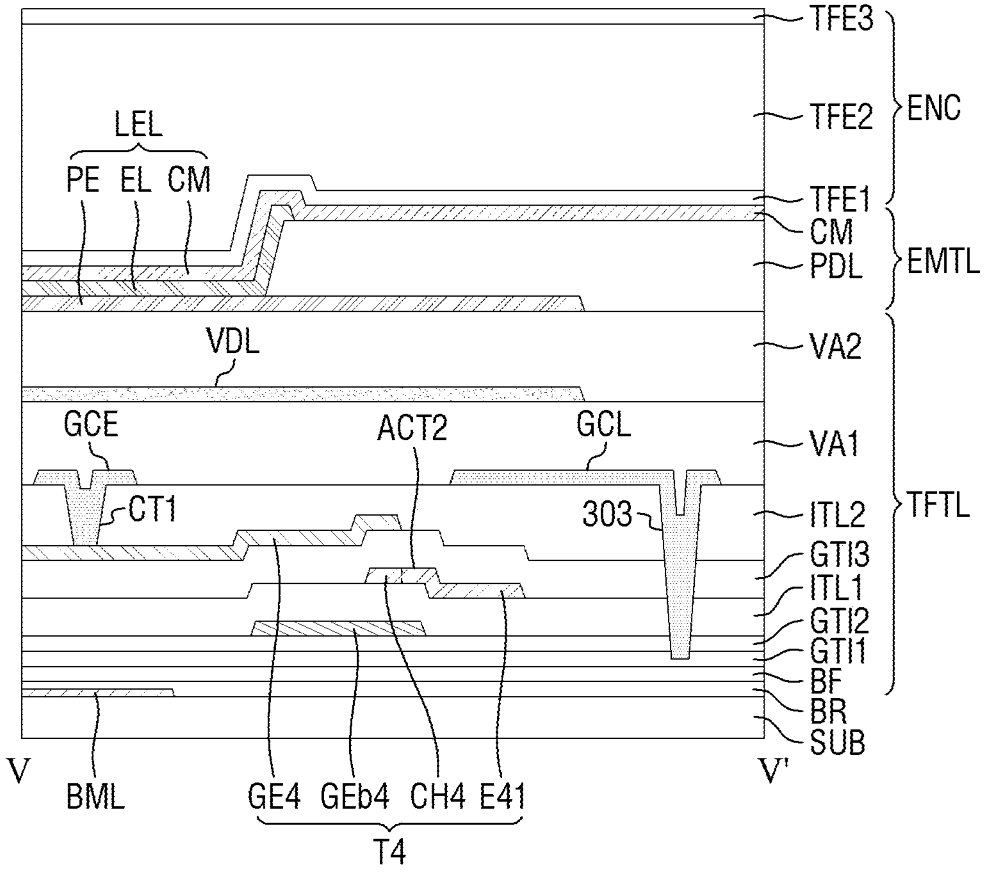
FIG. 30 is a schematic cross-sectional view taken along line V-V' of FIG. 28.

FIG. 28 is a schematic plan view of a unit pixel array according to one embodiment. FIG. 29 is a schematic cross-sectional view taken along line IV-IV' of FIG. 28. FIG. 30 is a schematic cross-sectional view taken along line V-V' of FIG. 28.

The display device according to the embodiment of FIG. 28 differs from that of the above-described embodiment in that it further may include a second exhaust hole 302 and a third exhaust hole 303, and thus the description will focus on this difference.

As shown in FIGS. 28 and 29, the second exhaust hole 302 may be disposed near the third transistor T3. For example, the second exhaust hole 302 may be disposed adjacent to the third counter gate electrode GEb3 of the third transistor T3. By way of example, the second exhaust hole 302 may be disposed adjacent to the ninth contact hole CT9 that connects the third counter gate electrode GEb3 of the third transistor T3 to the second gate line GCL. Accordingly, the second exhaust hole 302 may be disposed near the second active layer ACT2. In one example, the second exhaust hole 302 may be disposed within about 10 μm with respect to the periphery of the second active layer ACT2 that overlaps the third gate electrode GE3 or the third counter gate electrode GEb3 of the third transistor T3.

As shown in FIG. 29, the second exhaust hole 302 may penetrate the second interlayer insulating layer ITL2, the third gate insulating layer GTI3, the first interlayer insulating layer ITL1, and the second gate insulating layer GTI2. The second exhaust hole 302 may include a groove formed in a part of the first gate insulating layer GTI1. In other words, a groove may be formed in a part of the first gate insulating layer GTI1 by the second exhaust hole 302.

The seventh pattern layer 777 may be disposed in the second exhaust hole 302. For example, as shown in FIG. 29, a part of the second gate line GCL may be filled in the second exhaust hole 302.

The second exhaust hole 302 may provide a pathway for discharging hydrogen from the second active layer ACT2 and the vicinity of the second active layer ACT2 to the outside. In other words, hydrogen in the second active layer ACT2 and the vicinity of the second active layer ACT2 may be discharged to the outside through the second exhaust hole 302. Accordingly, the quality of the third transistor T3 may be improved. For example, the dispersion of the threshold voltage of the third transistor T3 may be minimized, and the driving range of the third transistor T3 may be improved.

As shown in FIGS. 28 and 30, the third exhaust hole 303 may be disposed near the fourth transistor T4. For example, the third exhaust hole 303 may be disposed near the second active layer ACT2 of the fourth transistor T4. In one example, the third exhaust hole 303 may be disposed within about 10 μm with respect to the periphery of the second active layer ACT2 that overlaps the fourth gate electrode GE4 or the fourth counter gate electrode GEb4 of the fourth transistor T4.

As shown in FIG. 30, the third exhaust hole 303 may penetrate the second interlayer insulating layer ITL2, the third gate insulating layer GTI3, the first interlayer insulating layer ITL1, and the second gate insulating layer GTI2. The third exhaust hole 303 may include a groove formed in a part of the first gate insulating layer GTI1. In other words, a groove may be formed in a part of the first gate insulating layer GTI1 by the third exhaust hole 303.

The seventh pattern layer 777 may be disposed in the third exhaust hole 303. For example, as shown in FIG. 30, a part of the third gate line GIL may be filled in the third exhaust hole 303.

The third exhaust hole 303 may provide a pathway for discharging hydrogen in the second active layer ACT2 and the vicinity of the second active layer ACT2 to the outside. In other words, hydrogen in the second active layer ACT2 and the vicinity of the second active layer ACT2 may be discharged to the outside through the second exhaust hole 303. Accordingly, the quality of the fourth transistor T4 may be improved. For example, the dispersion of the threshold voltage of the fourth transistor T4 may be minimized, and the driving range of the fourth transistor T4 may be improved.

Figure 31:
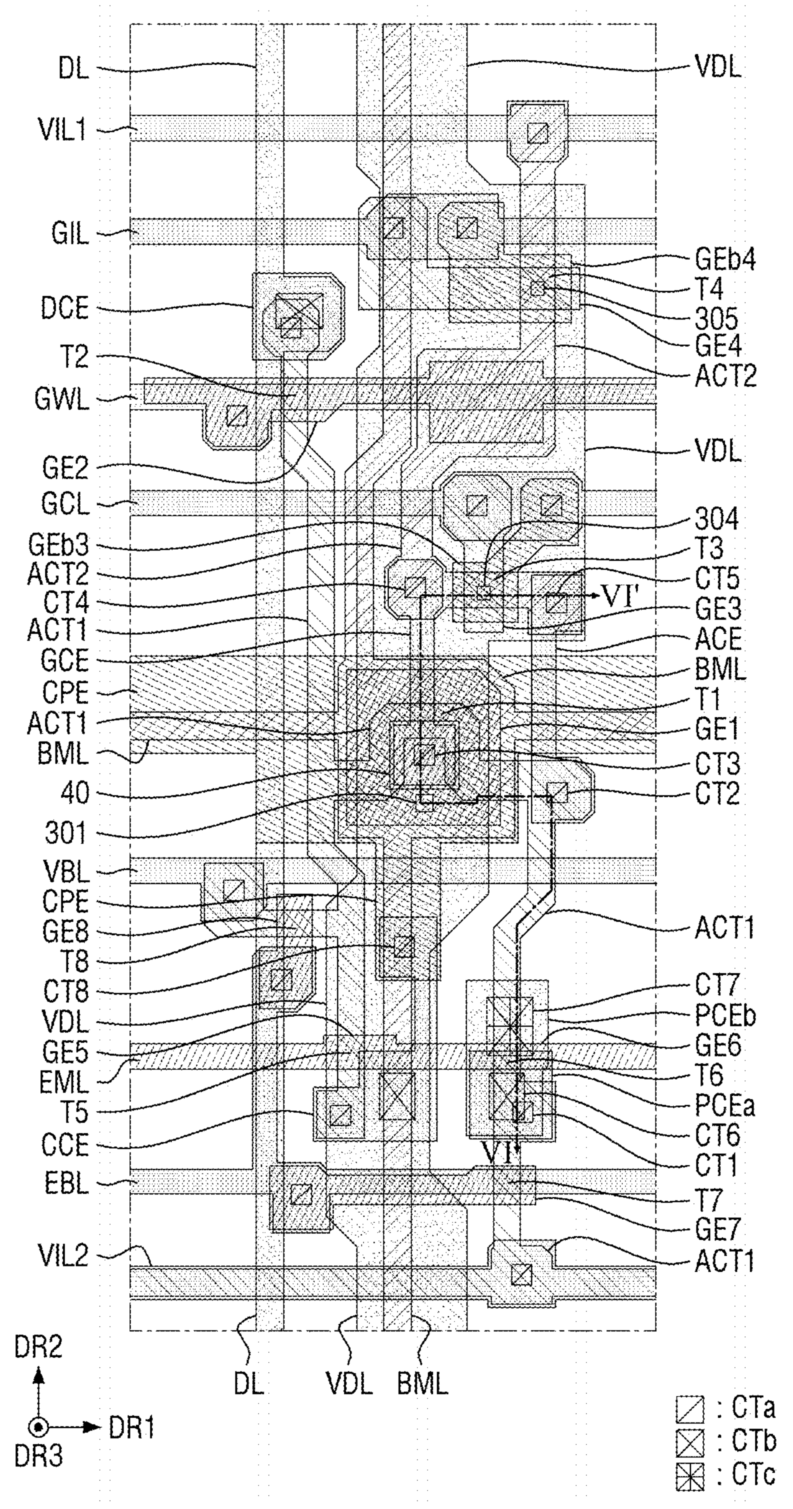
FIG. 31 is a schematic plan view of a unit pixel array according to one embodiment.
Figure 32:
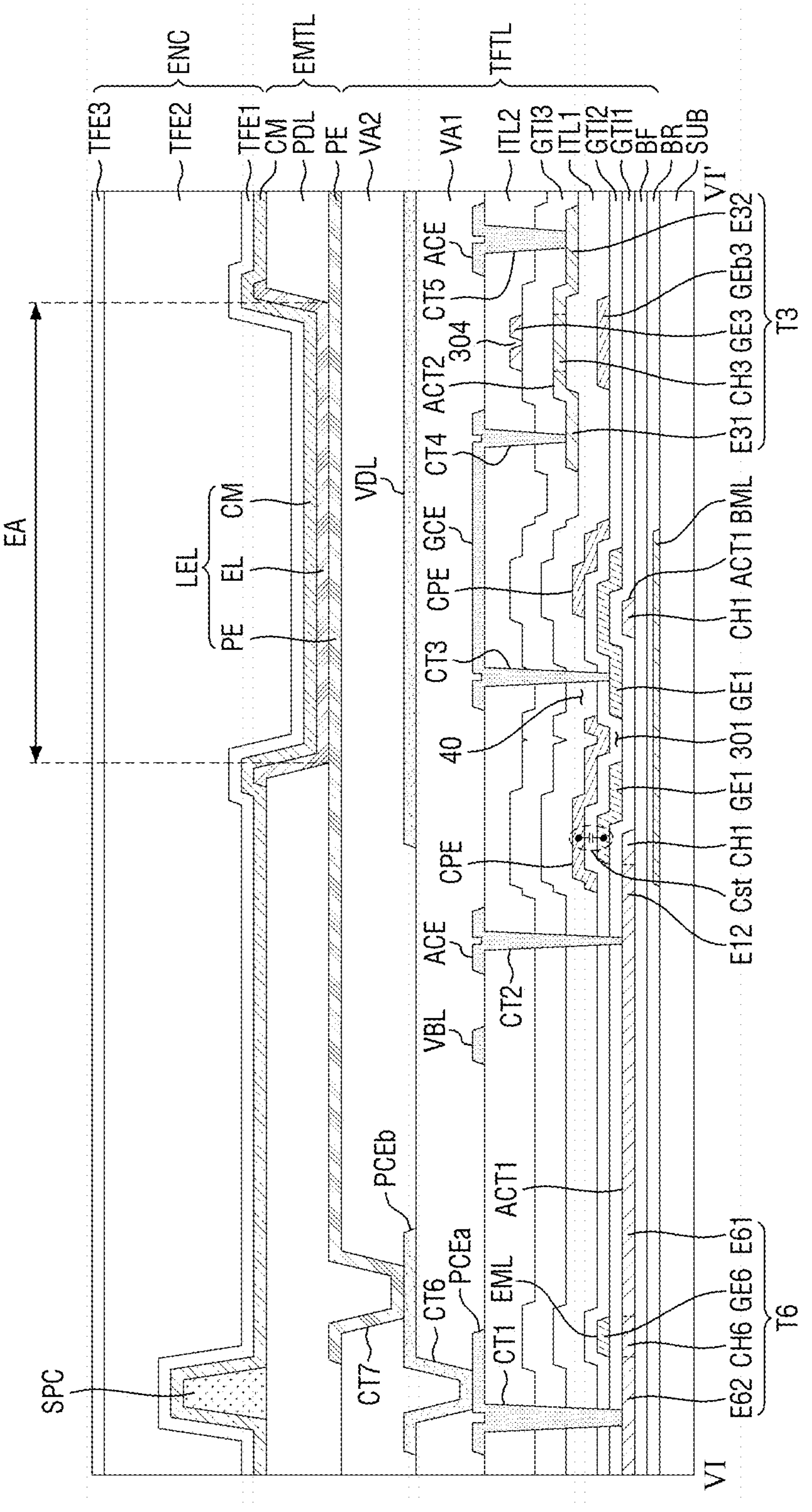
FIG. 32 is a schematic cross-sectional view taken along line VI-VI' of FIG. 31.

FIG. 31 is a schematic plan view of a unit pixel array according to one embodiment. FIG. 32 is a schematic cross-sectional view taken along line VI-VI' of FIG. 31.

The display device according to the embodiment of FIG. 31 differs from that of the above-described embodiment in that it may further include a fourth exhaust hole 304 and a fifth exhaust hole 305, and thus the description will focus on this difference.

The fourth exhaust hole 304 may penetrate the third gate electrode GE3 of the third transistor T3. In other words, the third gate electrode GE3 may have the fourth exhaust hole 304. The fourth exhaust hole 304 may overlap the second active layer ACT2 of the third transistor T3. The fourth exhaust hole 304 may overlap the third channel region CH3 of the second active layer ACT2.

The fourth exhaust hole 304 may provide a pathway for discharging hydrogen in the second active layer ACT2 and the vicinity of the second active layer ACT2 to the outside. In other words, hydrogen in the second active layer ACT2 and the vicinity of the second active layer ACT2 may be discharged to the outside through the fourth exhaust hole 304. Accordingly, the quality of the third transistor T3 may be improved.

The fifth exhaust hole 305 may penetrate the fourth gate electrode GE4 of the fourth transistor T4. In other words, the fourth gate electrode GE4 may have the fifth exhaust hole 305. The fifth exhaust hole 305 may overlap the second active layer ACT2 of the fourth transistor T4. The fifth exhaust hole 305 may overlap the fourth channel region CH4 of the second active layer ACT2.

The fifth exhaust hole 305 may provide a pathway for discharging hydrogen in the second active layer ACT2 and the vicinity of the second active layer ACT2 to the outside. In other words, hydrogen in the second active layer ACT2 and the vicinity of the second active layer ACT2 may be discharged to the outside through the fifth exhaust hole 305. Accordingly, the quality of the fourth transistor T4 may be improved.

On the other hand, the above-described light emitting element LEL may have a tandem structure, which will be described with reference to FIGS. 33 to 40 as follows.

Figure 33:
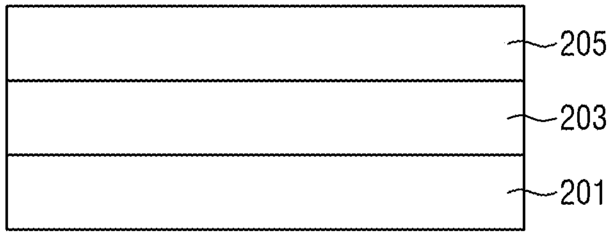
FIG. 33 is a schematic cross-sectional view illustrating a structure of a display element according to one embodiment.

FIG. 33 is a schematic cross-sectional view illustrating a structure of a display element according to one embodiment, and FIGS. 34 to 37 are schematic cross-sectional views illustrating a structure of a light emitting element according to one embodiment.

Referring to FIG. 33, a light emitting element (for example, an organic light emitting diode) according to one embodiment may include a pixel electrode 201, a common electrode 205, and an intermediate layer 203 between the pixel electrode 201 and the common electrode 205 described above.

The pixel electrode 201 may include a light-transmitting conductive oxide such as indium tin oxide (ITO), indium zinc oxide (IZO), zinc oxide (ZnO), indium oxide ($In_2O_3$), indium gallium oxide (IGO), or aluminum zinc oxide (AZO). The pixel electrode 201 may include a reflective layer containing silver (Ag), magnesium (Mg), aluminum (Al), platinum (Pt), palladium (Pd), gold (Au), nickel (Ni), neodymium (Nd), iridium (Ir), chromium (Cr) or a compound thereof. For example, the pixel electrode 201 may have a three-layer structure of ITO/Ag/ITO.

The common electrode 205 may be disposed on the intermediate layer 203. The common electrode 205 may include a low work function metal, an alloy, an electrically conductive compound, or any combination thereof. For example, the common electrode 205 may include lithium (Li), silver (Ag), magnesium (Mg), aluminum (Al), aluminum-lithium (Al—Li), calcium (Ca), magnesium-indium (Mg—In), magnesium-silver (Mg—Ag), ytterbium (Yb), silver-ytterbium (Ag—Yb), ITO, IZO, or any combination thereof. The common electrode 205 may be a transmissive electrode, a semi-transmissive electrode, or a reflective electrode.

The intermediate layer 203 may include a high molecular material or a low molecular material that emits light of a selectable color. In addition to various organic materials, the intermediate layer 203 may further include metal-containing compounds such as organometallic compounds, inorganic materials such as quantum dots, and the like within the spirit and the scope of the disclosure.

In one embodiment, the intermediate layer 203 may include one light emitting layer and a first functional layer and a second functional layer respectively disposed below and above the one light emitting layer. The first functional layer may include, for example, a hole transport layer HTL or may include the hole transport layer and a hole injection layer HIL. The second functional layer is a component disposed on the light emitting layer and is optional. For example, the intermediate layer 203 may include or may not include the second functional layer. The second functional layer may include an electron transport layer ETL and/or an electron injection layer EIL.

In one embodiment, the intermediate layer 203 may include two or more emitting units that may be sequentially stacked each other between the pixel electrode 201 and the common electrode 205, and a charge generation layer CGL disposed between the two emitting units. In case that the intermediate layer 203 may include an emitting unit and a charge generation layer, a light emitting element (for example, an organic light emitting diode) may be a tandem light emitting element. A light emitting element (for example, an organic light emitting diode) may improve color purity and luminous efficiency by having a stacked structure of emitting units.

One emitting unit may include a light emitting layer and a first functional layer and a second functional layer respectively disposed below and above the light emitting layer. The charge generation layer CGL may include a negative charge generation layer and a positive charge generation layer. The luminous efficiency of an organic light emitting diode, which is a tandem light emitting element having light emitting layers, may be further increased by the negative charge generation layer and the positive charge generation layer.

The negative charge generation layer may be an n-type charge generation layer. The negative charge generation layer may supply electrons. The negative charge generation layer may include a host and a dopant. The host may include an organic material. The dopant may include a metal material. The positive charge generation layer may be a p-type charge generation layer. The positive charge generation layer may supply holes. The positive charge generation layer may include a host and a dopant. The host may include an organic material. The dopant may include a metal material.

Figure 34:
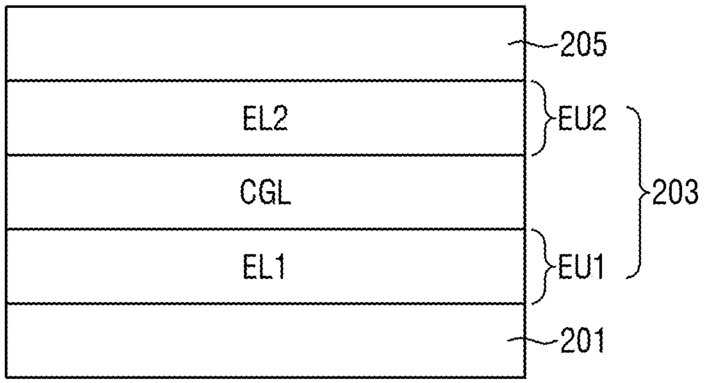
FIGS. 34 to 37 are schematic cross-sectional views illustrating a structure of a light emitting element according to one embodiment.

In one embodiment, as illustrated in FIG. 34, a light emitting element (for example, an organic light emitting diode) may include a first emitting unit (or part) EU1 including a first light emitting layer EL1 and a second emitting unit (or part) EU2 including a second light emitting layer EL2 that may be sequentially stacked each other. The charge generation layer CGL may be disposed between the first emitting unit EU1 and the second emitting unit EU2. For example, a light emitting element (for example, an organic light emitting diode) may include the pixel electrode 201, the first light emitting layer EL1, the charge generation layer CGL, the second light emitting layer EL2, and the common electrode 205 that may be sequentially stacked each other. The first functional layer and the second functional layer may be disposed on and under (or below) the first light emitting layer EL1, respectively. The first functional layer and the second functional layer may be included below and above the second light emitting layer EL2, respectively. The first light emitting layer EL1 may be a blue light emitting layer, and the second light emitting layer EL2 may be a yellow light emitting layer.

Figure 35:
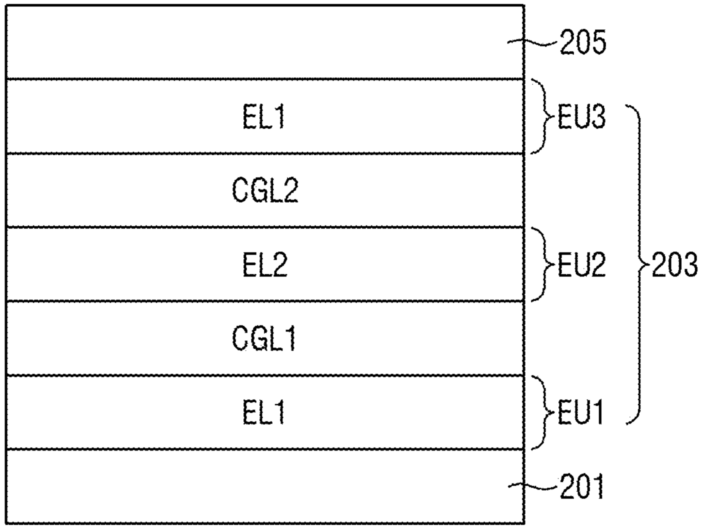

In one embodiment, as illustrated in FIG. 35, a light emitting element (for example, an organic light emitting diode) may include the first emitting unit EU1 and the third emitting unit (or part) EU3 including the first light emitting layer EL1, and the second emitting unit EU2 including the second light emitting layer EL2. The first charge generation layer CGL1 may be disposed between the first emitting unit EU1 and the second emitting unit EU2, and the second charge generation layer CGL2 may be disposed between the second emitting unit EU2 and the third emitting unit EU3. For example, a light emitting element (for example, an organic light emitting diode) may include the pixel electrode 201, the first light emitting layer EL1, the first charge generation layer CGL1, the second light emitting layer EL2, the second charge generation layer CGL2, the first light emitting layer EL1, and the common electrode 205 that may be sequentially stacked each other. The first functional layer and the second functional layer may be disposed on and under the first light emitting layer EL1, respectively. The first functional layer and the second functional layer may be disposed on and below the second light emitting layer EL2, respectively. The first light emitting layer EL1 may be a blue light emitting layer, and the second light emitting layer EL2 may be a yellow light emitting layer.

In one embodiment, in a light emitting element (for example, an organic light emitting diode), the second emitting unit EU2 may further include a third light emitting layer EL3 and/or a fourth light emitting layer EL4 directly in contact with the second light emitting layer EL2 below and/or above the second light emitting layer EL2, in addition to the second light emitting layer EL2. Here, direct contact may mean that no other layer is disposed between the second light emitting layer EL2 and the third light emitting layer EL3 and/or between the second light emitting layer EL2 and the fourth light emitting layer EL4. The third light emitting layer EL3 may be a red light emitting layer, and the fourth light emitting layer EL4 may be a green light emitting layer.

Figure 36:
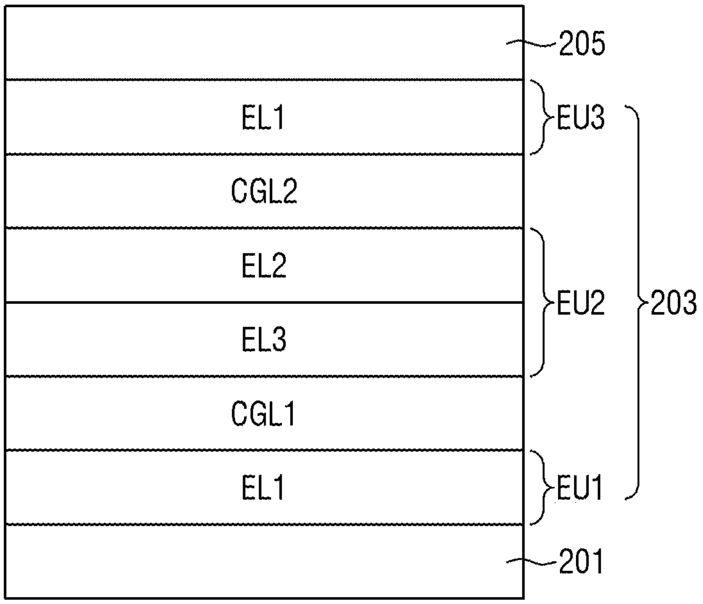

For example, as illustrated in FIG. 36, a light emitting element (for example, an organic light emitting diode) may include the pixel electrode 201, the first light emitting layer EL1, the first charge generation layer CGL1, the third light emitting layer EL3, the second light emitting layer EL2, the second charge generation layer CGL2, the first light emitting layer EL1, and the common electrode 205 that may be sequentially stacked each other. By way of example, as illustrated in FIG. 37, a light emitting element (for example, an organic light emitting diode) may include the pixel electrode 201, the first light emitting layer EL1, the first charge generation layer CGL1, the third light emitting layer EL3, the second light emitting layer EL2, the fourth light emitting layer EL4, the second charge generation layer CGL2, the first light emitting layer EL1, and the common electrode 205 that may be sequentially stacked each other.

Figure 37:
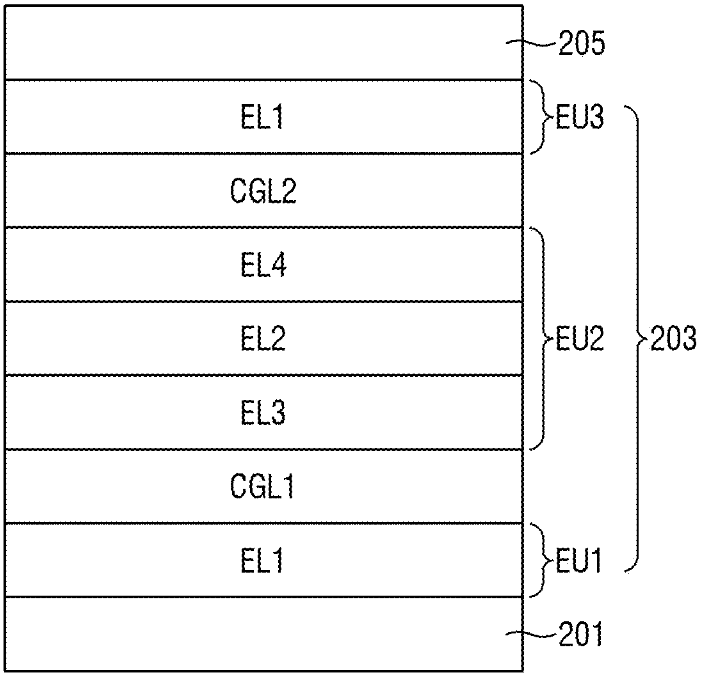
Figure 38:
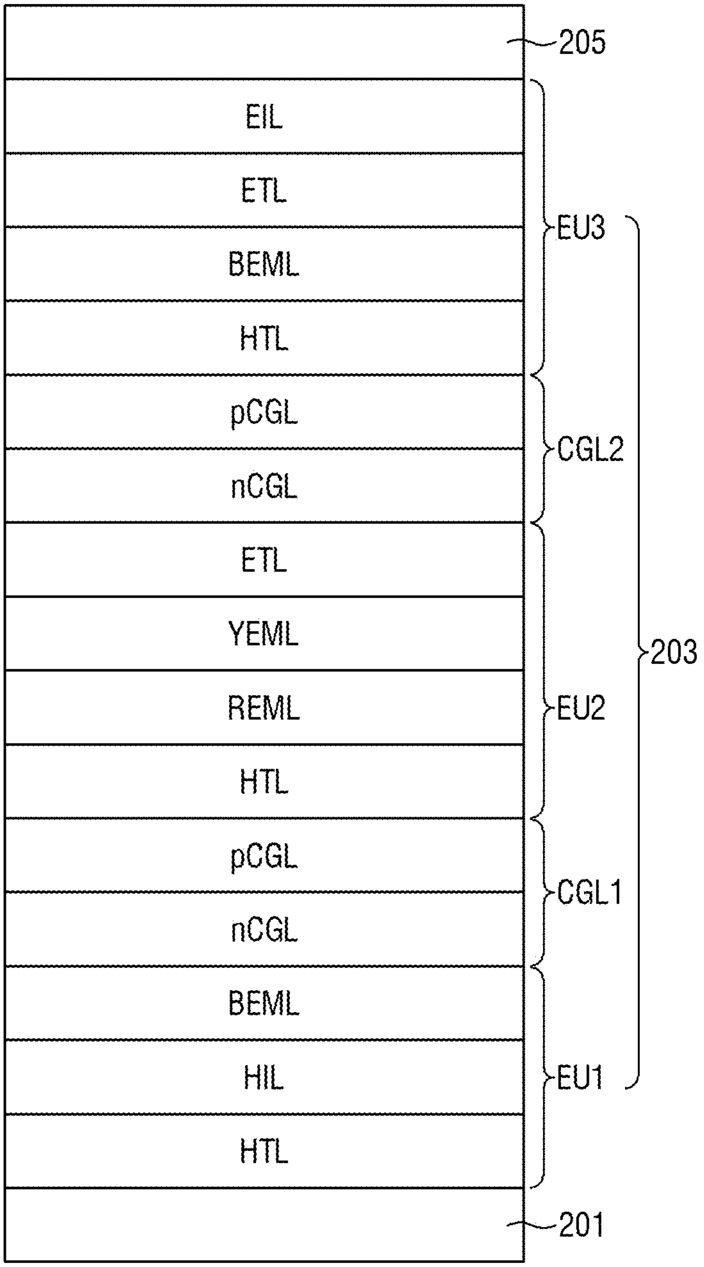
FIG. 38 is a schematic cross-sectional view illustrating an example of the organic light emitting diode of FIG. 36.
Figure 39:
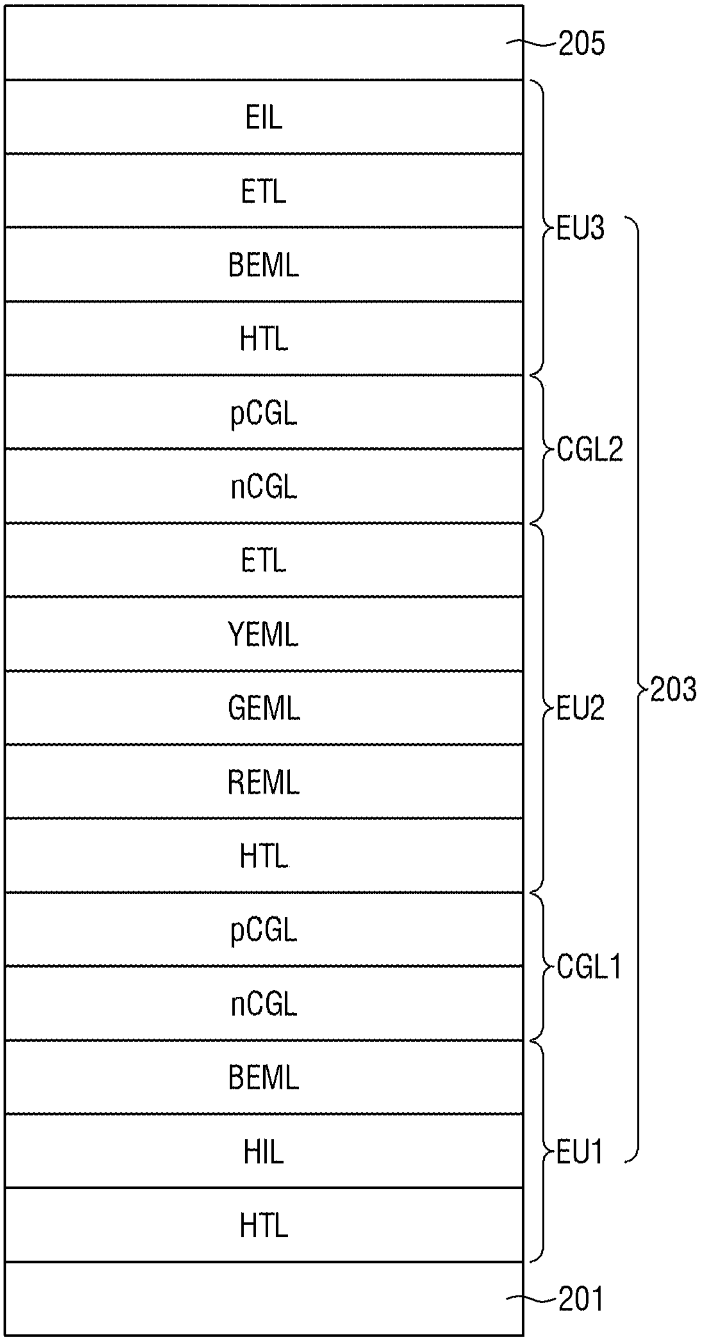
FIG. 39 is a schematic cross-sectional view illustrating an example of the organic light emitting diode of FIG. 37.

FIG. 38 is a schematic cross-sectional view illustrating an example of the organic light emitting diode of FIG. 36, and FIG. 39 is a schematic cross-sectional view illustrating an example of the organic light emitting diode of FIG. 37.

Referring to FIG. 38, a light emitting element (for example, an organic light emitting diode) may include the first emitting unit EU1, the second emitting unit EU2, and the third emitting unit EU3 that may be sequentially stacked each other. The first charge generation layer CGL1 may be disposed between the first emitting unit EU1 and the second emitting unit EU2, and the second charge generation layer CGL2 may be disposed between the second emitting unit EU2 and the third emitting unit EU3. The first charge generation layer CGL1 and the second charge generation layer CGL2 may include a negative charge generation layer nCGL and a positive charge generation layer pCGL, respectively.

The first emitting unit EU1 may include a blue light emitting layer BEML. The first emitting unit EU1 may further include the hole injection layer HIL and the hole transport layer HTL between the pixel electrode 201 and the blue light emitting layer BEML. In one embodiment, a p-doped layer may be further included between the hole injection layer HIL and the hole transport layer HTL. The P-doped layer may be formed by doping the hole injection layer HIL with a p-type doping material. In one embodiment, at least one of a blue light auxiliary layer, an electron blocking layer, or a buffer layer may be further included between the blue light emitting layer BEML and the hole transport layer HTL. The blue light auxiliary layer may increase light emission efficiency of the blue light emitting layer BEML. The blue light auxiliary layer may increase light emission efficiency of the blue light emitting layer BEML by adjusting hole charge balance. The electron blocking layer may prevent electron injection into the hole transport layer HTL. The buffer layer may compensate for a resonance distance according to a wavelength of light emitted from the light emitting layer.

The second emitting unit EU2 may include a yellow light emitting layer YEML and a red light emitting layer REML in direct contact with the yellow light emitting layer YEML below the yellow light emitting layer YEML. The second emitting unit EU2 may further include the hole transport layer HTL between the positive charge generation layer pCGL of the first charge generation layer CGL1 and the red light emitting layer REML, and may further include the electron transport layer ETL between the yellow light emitting layer YEML and the negative charge generation layer nCGL of the second charge generation layer CGL2.

The third emitting unit EU3 may include the blue light emitting layer BEML. The third emitting unit EU3 may further include the hole transport layer HTL between the positive charge generation layer pCGL of the second charge generation layer CGL2 and the blue light emitting layer BEML. The third emitting unit EU3 may further include the electron transport layer ETL and the electron injection layer EIL between the blue light emitting layer BEML and the common electrode 205. The electron transport layer ETL may have a single layer or a multilayer. In one embodiment, at least one of a blue light auxiliary layer, an electron blocking layer, or a buffer layer may be further included between the blue light emitting layer BEML and the hole transport layer HTL. At least one of a hole blocking layer or a buffer layer may be further included between the blue light emitting layer BEML and the electron transport layer ETL. The hole blocking layer may prevent hole injection into the electron transport layer ETL.

A light emitting element (for example, an organic light emitting diode) illustrated in FIG. 39 may be different from the light emitting element (for example, an organic light emitting diode) illustrated in FIG. 37 in the stacked structure of the second emitting unit EU2, and other configurations are the same. Referring to FIG. 39, the second emitting unit EU2 may include the yellow light emitting layer YEML, the red light emitting layer REML directly in contact with the yellow light emitting layer YEML below the yellow light emitting layer YEML, and a green light emitting layer GEML directly in contact with the yellow light emitting layer YEML above the yellow light emitting layer YEML. The second emitting unit EU2 may further include the hole transport layer HTL between the positive charge generation layer pCGL of the first charge generation layer CGL1 and the red light emitting layer REML, and may further include the electron transport layer ETL between the green light emitting layer GEML and the negative charge generation layer nCGL of the second charge generation layer CGL2.

Figure 40:
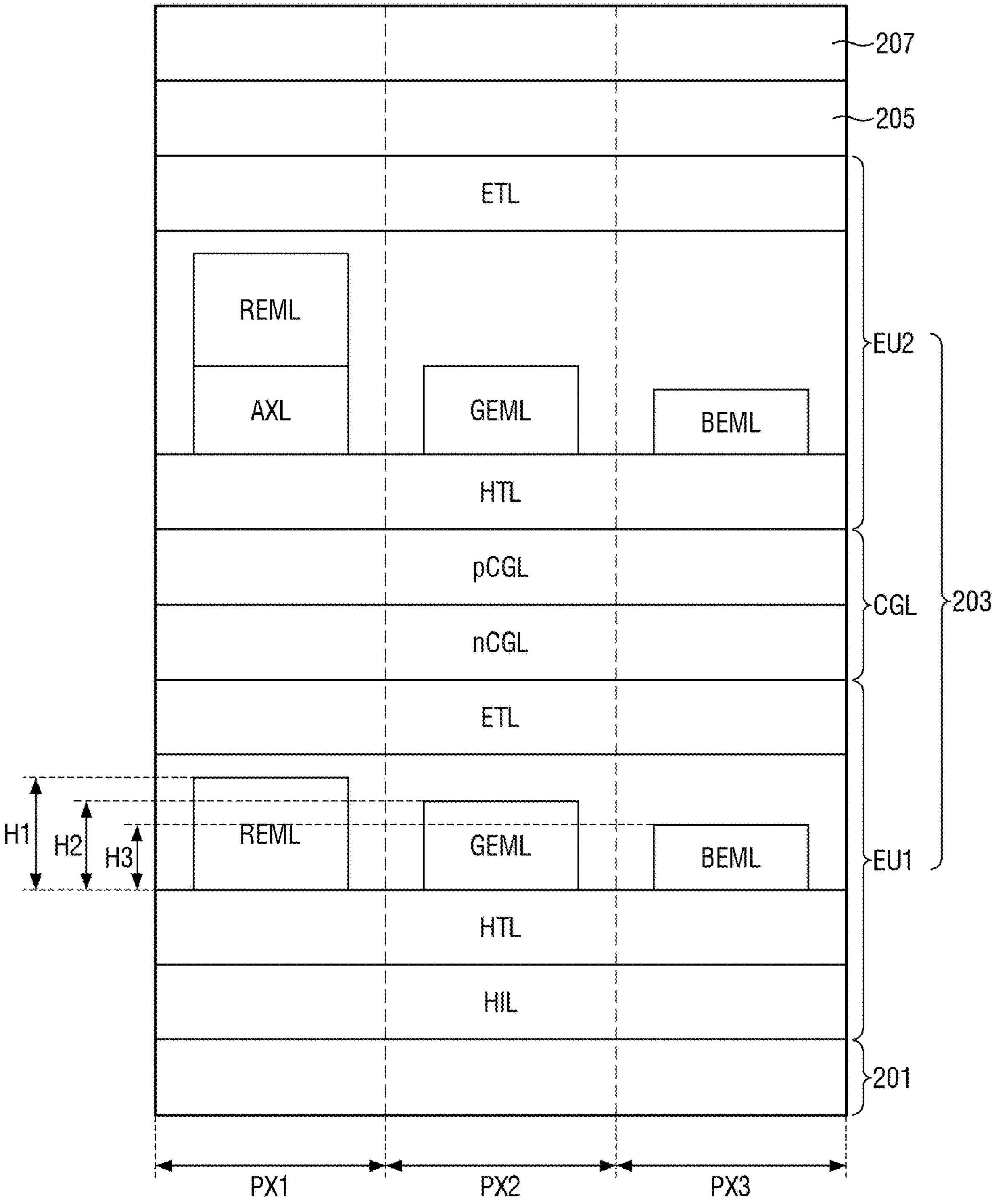
FIG. 40 is a schematic cross-sectional view illustrating a structure of a pixel of a display device according to one embodiment.

FIG. 40 is a schematic cross-sectional view illustrating a structure of a pixel of a display device according to one embodiment.

Referring to FIG. 40, the display panel 100 of the display device 10 may include pixels. The pixels may include the first pixel PX1, the second pixel PX2, and the third pixel PX3. Each of the first pixel PX1, the second pixel PX2, and the third pixel PX3 may include the pixel electrode 201, the common electrode 205, and the intermediate layer 203. In one embodiment, the first pixel PX1 may be a red pixel, the second pixel PX2 may be a green pixel, and the third pixel PX3 may be a blue pixel.

The pixel electrode 201 may be independently provided in each of the first pixel PX1, the second pixel PX2, and the third pixel PX3.

The intermediate layer 203 of each of the first pixel PX1, the second pixel PX2, and the third pixel PX3 may include the first emitting unit EU1 and the second emitting unit EU2 that may be sequentially stacked each other, and the charge generation layer CGL between the first emitting unit EU1 and the second emitting unit EU2. The charge generation layer CGL may include the negative charge generation layer nCGL and the positive charge generation layer pCGL. The charge generation layer CGL may be a common layer continuously formed in the first pixel PX1, the second pixel PX2, and the third pixel PX3.

The first emitting unit EU1 of the first pixel PX1 may include the hole injection layer HIL, the hole transport layer HTL, the red light emitting layer REML, and the electron transport layer ETL that may be sequentially stacked each other on the pixel electrode 201. The first emitting unit EU1 of the second pixel PX2 may include the hole injection layer HIL, the hole transport layer HTL, the green light emitting layer GEML, and the electron transport layer ETL that may be sequentially stacked each other on the pixel electrode 201. The first emitting unit EU1 of the third pixel PX3 may include the hole injection layer HIL, the hole transport layer HTL, the blue light emitting layer BEML, and the electron transport layer ETL that may be sequentially stacked each other on the pixel electrode 201. Each of the hole injection layer HIL, the hole transport layer HTL, and the electron transport layer ETL of the first emitting unit EU1 may be a common layer continuously formed in the first pixel PX1, the second pixel PX2, and the third pixel PX3.

The second emitting unit EU2 of the first pixel PX1 may include the hole transport layer HTL, an auxiliary layer AXL, the red light emitting layer REML, and the electron transport layer ETL that may be sequentially stacked each other on the charge generation layer CGL. The second emitting unit EU2 of the second pixel PX2 may include the hole transport layer HTL, the green light emitting layer GEML, and the electron transport layer ETL that may be sequentially stacked each other on the charge generation layer CGL. The second emitting unit EU2 of the third pixel PX3 may include the hole transport layer HTL, the blue light emitting layer BEML, and the electron transport layer ETL that may be sequentially stacked each other on the charge generation layer CGL. Each of the hole transport layer HTL and the electron transport layer ETL of the second emitting unit EU2 may be a common layer continuously formed in the first pixel PX1, the second pixel PX2, and the third pixel PX3. In one embodiment, at least one of a hole blocking layer or a buffer layer may be further included between the light emitting layer and the electron transport layer ETL in the second emitting unit EU2 of the first pixel PX1, the second pixel PX2, and the third pixel PX3.

A thickness H1 of the red light emitting layer REML, a thickness H2 of the green light emitting layer GEML, and a thickness H3 of the blue light emitting layer BEML may be determined according to the resonance distance. The auxiliary layer AXL may be a layer added to adjust the resonance distance, and may include a resonance auxiliary material. For example, the auxiliary layer AXL may include the same material as the hole transport layer HTL.

In FIG. 40, the auxiliary layer AXL may be disposed only in the first pixel PX1, but the embodiment is not limited thereto. For example, the auxiliary layer AXL may be disposed in at least one of the first pixel PX1, the second pixel PX2, or the third pixel PX3 to adjust the resonance distance of each of the first pixel PX1, the second pixel PX2, and the third pixel PX3.

The display panel 100 of the display device 10 may further include a capping layer 207 disposed outside the common electrode 205. The capping layer 207 may serve to improve luminous efficiency by the principle of constructive interference. Accordingly, the light extraction efficiency of a light emitting element (for example, an organic light emitting diode) may be increased, so that the luminous efficiency of the light emitting element (for example, the organic light emitting diode) may be improved.

The pixel array of FIG. 6 and the like described above may also be applied to the display device of FIGS. 41 and 42 to be described later.

Figure 41:
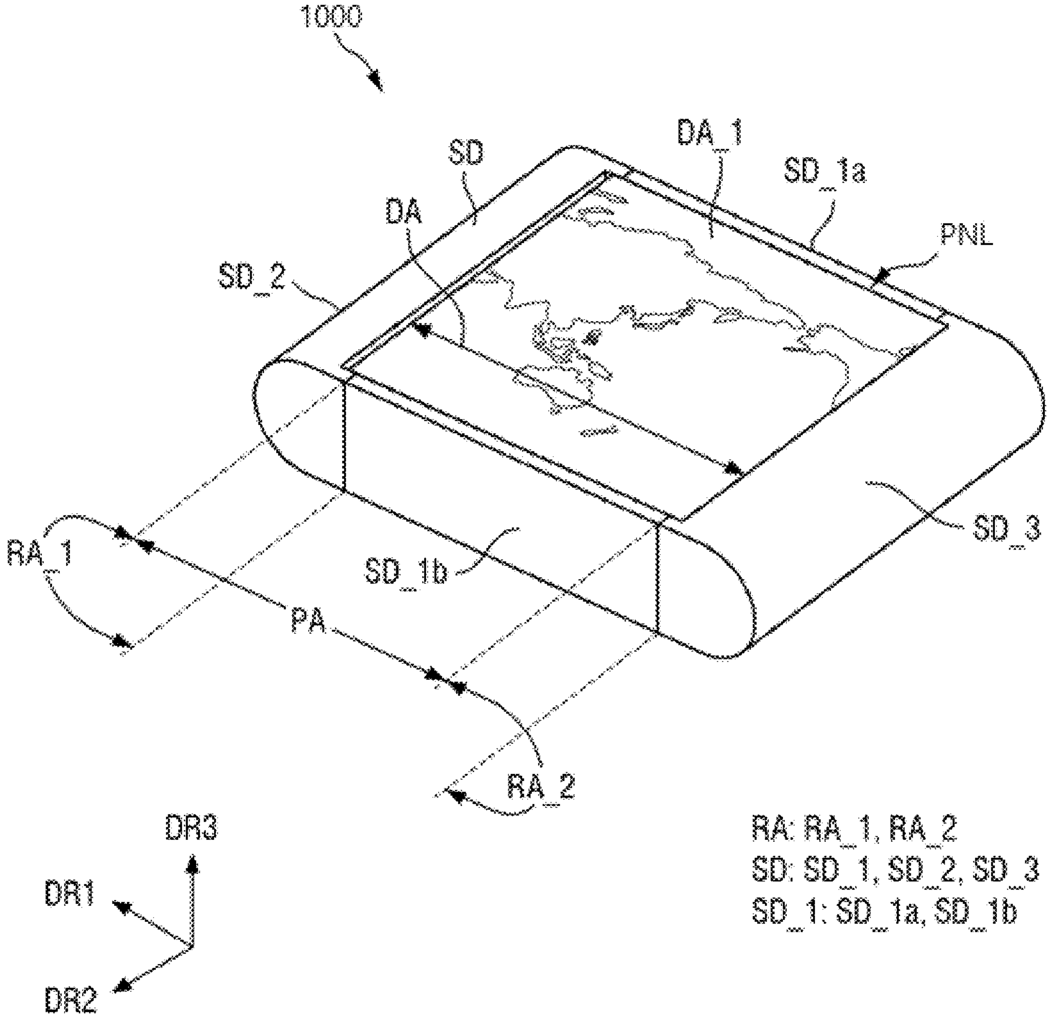
FIG. 41 is a schematic perspective view illustrating a display device according to one embodiment.

FIG. 41 is a schematic perspective view illustrating a display device according to one embodiment. FIG. 42 is a schematic perspective view illustrating an extended state of a display device according to one embodiment.

In FIG. 41, the first direction DR1, the second direction DR2, and the third direction DR3 are defined. The first direction DR1 and the second direction DR2 may be perpendicular to each other, the first direction DR1 and the third direction DR3 may be perpendicular to each other, and the second direction DR2 and the third direction DR3 may be perpendicular to each other. It may be understood that the first direction DR1 refers to a horizontal direction in the drawing, the second direction DR2 refers to a vertical direction in the drawing, and the third direction DR3 refers to an upward and downward direction (for example, a thickness direction) in the drawing. In the following specification, unless otherwise stated, "direction" may refer to both of directions extending along the direction. Further, in case that it is necessary to distinguish both "directions" extending in both sides, one side will be referred to as "one side in the direction" and the other side will be referred to as "the other side in the direction." Referring to FIG. 41, a direction in which an arrow is directed is referred to as one side, and the opposite direction is referred to as the other side.

Hereinafter, for simplicity of description, in case that referring to a display device 1000 or the surfaces of each member constituting the display device 1000, one surface (or a surface) facing to one side in the direction in which the image is displayed, for example, the third direction DR3 is referred to as a top surface, and the opposite surface of the one surface is referred to as a bottom surface. However, the disclosure is not limited thereto, and the one surface and the other surface of the member may be referred to as a front surface and a rear surface, respectively, or may also be referred to as a first surface or a second surface. Further, in describing the relative position of each member of the display device 1000, one side in the third direction DR3 may be referred to as an upper side and the other side in the third direction DR3 may be referred to as a lower side.

Figure 42:
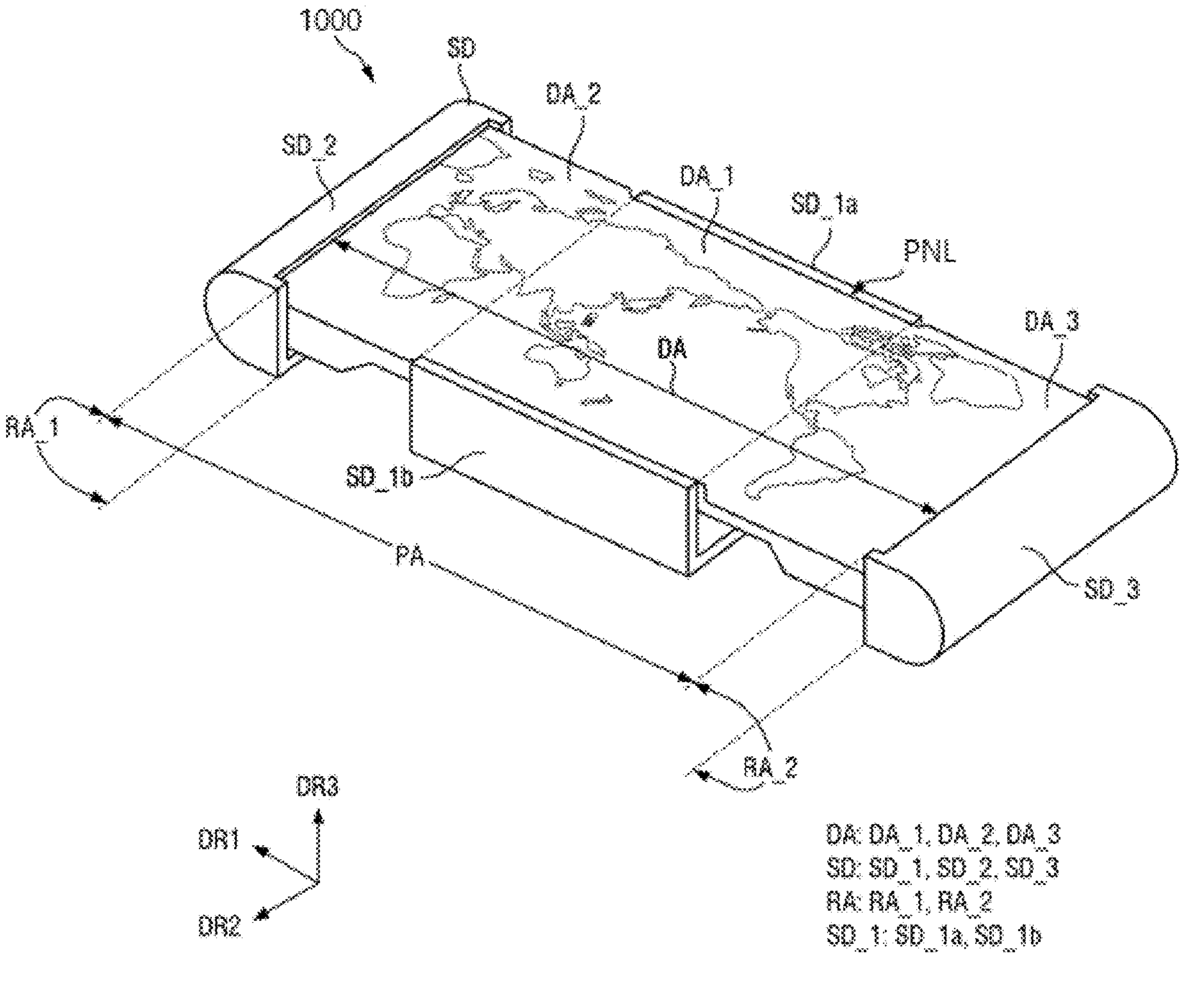
FIG. 42 is a schematic perspective view illustrating an extended state of a display device according to one embodiment.

Referring to FIGS. 41 to 42, the display device 1000 according to one embodiment may be a sliding display device or a slidable display device that is slidable in the first direction DR1. The display device 1000 according to one embodiment may be a multi-slidable display device that slides in both directions, for example, in both sides of the first direction DR1, but is not limited thereto. For example, the display device 1000 may be a single slidable display device that slides in only one direction, for example, in only one side of the first direction DR1 or only the other side of the first direction DR1. Hereinafter, the display device 1000 according to one embodiment will be described as a multi-slidable display device.

The display device 1000 may include a display device flat area PA and a display device bending area RA. The display device flat area PA of the display device 1000 substantially overlaps an area that exposes a display panel PNL of a panel storage container SD, which will be described later. The display device bending area RA of the display device 1000 may be formed in the panel storage container SD. The display device bending area RA may be bent with a selectable radius of curvature, and may be an area in which the display panel PNL is bent according to the radius of curvature. The display device bending areas RA may be disposed on both sides of the display device flat area PA in the first direction DR1. For example, a first display device bending area RA_1 may be disposed on one side of the display device flat area PA in the first direction DR1 and a second display device bending area RA_2 may be disposed on the other side of the display device flat area PA in the first direction DR1. As illustrated in FIG. 42, the size of the display device flat area PA may increase as the display device 1000 expands. Accordingly, the distance between the first display device bending area RA_1 and the second display device bending area RA_2 may increase.

Referring to FIGS. 41 and 42, the display device 1000 according to one embodiment may include the display panel PNL and the panel storage container SD.

The display panel PNL is a panel for displaying a screen, and any type of display panel such as an organic light emitting display panel including an organic light emitting layer, a micro light emitting diode display panel using a micro light emitting diode (LED), a quantum dot light emitting display panel using a quantum dot light emitting diode including a quantum dot light emitting layer, or an inorganic light emitting display panel using an inorganic light emitting element including an inorganic semiconductor may be applied to the display panel PNL according to this embodiment.

The display panel PNL may be a flexible panel. The display panel PNL may have flexibility to be partially rolled, bent, or curved in the panel storage container SD, as will be described later. The display panel PNL may be slid in the first direction DR1.

The display panel PNL may include an active region and a non-active region. The active region of the display panel PNL may be an area where the pixels are disposed. The non-active region of the display panel PNL may be an area in which no pixel is disposed. Metal lines such as data or scan lines, touch lines, or power voltage lines may be disposed in the non-active region. The non-active region may be disposed to surround the active region.

The display area DA of the display panel PNL may be an area in which a screen is displayed. The display area DA may be divided into a first display area DA_1, a second display area DA_2, and a third display area DA_3 according to whether the display panel PNL slides or the sliding degree of the display panel PNL. The presence and size of the second display area DA_2 and the third display area DA_3 may vary according to whether the display panel PNL slides or the sliding degree of the display panel PNL. By way of example, in a non-sliding state, the display panel PNL has the first display area DA_1 having a first size. In a sliding state, the display area DA further may include the second display area DA_2 and the third display area DA_3 expanded in addition to the first display area DA_1.

The sizes of the second display area DA_2 and the third display area DA_3 may vary according to the degree of sliding. For example, in a state in which the display device 1000 is slid to the maximum, the second display area DA_2 may have a second size, the third display area DA_3 may have a third size, and the display area DA may have a fourth size that is the sum of the first area, the second area, and the third area. The fourth area may be a maximum area that the display area DA may have.

As shown in FIGS. 41 and 42, the panel storage container SD may serve to accommodate at least a part of the display panel PNL and assist the sliding operation of the display device 1000. The panel storage container SD may include a first storage container SD_1 located or disposed at the center of the display device 1000, a second storage container SD_2 that is disposed at one side of the first storage container SD_1 in the first direction DR1 and has the first display device bending area RA_1, and a third storage container SD_3 that is disposed at the other side of the first storage container SD_1 in the first direction DR1 and has a second display device bending area RA_2.

The first storage container SD_1 may connect the second storage container SD_2 and the third storage container SD_3 to each other. By way of example, the first storage container SD_1 may include a first_first storage container SD_1*a*, which connects the other side of the second storage container SD_2 in the second direction DR2 and the other side of the third storage container SD_3 in the second direction DR2, and a first_second storage container SD_1*b* which connects one side of the second storage container SD_2 in the second direction DR2 and one side of the third storage container SD_3 in the second direction DR2.

In embodiments, rails may be formed in the second storage container SD_2 and the third storage container SD_3 to guide the sliding operation of the display panel PNL, but the disclosure is not limited thereto.

In concluding the detailed description, those skilled in the art will appreciate that many variations and modifications can be made to the disclosed embodiments without substantially departing from the principles of the disclosure. Therefore, the disclosed embodiments are used in a generic and descriptive sense only and not for purposes of limitation.

What is claimed is:

1. A display device comprising:

a substrate;

a first active layer disposed on the substrate;

a first gate electrode overlapping a part of the first active layer, the first gate electrode having a hole; and a capacitor electrode having a hole overlapping the first gate electrode, wherein the hole of the first gate electrode does not overlap the first active layer.

2. The display device of claim 1, wherein an insulating layer is disposed in the hole of the first gate electrode.

3. The display device of claim 1, further comprising:

a light blocking layer disposed between the substrate and the first active layer.

4. The display device of claim 3, wherein the hole of the first gate electrode overlaps the light blocking layer.

5. The display device of claim 1, wherein the hole of the first gate electrode overlaps the capacitor electrode.

6. The display device of claim 5, wherein the hole of the first gate electrode overlaps the hole of the capacitor electrode.

7. The display device of claim 1, further comprising:

a second active layer adjacent to the first active layer.

8. The display device of claim 7, further comprising:

a gate connection electrode electrically connecting the first gate electrode to the second active layer through contact holes of an insulating layer.

9. The display device of claim 8, wherein the hole of the first gate electrode overlaps the gate connection electrode.

10. The display device of claim 7, further comprising:

a second gate electrode overlapping the second active layer.

11. The display device of claim 10, wherein the second gate electrode includes a hole.

12. The display device of claim 11, wherein the hole of the second gate electrode overlaps the second active layer.

13. The display device of claim 11, wherein an insulating layer is disposed in the hole of the second gate electrode.

14. The display device of claim 10, further comprising:

a gate line electrically connected to the second gate electrode.

15. The display device of claim 14, further comprising:

an insulating layer having a hole overlapping the gate line.

16. The display device of claim 15, wherein a part of the gate line is disposed in the hole of the insulating layer.

17. The display device of claim 15, wherein the hole of the insulating layer is adjacent to the second active layer.

18. The display device of claim 1, wherein the first gate electrode contains titanium and aluminum.

19. A display device comprising:

a substrate;

a first active layer disposed on the substrate; and a first gate electrode overlapping a part of the first active layer, the first gate electrode having a hole, wherein an entirety of the hole of the first gate electrode does not overlap the first active layer.

20. A display device comprising:

a substrate;

a first active layer disposed on the substrate;

a first gate electrode overlapping a part of the first active layer, the first gate electrode having a hole; and a second active layer adjacent to the first active layer, wherein the hole of the first gate electrode does not overlap the first active layer, wherein the first active layer contains polycrystalline silicon, and wherein the second active layer contains an oxide.

21. The display device of claim 20, wherein the second active layer contains indium-gallium-zinc oxide (IGZO) or indium-gallium-zinc-tin oxide (IGZTO).

* * * * *